(12) United States Patent
Liaw

(10) Patent No.: US 12,283,311 B2
(45) Date of Patent: Apr. 22, 2025

(54) MEMORY DEVICE AND METHOD FOR FORMING THE SAME

(71) Applicant: TAIWAN SEMICONDUCTOR MANUFACTURING COMPANY, LTD., Hsinchu (TW)

(72) Inventor: Jhon Jhy Liaw, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 252 days.

(21) Appl. No.: 18/167,617

(22) Filed: Feb. 10, 2023

(65) Prior Publication Data

US 2024/0105258 A1 Mar. 28, 2024

Related U.S. Application Data

(60) Provisional application No. 63/377,348, filed on Sep. 28, 2022.

(51) Int. Cl.
G11C 11/00 (2006.01)
G11C 7/00 (2006.01)
G11C 11/412 (2006.01)
H01L 23/48 (2006.01)
H10B 10/00 (2023.01)

(52) U.S. Cl.
CPC .............. G11C 11/412 (2013.01); G11C 7/00 (2013.01); H01L 23/481 (2013.01); H10B 10/125 (2023.02)

(58) Field of Classification Search
CPC ....... G11C 11/412; G11C 7/00; H01L 23/481; H01L 21/743; H01L 23/5286; H01L 21/76897; H10B 10/125; H10B 10/12
USPC ......................................................... 365/154
See application file for complete search history.

(56) References Cited

U.S. PATENT DOCUMENTS

| 6,781,869 | B2* | 8/2004 | Ohbayashi | ............ | G11C 11/412 |
| | | | | | 257/E27.099 |
| 7,269,056 | B1 | 9/2007 | Liaw | | |
| 7,365,432 | B2 | 4/2008 | Liaw | | |
| 7,738,282 | B2* | 6/2010 | Liaw | ..................... | H10B 10/00 |
| | | | | | 257/E27.098 |

(Continued)

Primary Examiner — Tha-O H Bui
(74) Attorney, Agent, or Firm — Birch, Stewart, Kolasch & Birch, LLP

(57) ABSTRACT

A method for forming a memory device includes forming a first pull-up transistor, a first pull-down transistor, a first pass-gate transistor, a second pull-up transistor, a second pull-down transistor, a second pass-gate transistor over a substrate; forming a first bit line and a second bit line electrically connected to a source/drain epitaxy structure of the first pass-gate transistor and a source/drain epitaxy structure of the second pass-gate transistor; forming a word line electrically connected to gate structures of the first and second pass-gate transistors; removing the substrate to expose a source/drain epitaxy structure of the first pull-down transistor and a source/drain epitaxy structure of the second pull-down transistor; and forming a first power line electrically connected to the bottom surface of the source/drain epitaxy structure of the first pull-down transistor and electrically connected to the bottom surface of the source/drain epitaxy structure of the second pull-down transistor.

20 Claims, 65 Drawing Sheets

(56) References Cited

U.S. PATENT DOCUMENTS

| | | | |
|---|---|---|---|
| 8,009,463 B2 * | 8/2011 | Liaw | H10B 10/12 |
| | | | 365/63 |
| 8,737,107 B2 | 5/2014 | Liaw | |
| 8,947,902 B2 | 2/2015 | Liaw | |
| 9,036,404 B2 * | 5/2015 | Liaw | H01L 27/0924 |
| | | | 365/156 |
| 9,209,247 B2 | 12/2015 | Colinge et al. | |
| 9,236,267 B2 | 1/2016 | De et al. | |
| 9,349,436 B2 | 5/2016 | Liaw | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 10,170,408 B2 | 1/2019 | Liaw | |

* cited by examiner

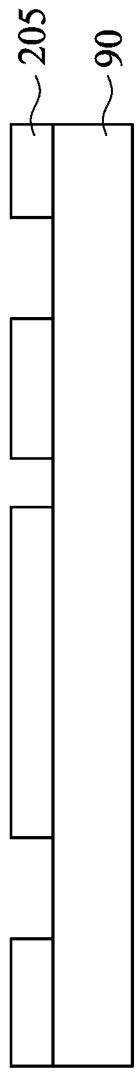
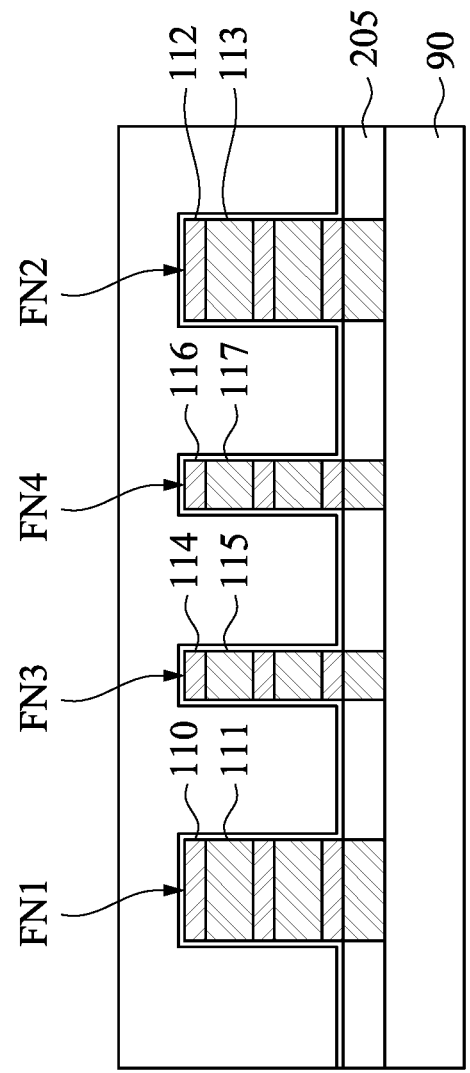
Fig. 4A
Fig. 4B

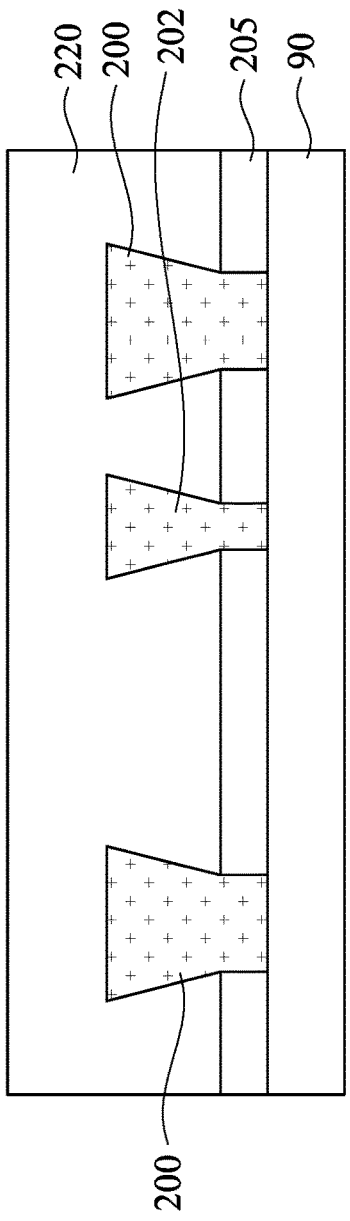
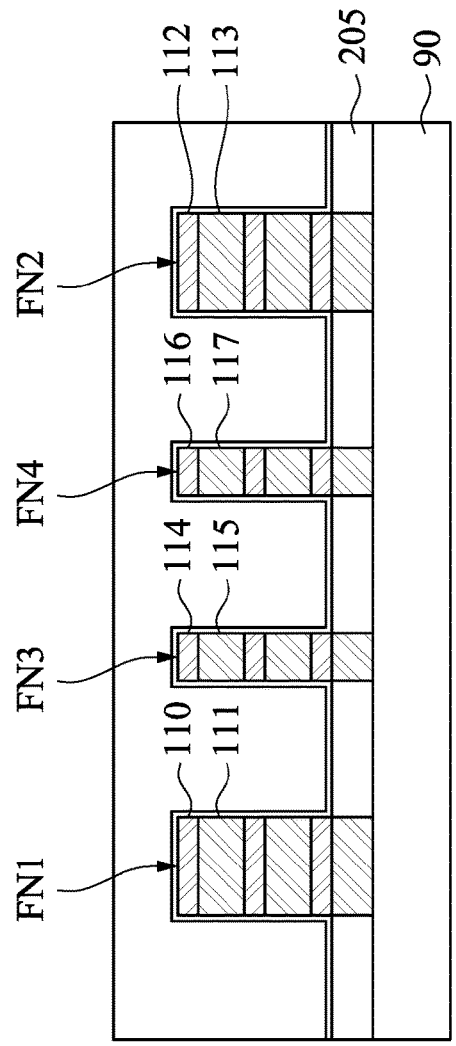
Fig. 5A
Fig. 5B

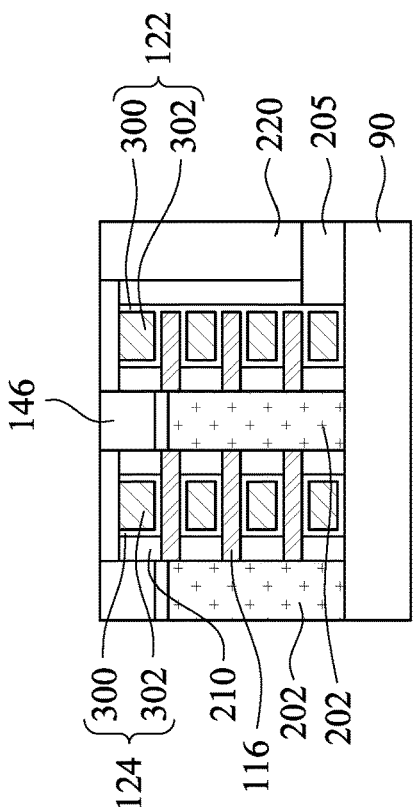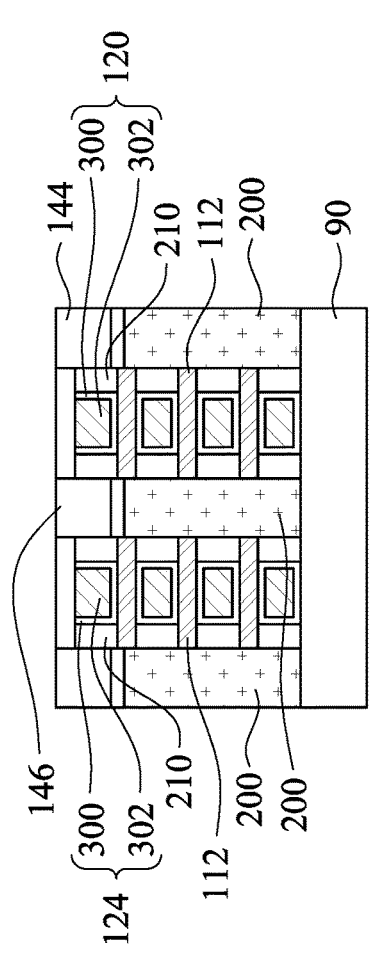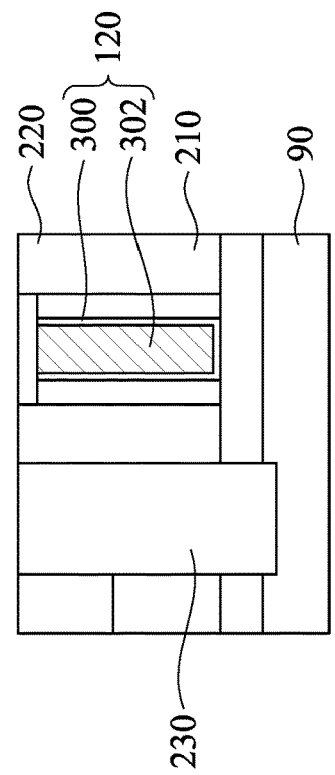

MEMORY DEVICE AND METHOD FOR FORMING THE SAME

PRIORITY CLAIM AND CROSS-REFERENCE

The present application claims priority to U.S. Provisional Application Ser. No. 63/377,348, filed Sep. 28, 2022, which is herein incorporated by reference.

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
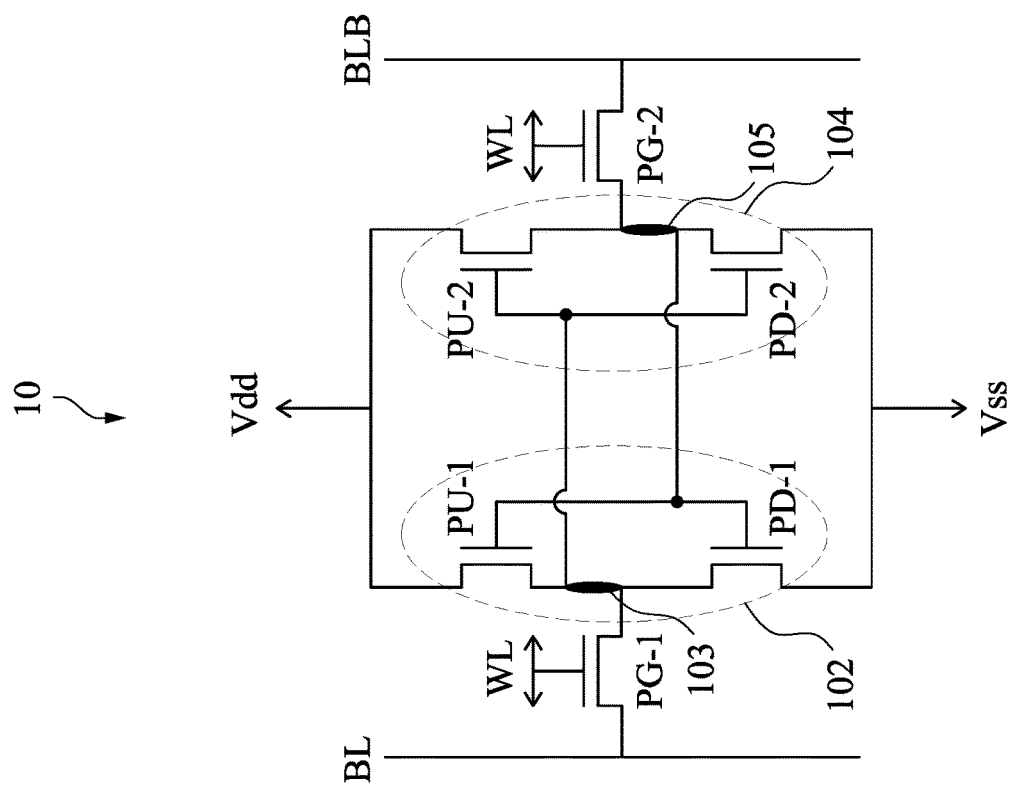
FIG. 1 is a circuit diagram of a six transistor (6T) SRAM cell.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is related to integrated circuit (IC) structures and methods of forming the same. More particularly, some embodiments of the present disclosure are related to gate-all-around (GAA) devices. A GAA device includes a device that has its gate structure, or portions thereof, formed on four-sides of a channel region (e.g., surrounding a portion of a channel region). The channel region of a GAA device may include nanosheet channels, bar-shaped channels, and/or other suitable channel configurations. In some embodiments, the channel region of a GAA device may have multiple horizontal nanosheets or horizontal bars vertically spaced, making the GAA device a stacked horizontal GAA (S-HGAA) device. The GAA devices presented herein include a p-type metal-oxide-semiconductor GAA device and an n-type metal-oxide-semiconductor GAA device stack together. Further, the GAA devices may have one or more channel regions (e.g., nanosheets) associated with a single, contiguous gate structure, or multiple gate structures. One of ordinary skill may recognize other examples of semiconductor devices that may benefit from aspects of the present disclosure. In some embodiments, the nanosheets can be interchangeably referred to as nanowires, nanoslabs, nanorings, or nanostructures having nano-scale size (e.g., a few nanometers), depending on their geometry. In addition, the embodiments of the disclosure may also be applied, however, to a variety of metal oxide semiconductor transistors (e.g., complementary-field effect transistor (CFET) and fin field effect transistor (FinFET)).

Some embodiments discussed herein are discussed in the context of nano-FETs formed using a gate-last process. In other embodiments, a gate-first process may be used. Also, some embodiments contemplate aspects used in planar devices, such as planar FETs, or in fin field-effect transistors (FinFETs). For example, FinFETs may include fins on a substrate, with the fins acting as channel regions for the FinFETs. Similarly, planar FETs may include a substrate, with portions of the substrate acting as channel regions for the planar FETs.

In the course of IC evolution, functional density (i.e., the number of interconnected devices per chip area) has generally increased while geometry size (i.e., the smallest component (or line) that can be created using a fabrication process) has decreased. However, the smaller and more dense the metal lines in the IC structure will result in worse resistant thereof, thereby wasting processing power and processing speed during the operation of the IC structure. For example, in a cell routing of the IC structure, Vdd and Vss power routing may occupy too many routing resources and therefore impact the cell scaling as well as the performance of the IC structure (e.g., RC delay or IR drop).

Therefore, the present disclosure in various embodiments provides a metal line routing method to improve the functional density and operation performance on the IC structure. That is, a part of metal layers is transferred to the wafer back-side, so as to reduce the routing loading and improve the circuit density in a same chip area. In addition, the less metal tracks in the same chip area benefits the metal conductor RC performance.

The present disclosure will be described with respect to embodiments in a specific context, a static random-access memory (SRAM) formed with a gate-all-around (GAA) configuration. The embodiments of the disclosure may also be applied, however, to a variety of semiconductor devices. Various embodiments will be explained in detail with reference to the accompanying drawings.

Static random-access memory (SRAM) is a type of volatile semiconductor memory that uses bistable latching circuitry to store bits. Bit in an SRAM is stored on four transistors (PU-1, PU-2, PD-1, and PD-2) that form two cross-coupled inverters. This memory cell has two stable states which are used to denote 0 and 1. Two additional access transistors (PG-1 and PG-2) are electrically connected to the two cross-coupled inventers and serve to control the access to a storage cell during read and write operations.

FIG. 1 is a circuit diagram of a six transistor (6T) SRAM cell. The SRAM cell 10 includes a first inverter 102 formed by a pull-up transistor PU-1 and a pull-down transistor PD-1. The SRAM cell 10 further includes a second inverter 104 formed by a pull-up transistor PU-2 and a pull-down transistor PD-2. Furthermore, both the first inverter 102 and second inverter 104 are coupled between a power routing Vdd and a power routing Vss. In some embodiments, the power routing Vss may be ground potential. In some embodiment, the pull-up transistor PU-1 and PU-2 can be p-type transistors while the pull-down transistors PD-1 and PD-2 can be n-type transistors, and the claimed scope of the present disclosure is not limited in this respect.

In FIG. 1, the first inverter 102 and the second inverter 104 are cross-coupled. That is, the first inverter 102 has an input connected to the output of the second inverter 104. Likewise, the second inverter 104 has an input connected to the output of the first inverter 102. The output of the first inverter 102 is referred to as a storage node 103. Likewise, the output of the second inverter 104 is referred to as a storage node 105. In a normal operating mode, the storage node 103 is in the opposite logic state as the storage node 105. By employing the two cross-coupled inverters, the SRAM cell 10 can hold the data using a latched structure so that the stored data will not be lost without applying a refresh cycle as long as power is supplied through Vdd.

In an SRAM device using the 6T SRAM cells, the cells are arranged in rows and columns. The columns of the SRAM array are formed by a bit line pairs, namely a first bit line BL and a second bit line BLB. The cells of the SRAM device are disposed between the respective bit line pairs. As shown in FIG. 1, the SRAM cell 10 is placed between the bit line BL and the bit line BLB.

In FIG. 1, the SRAM cell 10 further includes a first pass-gate transistor PG-1 connected between the bit line BL and the output 103 of the first inverter 102. The SRAM cell 10 further includes a second pass-gate transistor PG-2 connected between the bit line BLB and the output 105 of the second inverter 104. The gates of the first pass-gate transistor PG-1 and the second pass-gate transistor PG-2 are connected to a word line WL, which connects SRAM cells in a row of the SRAM array.

In operation, if the pass-gate transistors PG-1 and PG-2 are inactive, the SRAM cell 10 will maintain the complementary values at storage nodes 103 and 105 indefinitely as long as power is provided through Vdd. This is so because each inverter of the pair of cross coupled inverters drives the input of the other, thereby maintaining the voltages at the storage nodes. This situation will remain stable until the power is removed from the SRAM, or, a write cycle is performed changing the stored data at the storage nodes.

In the circuit diagram of FIG. 1, the pull-up transistors PU-1, PU-2 are p-type transistors. The pull-down transistors PD-1, PD-2, and the pass-gate transistors PG-1, PG-2 are n-type transistors. In some other embodiments, however, the pull-up transistors PU-1, PU-2 are n-type transistors, and the pull-down transistors PD-1, PD-2, and the pass-gate transistors PG-1, PG-2 are p-type transistors.

The structure of the SRAM cell 10 in FIG. 1 is described in the context of the 6T-SRAM. One of ordinary skill in the art, however, should understand that features of the various embodiments described herein may be used for forming other types of devices, such as an 8T-SRAM memory device, or memory devices other than SRAMs, such as standard cell, gated diode or ESD (Electrostatic Discharge) devices. Furthermore, embodiments of the present disclosure may be used as stand-alone memory devices, memory devices integrated with other integrated circuitry, or the like.

Figure 2A:
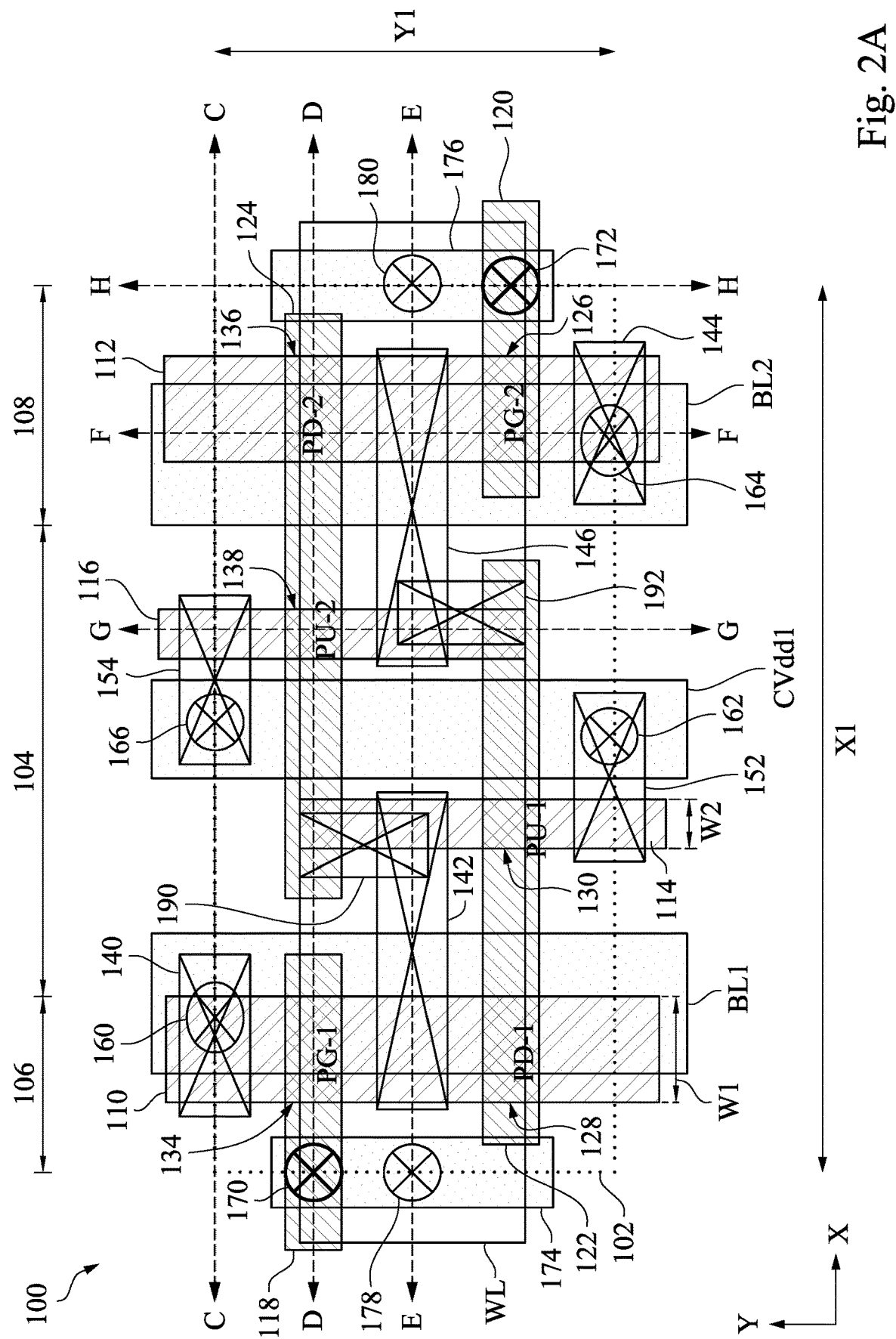
FIGS. 2A and 2B illustrate a cell array layout diagram of an SRAM device on a front side and a backside of a semiconductor structure, respectively, according to some embodiments of the present disclosure.
Figure 2B:
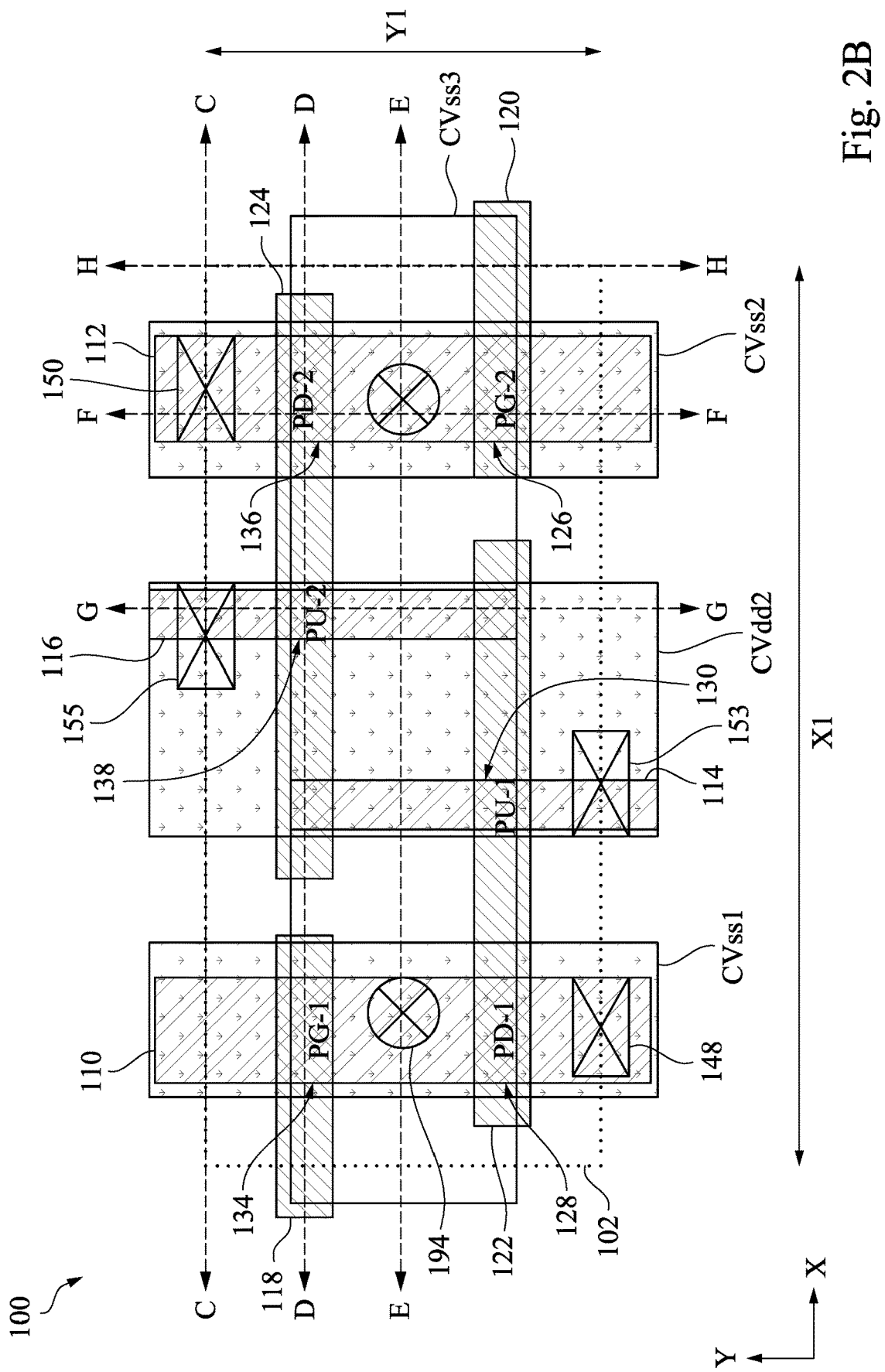

Reference is made to FIGS. 2A to 2H. FIGS. 2A and 2B illustrate a layout diagram of an SRAM device on a front side and a backside of a semiconductor structure, respectively, according to some embodiments of the present disclosure. In some embodiments, FIGS. 2A and 2B are top view (plane view) of an SRAM device on a front side and a backside of a semiconductor structure, respectively. FIGS. 2C to 2H are cross-sectional views along lines C-C, D-D, E-E, F-F G-G, H-H of FIGS. 2A and 2B, respectively.

In the top views of FIGS. 2A and 2B, shown there is an SRAM device 100. The SRAM device 100 has an SRAM unit cell 101 having an X-pitch 'X2' parallel to a gate routing direction (e.g., parallel to gate structures 118, 120, 122, 124), and a Y-pitch 'Y2' parallel to an active region routing direction (e.g., parallel to the semiconductor layers 110, 112, 114, 116). In some examples, the X-pitch 'X2' is greater than the Y-pitch 'Y2'. For instance, in some cases, the X-pitch 'X2' is about 2 to 3 times greater than the Y-pitch 'Y2'. In some embodiments, the SRAM device 100 may include a plurality of SRAM unit cells 102 arranged, for example, in a plurality of columns and rows (e.g., to provide a memory array). In some cases, the SRAM unit cell 101 may include an N-well region 104 disposed between two P-well regions 106, 108. In some embodiments, the X-pitch 'X2' is defined from a left edge of the P-well region 106 to a right edge of the P-well region 108. In some embodiments, the P-well region 106 includes an N-type pass gate (PG-1) transistor and an N-type pull-down (PD-1) transistor, and the P-well region 108 includes an N-type pass gate (PG-2) transistor and an N-type pull-down (PD-2) transistor. In some examples, the N-well region 104 may include a P-type pull-up (PU-1) transistor and a P-type pull-up (PU-2) transistor. In some embodiments, the SRAM unit cell 101 may include the circuit of the SRAM cell 10 as described in FIG. 1.

In various embodiments, the PG-1, PG-2, PD-1, PD-2, PU-1, and PU-2 transistors are formed with a gate-all-around (GAA) configuration. That is, the channel regions of each of the PG-1, PG-2, PD-1, PD-2, PU-1, and PU-2 transistors may include a plurality of semiconductor channel layers stacked along a vertical direction, and each of the semiconductor channel layers is wrapped around by a respective gate structure. For example, the PG-1 and PD-1 transistors include semiconductor layers 110, the PG-2 and PD-2 transistors include semiconductor layers 112, the PU-1 transistor includes semiconductor layers 114, and the PU-2 transistor includes semiconductor layers 116. In some embodiments, each of the semiconductor layers 110, 112, 114, and 116 has a lengthwise direction extending along the Y-direction. In the top view of FIGS. 2A and 2B, each of the semiconductor layers 110 and 112 have a lateral width W1 along the X-direction, and each of the semiconductor layers 114 and 116 have a lateral width W2 along the X-direction. In some embodiments, the width W1 is greater than the width W2. In some embodiments, the semiconductor layers 110, 112, 114, and 116 can also be referred to as semiconductor channel layers.

Figure 2C:
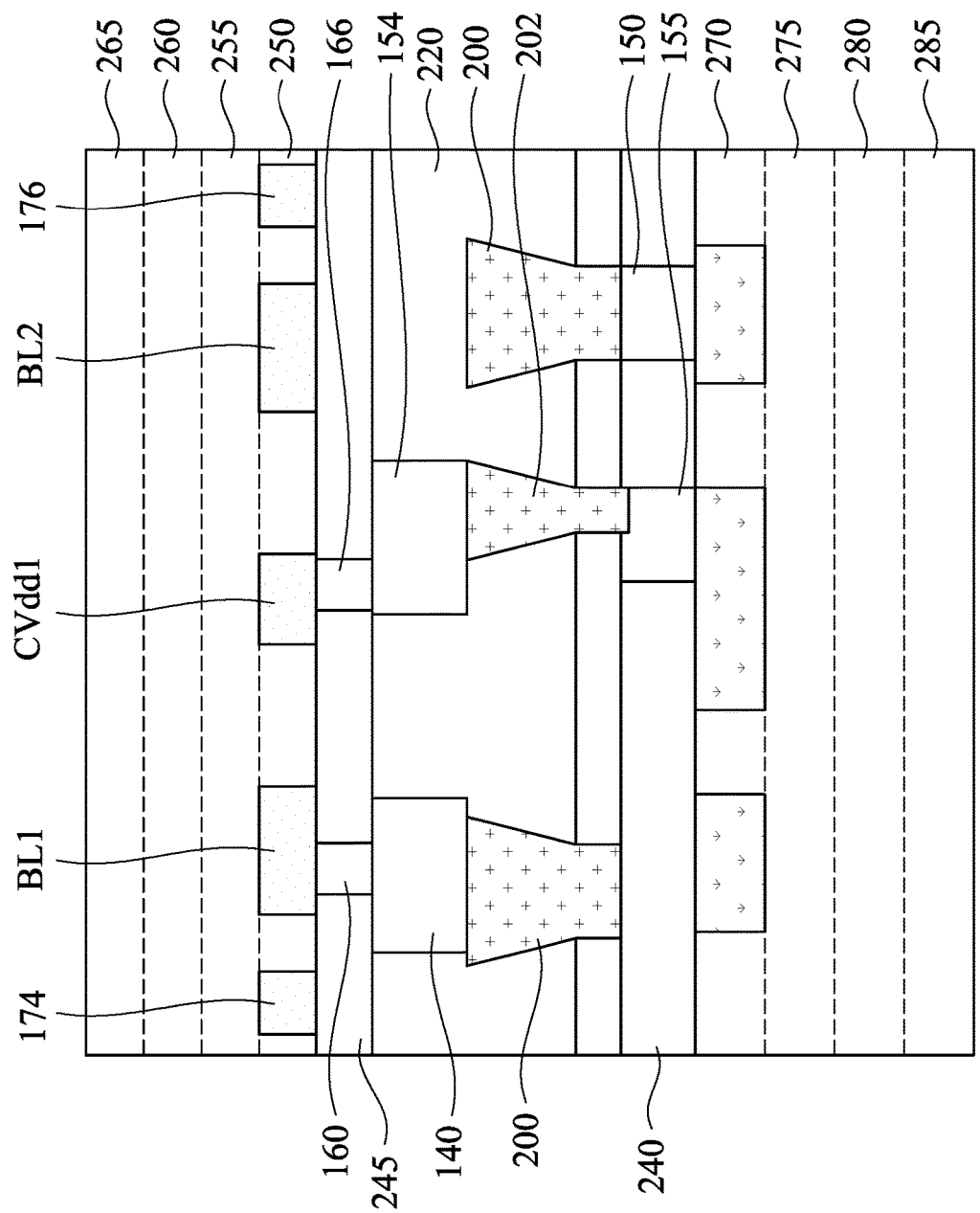
FIGS. 2C to 2H are cross-sectional views of an SRAM device according to some embodiments of the present disclosure.
Figure 2D:
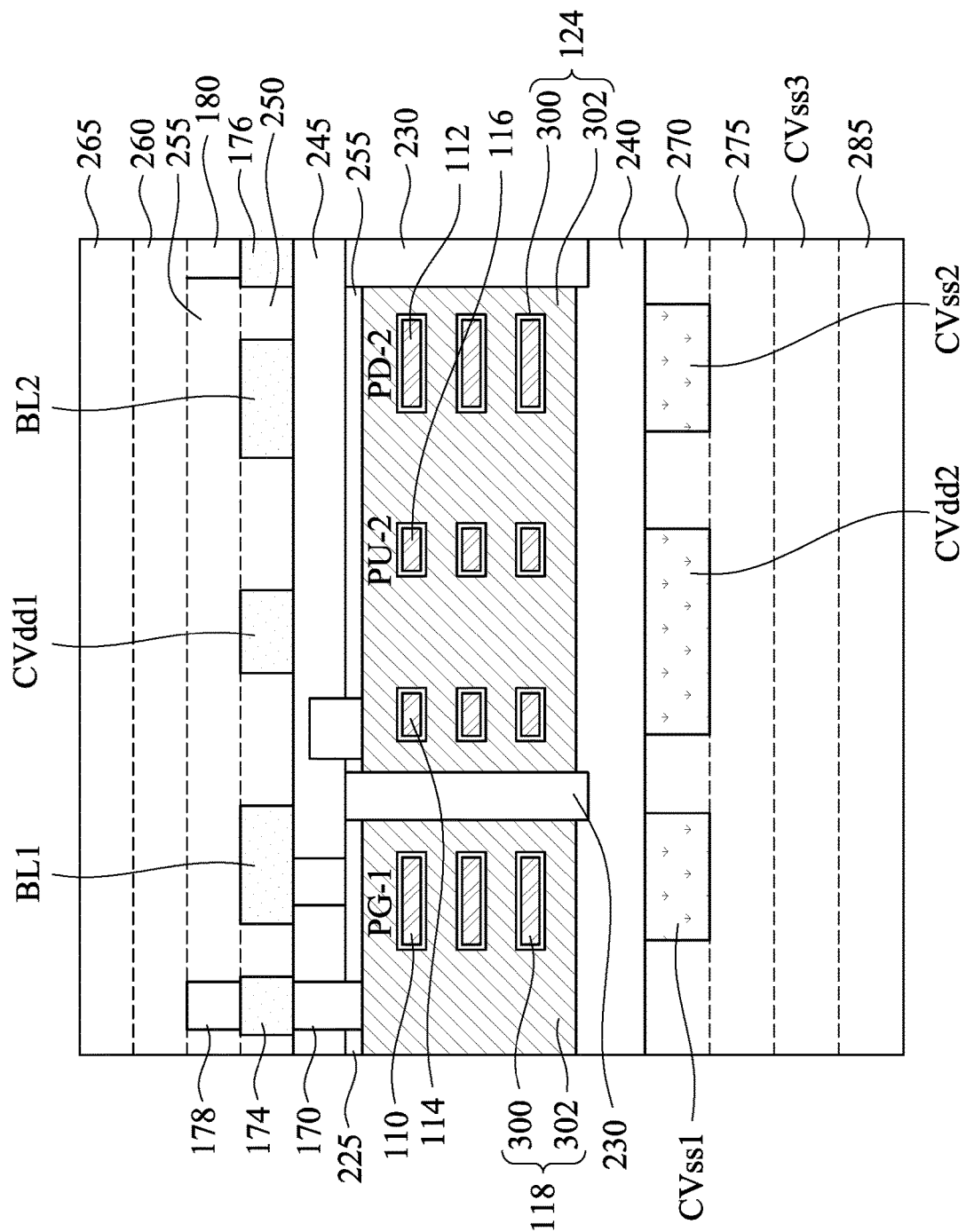
Figure 2E:
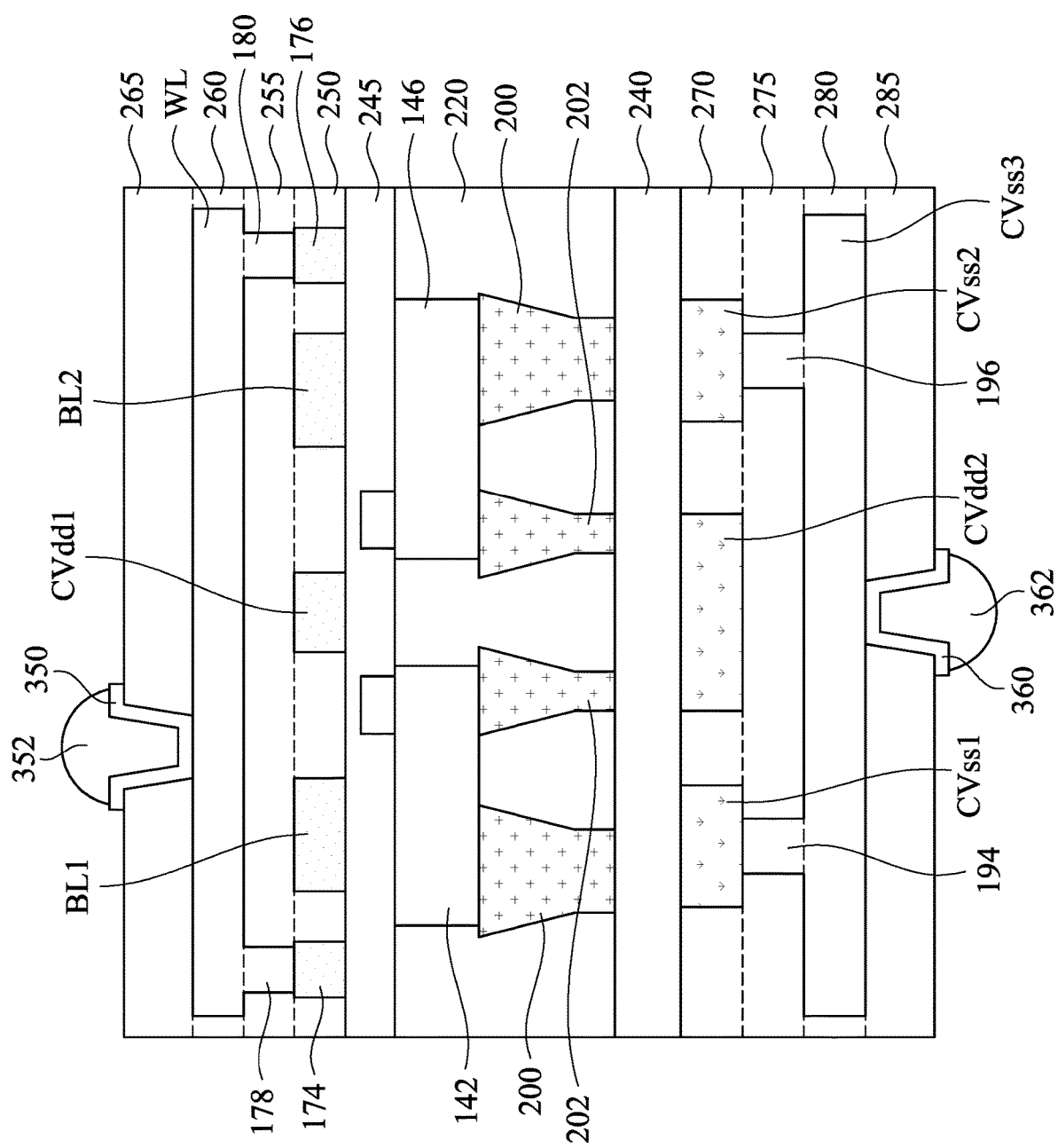
Figure 2F:
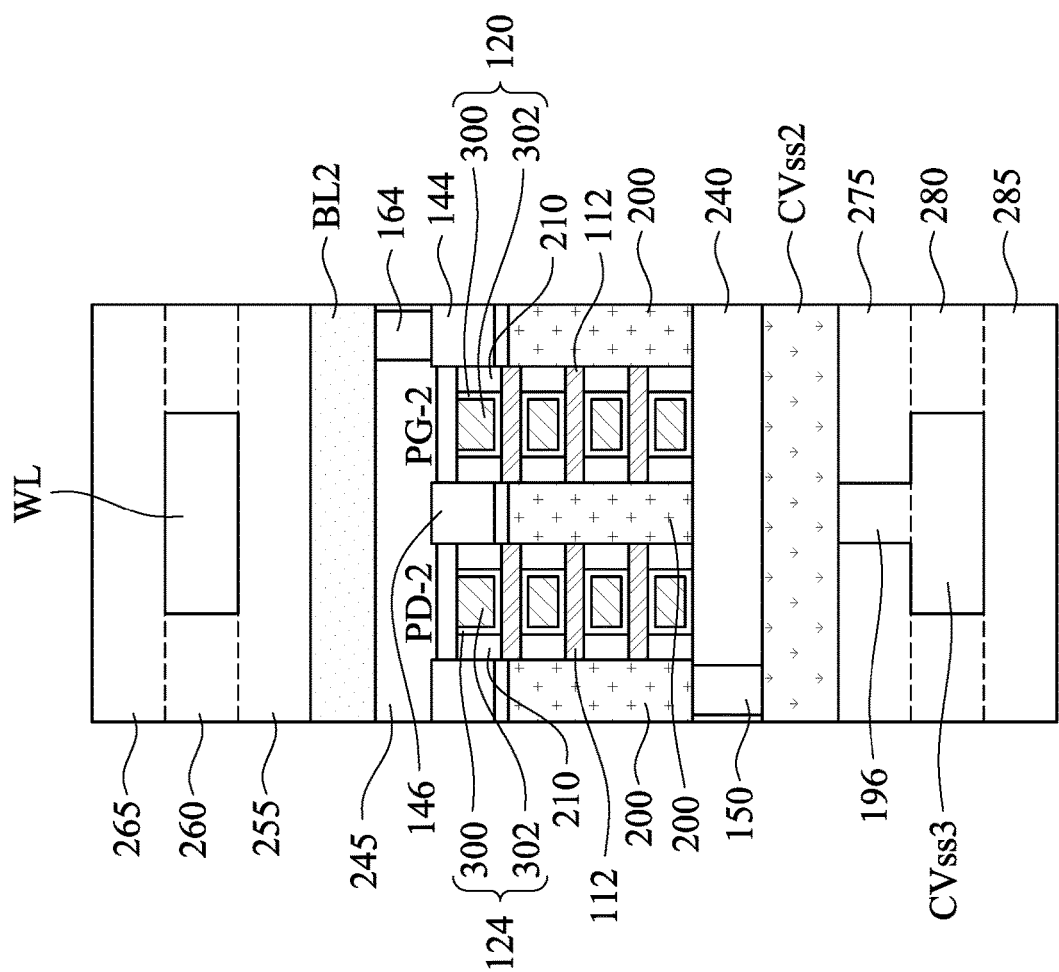
Figure 2G:
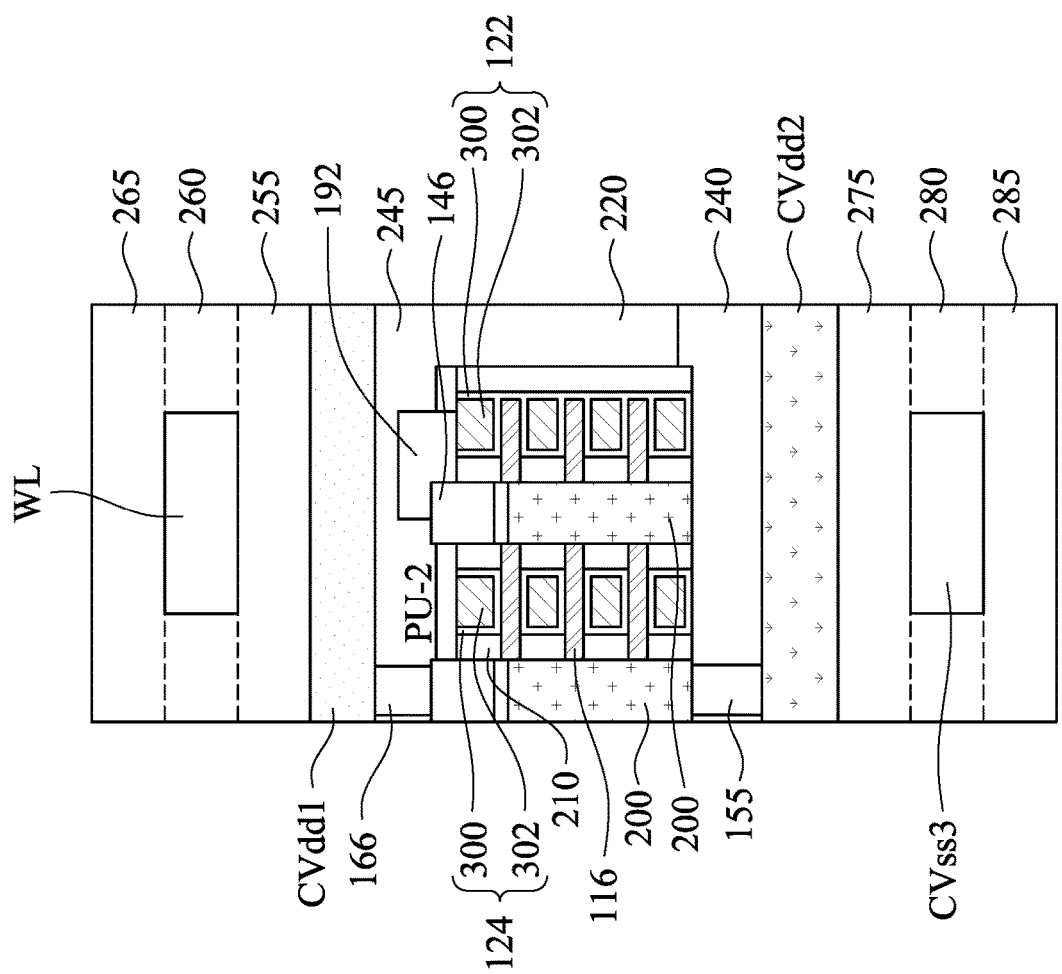
Figure 2H:
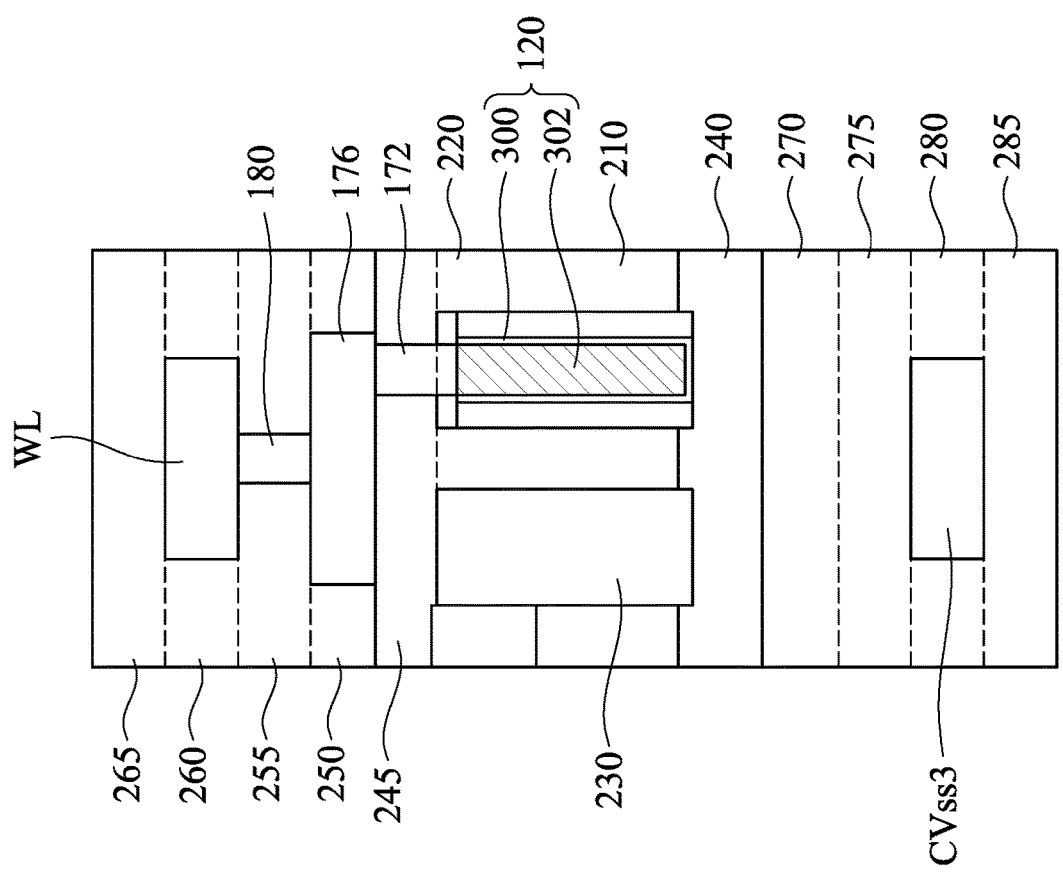

As shown in the cross-sectional views of FIGS. 2D, 2F, and 2G, the semiconductor layers 110 are stacked along a vertical direction, the semiconductor layers 112 are stacked along a vertical direction, the semiconductor layers 114 are stacked along a vertical direction, and the semiconductor layers 116 are stacked along a vertical direction. In some embodiments, the semiconductor layers 110, 112, 114, and 116 may be made of suitable semiconductor materials, such as silicon, or the like.

Each of the PG-1, PG-2, PD-1, PD-2, PU-1, and PU-2 transistors of the SRAM device 100 also include a gate structure. For instance, the PG-1 transistor includes a gate structure 118 that spans perpendicularly across a channel region 134 of the semiconductor layers 110, the PG-2 transistor includes a gate structure 120 that spans perpendicularly across a channel region 126 of the semiconductor layers 112, the PD-1 and PU-1 transistors include a gate structure 122 that spans perpendicularly across a channel region 128 of the semiconductor layers 110 and across a channel region 130 of the semiconductor layers 114, and PD-2 and PU-2 transistors include a gate structure 124 that spans perpendicularly across a channel region 136 of the semiconductor layers 112 and across a channel region 138 of the semiconductor layers 116. In some embodiments, each of the gate structures 118, 120, 122, and 124 has a lengthwise direction extending along the X-direction.

As shown in the cross-sectional view of FIGS. 2D, 2F, 2G, and 2H, each of the gate structures 120, 122, 124, and 126 include a gate dielectric 300 and a gate electrode 302 over the gate dielectric 300. In some embodiments, the gate dielectric 300 includes one layer of high-k dielectric. In some other embodiments, the gate dielectric 300 includes multi-layer structure, such as an interfacial layer and a high-k dielectric material. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. Examples of interfacial layer include silicon oxide ($SiO_2$), silicon nitride (SiN), silicon oxynitride (SiON), hBN, aluminum oxide ($Al_2O_3$), other suitable dielectric material, and/or combinations thereof.

In some embodiments, the gate electrode 302 includes a conductive material and may be selected from a group comprising of polycrystalline-silicon (poly-Si), polycrystalline silicon-germanium (poly-SiGe), metallic nitrides, metallic silicides, metallic oxides, and metals. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of metals include tantalum, tungsten, titanium, aluminum, copper, molybdenum, nickel, platinum, etc.

In various embodiments, each of the PG-1, PG-2, PD-1, PD-2, PU-1, and PU-2 transistors of the SRAM device 100 includes source/drain regions on portions of their respective semiconductor layers adjacent to and on either side of their respective gate structures, and thus adjacent to and on either side of their respective channel regions (e.g., such as the channel regions 126, 128, 130, 134, 136, and 138).

As shown in the cross-sectional view of FIGS. 2C, 2E, 2F, and 2G, the SRAM device 100 includes a plurality of source/drain epitaxy structures 200 and 202. The source/drain epitaxy structures 200 may be formed on opposites sides of the semiconductor layers 110 and on opposite sides of the gate structure 118. As a result, the semiconductor layers 110, the gate structure 118, and the source/drain epitaxy structures 200 may collectively serve as the PG-1 transistor. The source/drain epitaxy structures 200 may be formed on opposites sides of the semiconductor layers 110 and on opposite sides of the gate structure 122. As a result, the semiconductor layers 110, the gate structure 122, and the source/drain epitaxy structures 200 may collectively serve as the PD-1 transistor. The source/drain epitaxy structures 202 may be formed on opposites sides of the semiconductor layers 114 and on opposite sides of the gate structure 122. As a result, the semiconductor layers 114, the gate structure 122 and the source/drain epitaxy structures 202 may collectively serve as the PU-1 transistor. The source/drain epitaxy structures 202 may be formed on opposites sides of the semiconductor layers 116 and on opposite sides of the gate structure 124. As a result, the semiconductor layers 116, the gate structure 124, and the source/drain epitaxy structures 202 may collectively serve as the PU-2 transistor. The source/drain epitaxy structures 200 may be formed on opposites sides of the semiconductor layers 112 and on opposite sides of the gate structure 124. As a result, the semiconductor layers 112, the gate structure 124, and the source/drain epitaxy structures 200 may collectively serve as the PD-2 transistor. The source/drain epitaxy structures 200 may be formed on opposites sides of the semiconductor layers 112 and on opposite sides of the gate structure 120. As a result, the semiconductor layers 112, the gate structure 120, and the source/drain epitaxy structures 200 may collectively serve as the PG-2 transistor.

In some embodiments, the source/drain epitaxy structures 200 and 202 may include different conductivity types. In some embodiments where the PD-1, PD-2, PG-1, and PG-2 transistors are n-type transistors and the PU-1 and PU-2 transistors are p-type transistors, the source/drain epitaxy structures 200 are n-type epitaxy structures, and the source/drain epitaxy structures 202 are p-type epitaxy structures. On the other hand, in some embodiments where the PD-1, PD-2, PG-1, and PG-2 transistors are p-type transistors and the PU-1 and PU-2 transistors are n-type transistors, the source/drain epitaxy structures 200 are p-type epitaxy structures, and the source/drain epitaxy structures 202 are n-type epitaxy structures. Examples of n-type dopants can be phosphorus (P), arsenic (As), or antimony (Sb) or the like. Examples of p-type dopants can be boron (B), gallium (Ga), indium (In), aluminium (Al), or the like. In some embodiments, the source/drain epitaxy structures 200 and 202 may include Si, SiGe, Ge, III-V materials, or the like. In some embodiments, the source/drain epitaxy structures 200 and 202 may include epitaxial material for N-type device (e.g., NFET), such as SiP, SiAs, SiC, or the like. On the other hand, the source/drain epitaxy structures 200 and 202 may include epitaxial material for P-type device (e.g., PFET), such as SiGeB, SiCB, or the like.

As shown in the cross-sectional view of FIGS. 2C to 2H. The SRAM device 100 may include isolation structures 205 laterally surrounding bottom portions of the source/drain epitaxy structures 200 and 202. The isolation structures 205 may be shallow trench isolation (STI) structures, suitable isolation structures, combinations of the foregoing, or the like. In some embodiments, the isolation structures 205 may be made of oxide (e.g., silicon oxide) or nitride (e.g., silicon nitride). In some other embodiments, each of the isolation structures 205 may include a dielectric layer and a dielectric liner lining the dielectric layer, in which the dielectric liner and the dielectric layer are made of different materials, for example, the dielectric liner may be silicon nitride, and the dielectric layer may be silicon oxide.

The SRAM device 100 further includes gate spacers 210 disposed on opposite sidewalls of each of the gate structures 118, 120, 122, and 124. In some embodiments, the gate spacers 210 may be formed by insulating dielectric material, such as a silicon nitride-based material. Examples of the silicon nitride-based material can be SiN, SiON, SiOCN or SiCN and combinations thereof.

The SRAM device 100 further includes inner spacers 215 vertically between two adjacent semiconductor layers 110, 112, 114, and 116. The inner spacers 215 are also disposed on opposite sidewalls of each of the gate structures 118, 120, 122, and 124, and may also be in contact with the source/drain epitaxy structures 200 and 202. In some embodiments, the inner spacers 215 may be formed by insulating dielectric material, such as a silicon nitride-based material. Examples of the silicon nitride-based material can be SiN, SiON, SiOCN or SiCN and combinations thereof.

The SRAM device 100 further includes an interlayer dielectric (ILD) layer 220 covering the source/drain epitaxy structures 200 and 202, and laterally surrounding the gate structures 118, 120, 122, and 124. In some embodiments, the ILD layer 220 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bisbenzocyclobutenes (BCB), or polyimide.

The SRAM device 100 further includes gate-top dielectric layers 225 over the top surface of each of the gate structures 118, 120, 122, and 124, and may over top surfaces of the gate spacers 210. In some other embodiments, the gate-top dielectric layers 225 can be omitted. In some embodiments, the gate-top dielectric layers 225 may include $SiO_2$, SiN, SiON, SiOCN or SiCN and combinations thereof.

The SRAM device 100 further includes gate-end dielectric layers 230 disposed on lateral ends of each of the gate structures 118, 120, 122, and 124. For example, in FIG. 2D, the gate-end dielectric layers 230 may be disposed on opposite ends of the gate structure 124. Moreover, the gate-end dielectric layers 230 may be laterally between the gate structure 118 and 124, so as to electrically isolate the gate structure 118 from the gate structure 124. In some embodiments, the gate-end dielectric layers 230 may include $SiO_2$, SiN, SiON, SiOCN or SiCN and combinations thereof.

Referring back to the top view of FIGS. 2A and 2B, a plurality of contacts may be directly (physically) connected to the source/drain regions of the SRAM device 100. For example, the PG-1 transistor may include a source/drain contact 140 (first bit line node 'BL1') and a source/drain contact 142 (first common drain) connected to respective source/drain epitaxy structures 200 of the PG-1 transistor. For example, the source/drain contact 140 may be a source contact, while the source/drain contact 142 may be a drain contact. In some embodiments, the source/drain contact 140 and the source/drain contact 142 are in contact with top surfaces of the respective source/drain epitaxy structures 200 of the PG-1 transistor. Stated another way, the source/drain contact 140 and the source/drain contact 142 are disposed on the front side of the PG-1 transistor.

The PG-2 transistor may include a source/drain contact 144 (second bit line node 'BL2') and a source/drain contact 146 (second common drain) connected to respective source/ drain regions of the PG-2 transistor. For example, the source/drain contact 144 may be a source contact, while the source/drain contact 146 may be a drain contact. In some embodiments, the source/drain contact 144 and the source/drain contact 146 are in contact with top surfaces of the respective source/drain epitaxy structures 200 of the PG-2 transistor. Stated another way, the source/drain contact 140 and the source/drain contact 142 are disposed on the front side of the PG-2 transistor.

The PD-1 transistor may include a source/drain contact 148 ($CV_{SS}$ node) and the source/drain contact 142 (first common drain) connected to respective source/drain epitaxy structures 200 of the PD-1 transistor. For example, the source/drain contact 148 may be a source contact, while the source/drain contact 142 may be a drain contact. In some embodiments, the source/drain contact 148 is in contact with a bottom surface of the respective source/drain epitaxy structure 200 of the PD-1 transistor. However, the source/drain contact 142 is in contact with a top surface of the respective source/drain epitaxy structure 200 of the PD-1 transistor. Stated another way, the source/drain contact 148 is disposed on the backside of the PD-1 transistor, while the source/drain contact 142 is disposed on the front side of the PD-1 transistor.

The PD-2 transistor may include a source/drain contact 150 ($CV_{SS}$ node) and the source/drain contact 146 (second common drain) connected to respective source/drain epitaxy structures 200 of the PD-2 transistor. For example, the source/drain contact 150 may be a source contact, while the source/drain contact 146 may be a drain contact. In some embodiments, the source/drain contact 150 is in contact with a bottom surface of the respective source/drain epitaxy structure 200 of the PD-2 transistor. However, the source/drain contact 146 is in contact with a top surface of the respective source/drain epitaxy structure 200 of the PD-2 transistor. Stated another way, the source/drain contact 150 is disposed on the backside of the PD-2 transistor, while the source/drain contact 146 is disposed on the front side of the PD-2 transistor. In some embodiments, the source/drain contact 150 can also be referred to as a backside via.

The PU-1 transistor may include a source/drain contact 152 ($1^{st}$ $CV_{dd}$ node), a source/drain contact 153 (2 nd $CV_{dd}$ node), and the source/drain contact 142 (first common drain) connected to respective source/drain epitaxy structures 202 of the PU-1 transistor. For example, the source/drain contacts 152 and 153 may be source contacts, while the source/drain contact 142 may be a drain contact. In some embodiments, the source/drain contacts 152 and 153 may be in contact with the same source/drain epitaxy structures 202 of the PU-1 transistor. However, the source/drain contact 152 is in contact with the top surface of the corresponding source/drain epitaxy structure 202, while the source/drain contact 153 is in contact with the bottom surface of the corresponding source/drain epitaxy structure 202. Moreover, the source/drain contact 142 is in contact with a top surface of the respective source/drain epitaxy structure 202 of the PU-1 transistor. Stated another way, the source/drain contacts 153 is disposed on the backside of the PU-1 transistor, while the source/drain contacts 152 and 142 are disposed on the front side of the PU-1 transistor. In some embodiments, the source/drain contact 152 is wider than the source/drain contact 153 along the X-direction.

The PU-2 transistor may include a source/drain contact 154 ($1^{st}$ $CV_{dd}$ node), a source/drain contact 155 ($2^{nd}$ $CV_{dd}$ node), and the source/drain contact 146 (second common drain) connected to respective source/drain epitaxy structures 202 of the PU-2 transistor. For example, the source/drain contacts 154 and 155 may be a source contact, while the source/drain contact 146 may be a drain contact. In some embodiments, the source/drain contacts 154 and 155 may be in contact with the same source/drain epitaxy structures 202 of the PU-2 transistor. However, the source/drain contact 154 is in contact with the top surface of the corresponding source/drain epitaxy structure 202, while the source/drain contact 155 is in contact with the bottom surface of the corresponding source/drain epitaxy structure 202. Moreover, the source/drain contact 146 is in contact with a top surface of the respective source/drain epitaxy structures 202 of the PU-2 transistor. Stated another way, the source/drain contacts 155 is disposed on the backside of the PU-2 transistor, while the source/drain contacts 154 and 146 are disposed on the front side of the PU-2 transistor. In some embodiments, the source/drain contact 155 can also be referred to as a backside via. In some embodiments, the source/drain contact 154 is wider than the source/drain contact 155 along the X-direction.

Reference is made to the cross-sectional views of FIGS. 2C to 2H. The source/drain contacts 140, 142,144, 146, 152, and 154 are disposed in the ILD layer 220. On the other hand, the source/drain contacts 148, 150, 153, and 155 are disposed in a backside dielectric layer 240 on a backside of the PG-1, PG-2, PD-1, PD-2, PU-1, and PU-2 transistors. In greater details, the backside dielectric layer 240 may be in contact with bottom surfaces of the isolation structures 205, bottom surfaces of the gate structures 118, 120, 122, and 124, bottom surfaces of the source/drain epitaxy structures 200 and 202, bottom surface of the ILD layer 220, and bottom surfaces of the gate-end dielectric layer 230. In some embodiments, the source/drain contacts 148, 150, 153, and 155 may be made of conductive material, such as metal. The conductive material may include one or more layers of Co, Ni, W, Ti, Ta, Cu, Al, TiN and TaN, or any other suitable material.

Reference is made to FIGS. 2A and 2E, the source/drain contact 142 may be in contact with the source/drain epitaxy structure 200 of the PG-1 and PD-1 transistors and the source/drain epitaxy structure 202 of the PU-1 transistor. Accordingly, the PG-1, PD-1, and PU-1 transistors are electrically coupled to each other (see FIG. 1). Similarly, the source/drain contact 146 may be in contact with the source/drain epitaxy structure 200 of the PG-2 and PD-2 transistors and the source/drain epitaxy structure 202 of the PU-2 transistor. Accordingly, the PG-2, PD-2, and PU-2 transistors are electrically coupled to each other (see FIG. 1).

Referring back to the top view of FIG. 2A, the SRAM device 100 further includes contacts 190 and 192. In some embodiments, the contact 190 is in contact with top surface of the gate structure 124 (see FIG. 2D) and top surface of the source/drain contact 142 (see FIG. 2E). The contact 192 is in contact with top surface of the gate structure 122 (see FIG. 2G) and top surface of the source/drain contact 146 (see FIG. 2E). Accordingly, the gate structure 124 of the PU-2 transistor is electrically connected to a source/drain region of the PG-1 transistor, a source/drain region of the PD-1 transistor, and a source/drain region of the PU-1 transistor. Similarly, the gate structure 122 of the PU-1 transistor is electrically connected to a source/drain region of the PG-2 transistor, a source/drain region of the PD-2 transistor, and a source/drain region of the PU-2 transistor. In some embodiments, the contacts 190 and 192 may be made of conductive material, such as metal. The conductive material may include one or more layers of Co, Ni, W, Ti, Ta, Cu, Al, TiN and TaN, or any other suitable material.

The SRAM device 100 further includes source/drain vias 160, 162, 164, and 166. The source/drain via 160 is in contact with top surface of the source/drain contact 140, the source/drain via 162 is in contact with top surface of the source/drain contact 152, the source/drain via 164 is in contact with top surface of the source/drain contact 144, and the source/drain via 166 is in contact with top surface of the source/drain contact 154. In some embodiments, the source/drain vias 160, 162, 164, and 166 are made of conductive material, such as metal. In some embodiments, the conductive material may include W, Ru, Co, Cu, Ti, TiN, Ta, TaN, Mo, Ni, or the like.

The SRAM device 100 further includes a bit line BL1, a bit line BL2, and a power line Cvdd1. The bit line BL1 is in contact with top surface of the source/drain via 160, such that the bit line BL1 is electrically connected to a corresponding source/drain region of the PG-1 transistor. The bit line BL2 is in contact with top surface of the source/drain via 164, such that the bit line BL2 is electrically connected to a corresponding source/drain region of the PG-2 transistor. The power line Cvdd1 is in contact with top surface of the source/drain vias 162 and 166, such that the power line Cvdd1 is electrically connected to a corresponding source/drain region of the PU-1 transistor, and is electrically connected to a corresponding source/drain region of the PU-2 transistor. In some embodiments, the bit line BL1, the bit line BL2, and the power line Cvdd1 are disposed on the front side of the PG-1, PG-2, PD-1, PD-2, PU-1, and PU-2 transistors. That is, the bit line BL1, the bit line BL2, and the power line Cvdd1 are at a level vertically above the PG-1, PG-2, PD-1, PD-2, PU-1, and PU-2 transistors. In some embodiments, the bit line BL1 can be the bit line BL as described in FIG. 1, and the bit line BL2 can be the bit line BLB as described in FIG. 1. In some embodiments, the bit line BL1, the bit line BL2, and the power line Cvdd1 are made of conductive material, such as metal. In some embodiments, the conductive material may include W, Ru, Co, Cu, Ti, TiN, Ta, TaN, Mo, Ni, or the like.

The SRAM device 100 further includes gate vias 170 and 172. In some embodiments, the gate via 170 is in contact with top surface of the gate structure 118 (see FIG. 2D), and the gate via 172 is in contact with top surface of the gate structure 120 (see FIG. 2H). In some embodiments, gate vias 170 and 172 are made of conductive material, such as metal. In some embodiments, the conductive material may include W, Ru, Co, Cu, Ti, TiN, Ta, TaN, Mo, Ni, or the like.

The SRAM device 100 further includes metal lines 174 and 176. In some embodiments, the metal line 174 is in contact with top surface of the gate via 170 (see FIG. 2D), and the metal line 176 is in contact with top surface of the gate via 170 (see FIG. 2H). In some embodiments, the metal lines 174 and 176 are made of conductive material, such as metal. In some embodiments, the conductive material may include W, Ru, Co, Cu, Ti, TiN, Ta, TaN, Mo, Ni, or the like.

As shown in FIG. 2D, the bit line BL1, the bit line BL2, the power line Cvdd1, and the metal lines 174 and 176 are at a same level. In some embodiments, the bit line BL1, the bit line BL2, the power line Cvdd1, and the metal lines 174 and 176 can be collectively referred to as a metal-1 (M1) layer of a back-end-of-line (BEOL) structure.

The SRAM device 100 further includes metal vias 178 and 180. In some embodiments, the metal via 178 is in contact with top surface of the metal line 174 (see FIG. 2E), and the metal via 180 is in contact with top surface of the metal line 176 (see FIGS. 2E and 2H). In some embodiments, the metal vias 178 and 180 are made of conductive material, such as metal. In some embodiments, the conductive material may include W, Ru, Co, Cu, Ti, TiN, Ta, TaN, Mo, Ni, or the like.

The SRAM device 100 further includes a word line WL. In some embodiments, the word line WL is in contact with top surfaces of the metal vias 178 and 180. Accordingly, the gate structure 118 of the PG-1 transistor and the gate structure 120 of the PG-2 transistor are electrically connected to the word line WL. In some embodiments, the word line WL is at a level that is above the bit line BL1, the bit line BL2, and the power line Cvdd1. In some embodiments, the word line WL can be referred to as a metal-2 (M2) layer of the back-end-of-line (BEOL) structure. In some embodiments, the word line WL is made of conductive material, such as metal. In some embodiments, the conductive material may include W, Ru, Co, Cu, Ti, TiN, Ta, TaN, Mo, Ni, or the like.

As shown in the cross-sectional view of FIGS. 2C to 2H, the SRAM device 100 further includes an interlayer dielectric (ILD) layer 245 disposed over the ILD layer 220. In some embodiments, the source/drain vias 160, 162, 164, and 166, the gate vias 170 and 172, and the contacts 190 and 192 are disposed in the ILD layer 245. In some embodiments, the ILD layer 245 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide.

The SRAM device 100 further includes an inter-metal dielectric (IMD) layer 250 disposed over the ILD layer 245. In some embodiments, the bit line BL1, the bit line BL2, the power line Cvdd1, and the metal lines 174 and 176 are disposed in the IMD layer 250.

The SRAM device 100 further includes an inter-metal dielectric (IMD) layer 255 disposed over the IMD layer 250. In some embodiments, the metal vias 178 and 180 are disposed in the IMD layer 255.

The SRAM device 100 further includes an inter-metal dielectric (IMD) layer 260 disposed over the IMD layer 255. In some embodiments, the word line WL is disposed in the IMD layer 260.

The SRAM device 100 further includes an inter-metal dielectric (IMD) layer 265 disposed over the IMD layer 260. In some embodiments, the IMD layer 265 may cover top surface of the word line WL. In some embodiments, the IMD layers 250, 255, 260, and 265 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the IMD layer 265 can also be referred to as a passivation layer.

Referring back to the top view of FIG. 2B, the SRAM device 100 further includes a power line CVdd2, a power line CVss1, and a power line CVss2. In some embodiments, the power line CVdd2 is in contact with bottom surface of the source/drain contact 153 and bottom surface of the source/drain contact 155 (see FIG. 2G). Accordingly, the power line CVdd2 is electrically connected to a source/drain region of the PU-1 transistor and a source/drain region of the PU-2 transistor. In FIGS. 2A and 2B, the power line CVdd1 at the front side of the structure and the power line CVdd2 at the backside of the structure can collectively serve as a power routing. For example, the power routing can be the power routing Vdd of the SRAM cell 10 as described in FIG. 1. That is, the power routing Vdd can be regarded as having a first portion at the front side of the structure (e.g., the power line CVdd1) and a second portion at the backside of the structure (e.g., the power line CVdd2). In some embodiments, the power line CVdd1 can be referred to as a front side power line, and the power line CVdd2 can be referred to as backside power line.

On the other hand, the power line CVss1 is in contact with bottom surface of the source/drain contact 148, and the power line CVss2 is in contact with bottom surface of the source/drain contact 150 (see FIGS. 2C and 2F). In some embodiments, the power line CVdd2, the power line CVss1, and the power line CVss2 are made of conductive material, such as metal. In some embodiments, the conductive material may include W, Ru, Co, Cu, Ti, TiN, Ta, TaN, Mo, Ni, or the like.

The SRAM device 100 further includes metal vias 194 and 196. In some embodiments, the metal via 194 is in contact with bottom surface of the power line CVss1 (see FIG. 2E), and the metal via 196 is in contact with bottom surface of the power line CVss2 (see FIGS. 2E and 2F). In some embodiments, the metal vias 194 and 196 can also be referred to as backside metal vias. In some embodiments, the metal vias 194 and 196 are made of conductive material, such as metal. In some embodiments, the conductive material may include W, Ru, Co, Cu, Ti, TiN, Ta, TaN, Mo, Ni, or the like.

The SRAM device 100 further includes a power line CVss3. In some embodiments, the power line CVss3 is in contact with bottom surface of the metal vias 194 and 196. That is, the power line CVss3 may electrically connect the power line CVss1 to the power line CVss2. Moreover, the power lines CVss1, CVss2, and CVss3 are electrically connected to a source/drain region of the PD-1 transistor and a source/drain region of the PD-2 transistor. In some embodiments, the power lines CVss1, CVss2, and CVss3, and/or the metal vias 194 and 196 can collectively serve as a power routing. The power routing can be the power routing Vss of the SRAM cell 10 as described in FIG. 1. That is, the power routing Vss can be regarded as having a first portion (e.g., the power line CVss1) and a second portion (e.g., the power line CVss2) at the backside of the structure, and having a third portion (e.g., the power line CVss3) at an even lower level than the first and second portions, in which the third portion is used to electrically connect the first and second portions. In some embodiments, the power lines CVss1, CVss2, and CVss3 can be referred to as backside power lines. In some embodiments, the power line CVss3 is made of conductive material, such as metal. In some embodiments, the conductive material may include W, Ru, Co, Cu, Ti, TiN, Ta, TaN, Mo, Ni, or the like.

As shown in the cross-sectional view of FIGS. 2C to 2H, the SRAM device 100 further includes a backside intermetal dielectric (IMD) layer 270 disposed below the backside dielectric layer 240. In some embodiments, the power lines CVss1, CVss2, and Cvdd2 are disposed in the backside IMD layer 270.

The SRAM device 100 further includes a backside intermetal dielectric (IMD) layer 275 disposed below the backside IMD layer 270. In some embodiments, the metal vias 194 and 196 are disposed in the backside IMD layer 275.

The SRAM device 100 further includes a backside intermetal dielectric (IMD) layer 280 disposed below the backside IMD layer 275. In some embodiments, the power line CVss3 is disposed in the backside IMD layer 280.

The SRAM device 100 further includes a backside intermetal dielectric (IMD) layer 285 disposed below the backside IMD layer 280. In some embodiments, the IMD layer 285 is in contact with bottom surface of the power line CVss3. In some embodiments, the backside IMD layers 270, 275, 280, and 285 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bisbenzocyclobutenes (BCB), or polyimide. In some embodiments, the IMD layer 285 can also be referred to as a passivation layer.

Reference is made to the top view of FIG. 2A. The power line Cvdd1, the bit line BL1, and the bit line BL2 each includes a lengthwise direction along the Y-direction. Moreover, the power line Cvdd1 is laterally between the bit line BL1 and the bit line BL2 along the X-direction. In some embodiments, the lateral width of the power line Cvdd1 along the X-direction is less than the lateral width of the bit line BL1 along the X-direction and the lateral width of the bit line BL2 along the X-direction. In some embodiments, the lateral width of the bit line BL1 along the X-direction may be substantially equal to the lateral width of the bit line BL2 along the X-direction. The word line WL has a lengthwise direction along the X-direction. Moreover, the word line WL may vertically overlap the power line Cvdd1, the bit line BL1, and the bit line BL2.

Reference is made to the top view of FIG. 2B. The power line Cvdd2, the power line CVss1, and the power line CVss2 each includes a lengthwise direction along the Y-direction. Moreover, the power line Cvdd2 is laterally between the power line CVss1 and the power line CVss2 along the X-direction. In some embodiments, the lateral width of the power line Cvdd2 along the X-direction is greater than the lateral width of the power line CVss1 along the X-direction and the lateral width of the power line CVss2 along the X-direction. In some embodiments, the lateral width of the power line CVss1 along the X-direction may be substantially equal to the lateral width of the power line CVss2 along the X-direction. The power line CVss3 has a lengthwise direction along the X-direction. Moreover, the power line CVss3 may vertically overlap the power line power line Cvdd2, the power line CVss1, and the power line CVss2.

Reference is made to the top view of FIGS. 2A and 2B. The bit line BL1 at the front side of the SRAM device 100 may vertically overlap the power line CVss1 at the backside of the SRAM device 100. The bit line BL2 at the front side of the SRAM device 100 may vertically overlap the power line CVss2 at the backside of the SRAM device 100. The power line CVdd1 at the front side of the SRAM device 100 may vertically overlap the power line CVdd2 at the backside of the SRAM device 100. In some embodiments, the lateral width of the power line CVdd1 along the X-direction is less than the lateral width of the power line CVdd2 along the X-direction. In some embodiments, the word line WL may vertically overlap the power line CVss3.

In some embodiments, the bit line BL1, the word line WL, the power line Cvss1, and the power line CVss3 may vertically overlap the PG-1 transistor. Similarly, the bit line BL1, the word line WL, the power line Cvss1, and the power line CVss3 may vertically overlap the PD-1 transistor. In some embodiments, the bit line BL2, the word line WL, the power line Cvss2, and the power line CVss3 may vertically overlap the PG-2 transistor. Similarly, the bit line BL2, the word line WL, the power line Cvss2, and the power line CVss3 may vertically overlap the PD-2 transistor. In some embodiments, the power line CVdd1, the word line WL, the power line CVdd2, and the power line CVss3 may vertically overlap the PU-1 transistor. Similarly, the power line CVdd1, the word line WL, the power line CVdd2, and the power line CVss3 may vertically overlap the PU-2 transistor. It is noted that the PU-1 transistor and the PD-1 transistor may collectively form a first inverter (e.g., the inverter 102 of FIG. 1), and the PU-2 transistor and the PD-2 transistor may collectively form a second inverter (e.g., the inverter 104 of FIG. 1), in which the first inverter and the second inverter are cross-coupled with each other.

As shown in the cross-sectional view of FIG. 2E, the SRAM device 100 may include an under bump metallization (UBM) pad 350 in the IMD layer 265 and in contact with the word line WL, and an external connector 352 over the UBM pad 350. Moreover, the SRAM device 100 may include an under bump metallization (UBM) pad 360 in the backside IMD layer 285 and in contact with the word line WL, and an external connector 362 over the UBM pad 360. The UBM pads 350 and 360 each may comprise one or more layers of copper, nickel, gold, or the like, which are formed by a plating process, or the like. External connectors 352 and 362 (e.g., solder balls) are formed on the UBM pads 350 and 360. The formation of external connectors 352 and 362 may include placing solder balls on the exposed portions of UBM pads 350 and 360 and then reflowing the solder balls. The UBM pads 350 and 360 and the external connectors 352 and 362 may be used to provide input/output connections to other electrical components, such as, other device dies, redistribution structures, printed circuit boards (PCBs), motherboards, or the like.

FIGS. 3A to 13H illustrate a method in various stages of forming an SRAM device in accordance with some embodiments of the present disclosure. It is noted that some elements described in FIGS. 3A to 13H are similar to or the same as those described in FIGS. 2A to 2H, such elements are labeled the same, and relevant details will not be repeated for brevity.

Figure 3A:
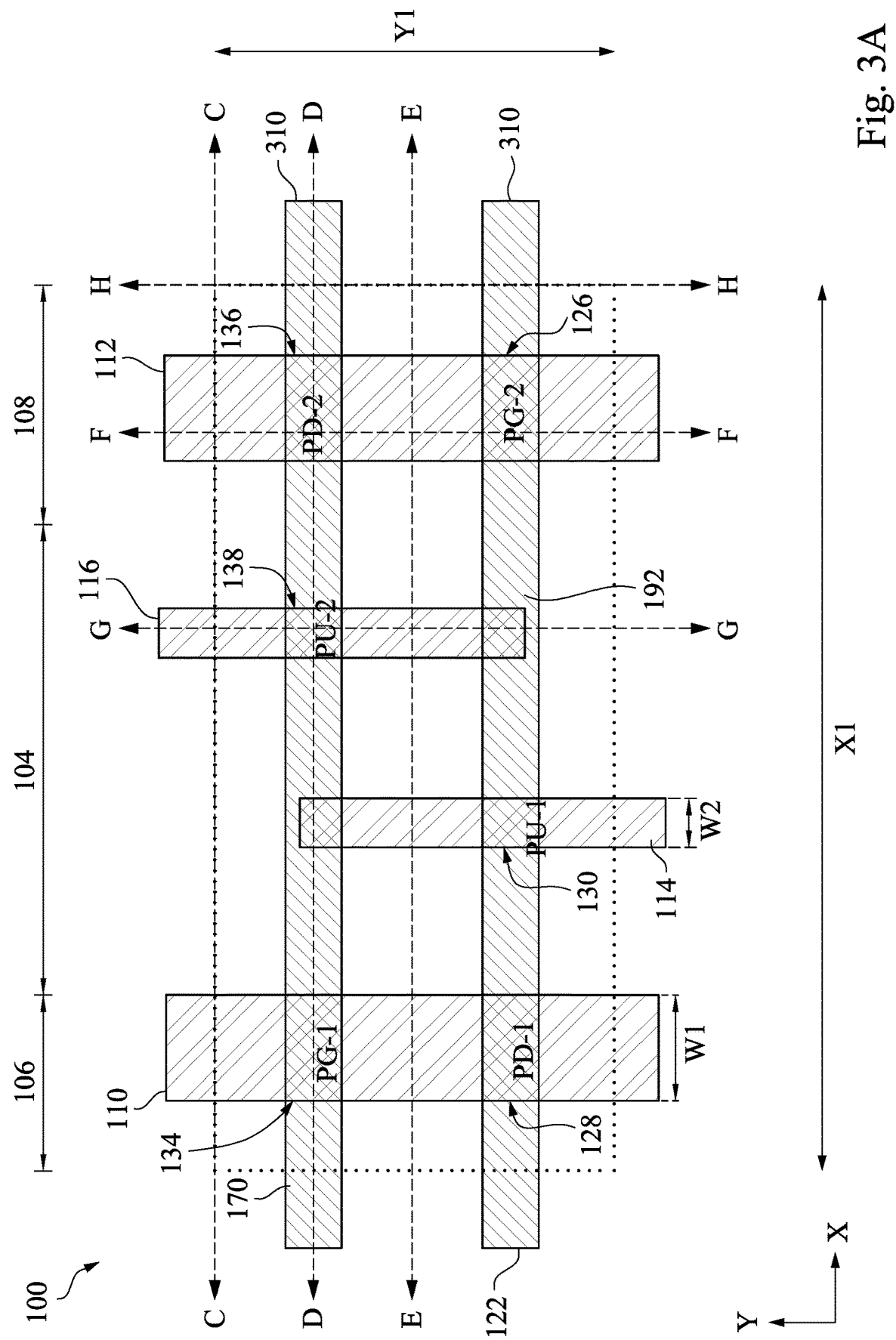
FIGS. 3A to 13H illustrate a method in various stages of forming an SRAM device in accordance with some embodiments of the present disclosure.
Figure 3B:
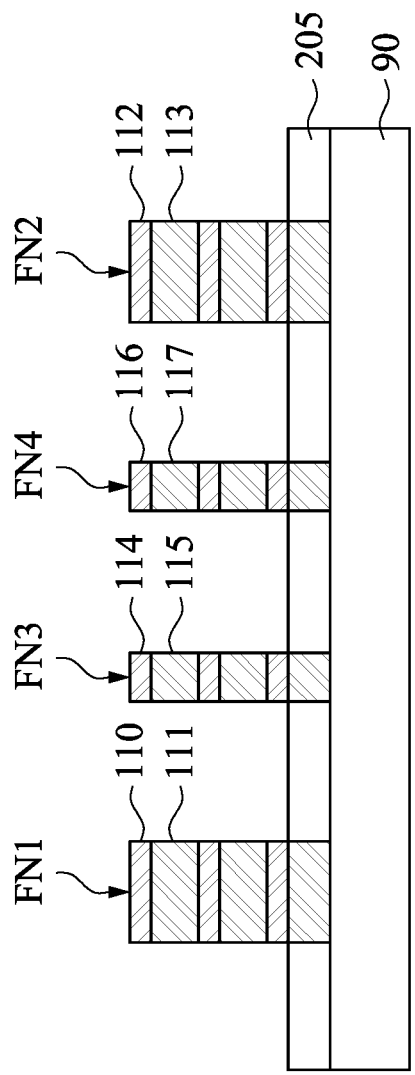
Figure 3C:
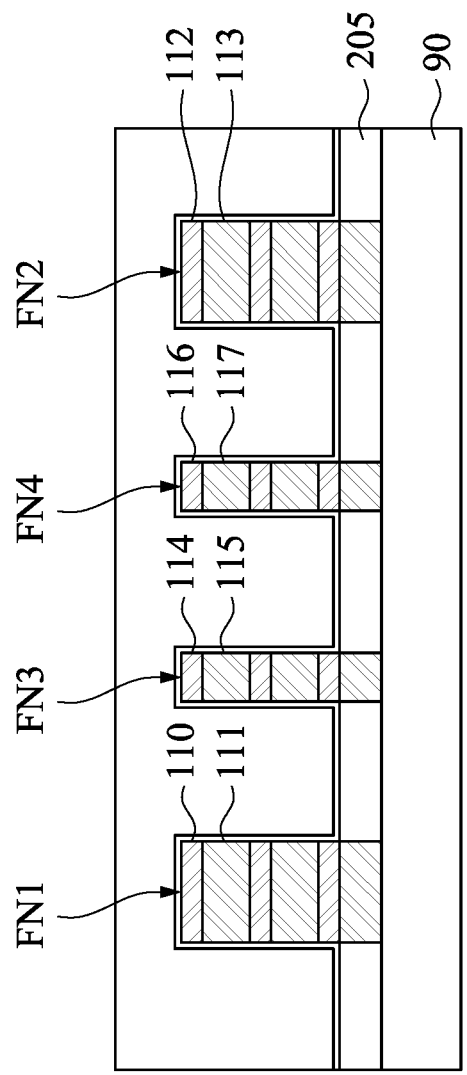
Figure 3D:
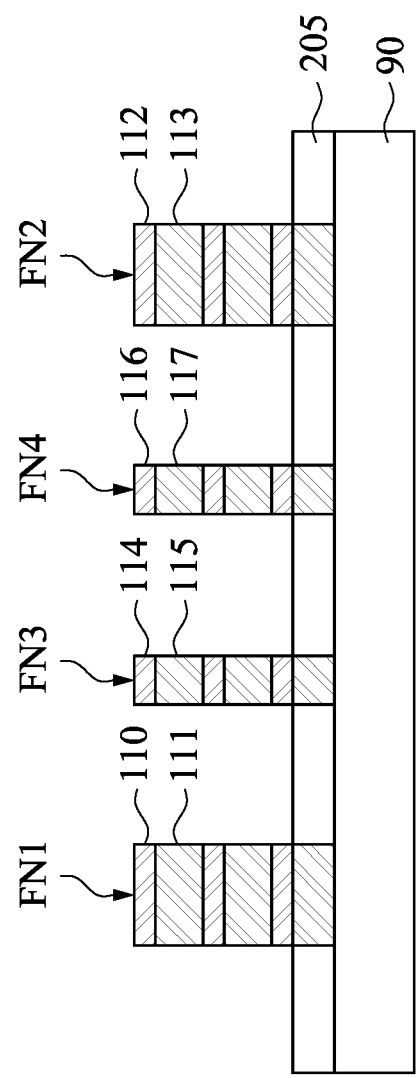
Figure 3F:
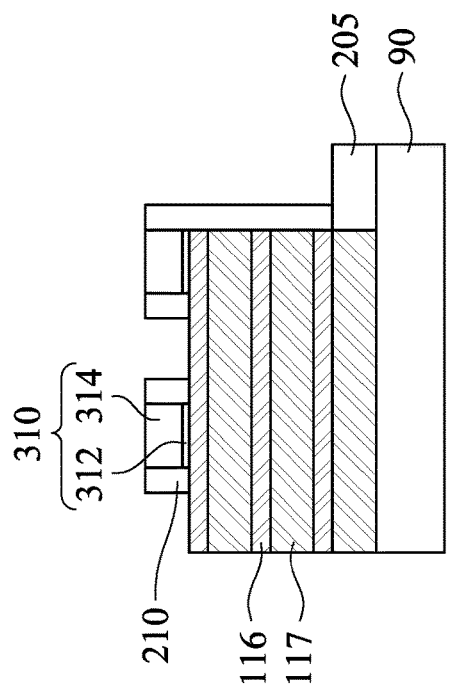
Figure 3E:
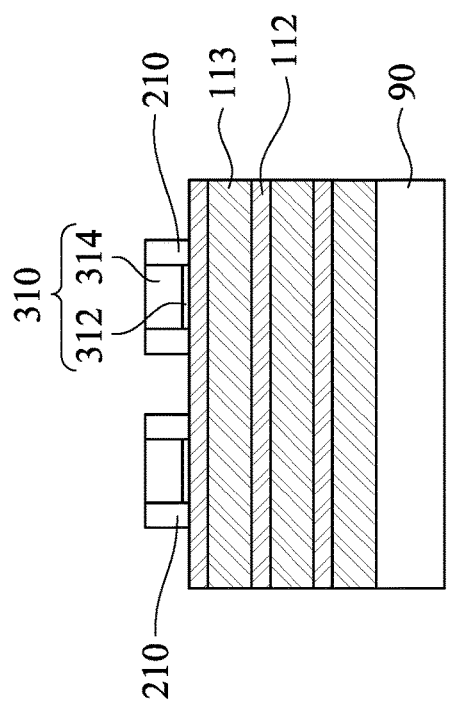
Figure 3G:
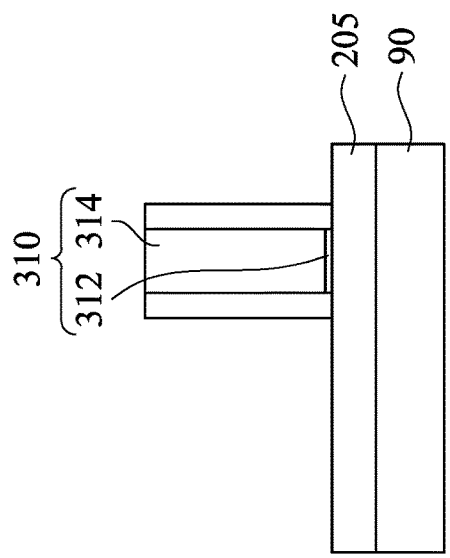
Figure 4C:
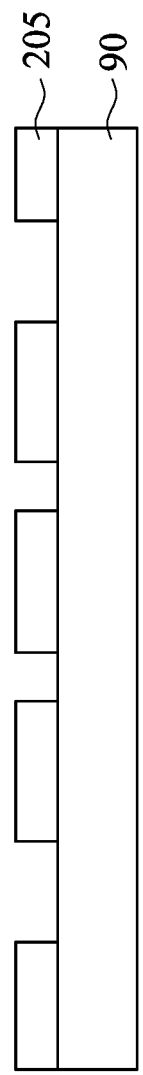
Figure 4D:
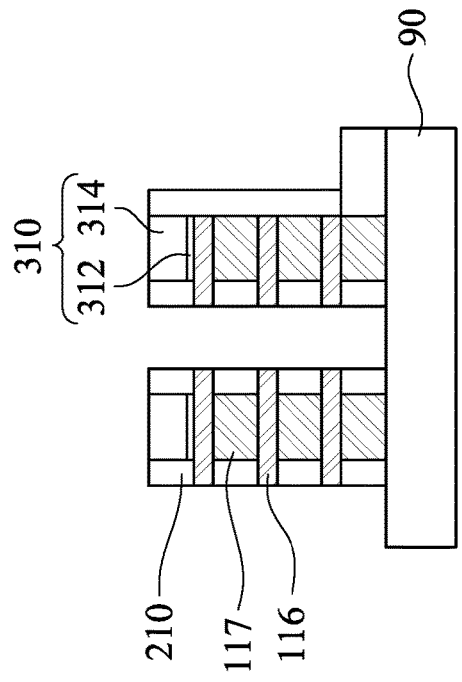
Figure 4E:
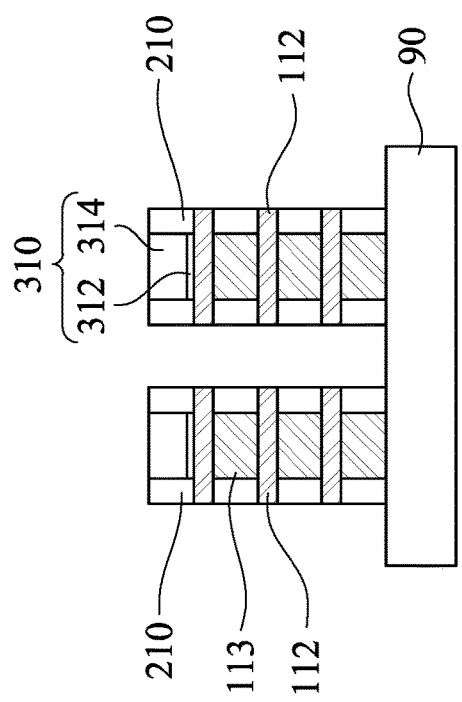
Figure 4F:
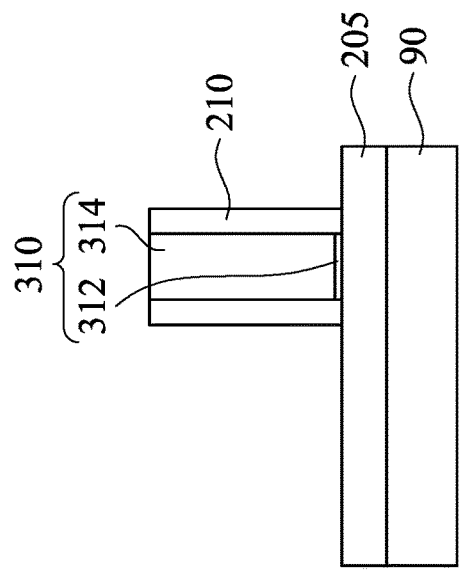
Figure 5C:
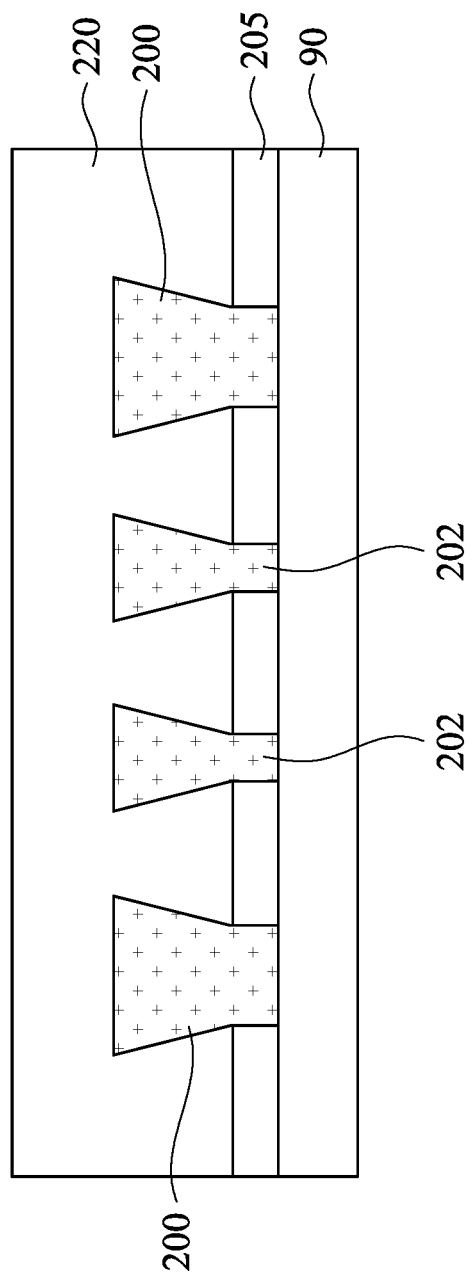
Figure 5E:
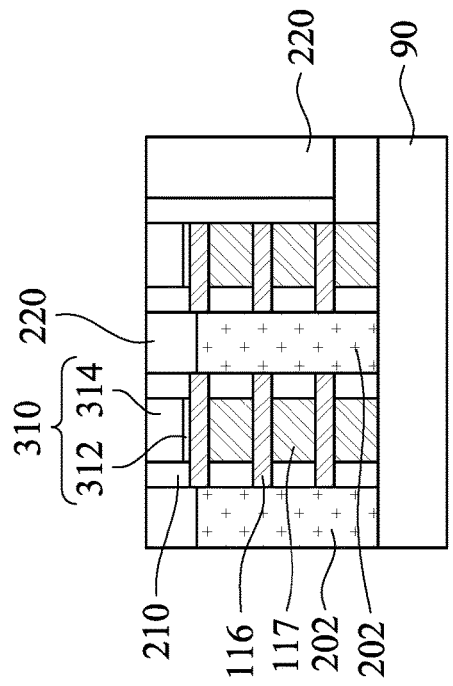
Figure 5D:
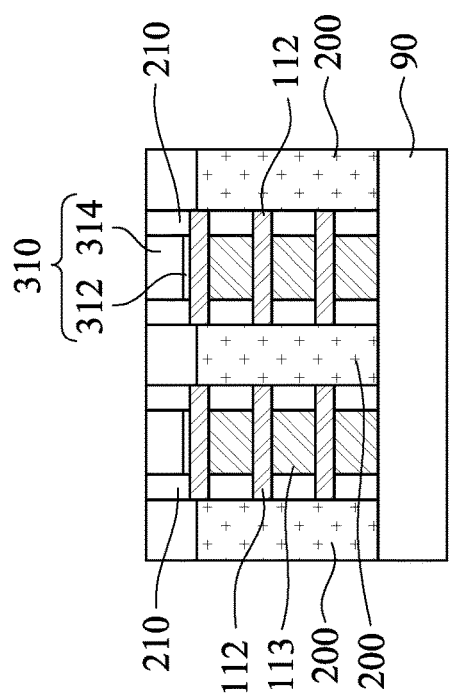
Figure 5F:
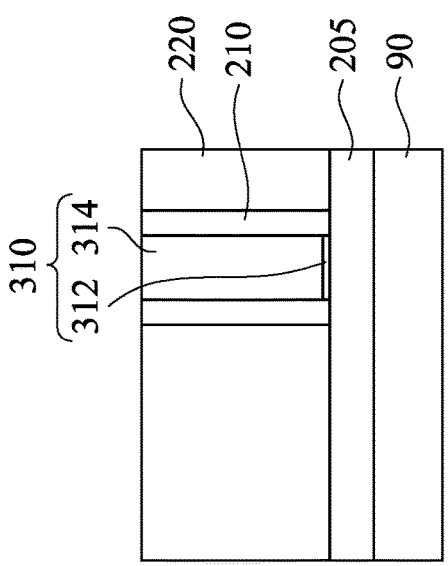

Reference is made to FIGS. 3A to 3G, in which FIG. 3A is a cell array layout diagram of an SRAM device on a front side of a semiconductor structure, FIGS. 3B, 3C, 3D, 3E, 3F, and 3G are cross-sectional views along lines C-C, D-D, E-E, F-F, G-G, and H-H of FIG. 3A.

Shown there is a substrate 90. The substrate 90 may be made of silicon or other semiconductor materials. Alternatively or additionally, the substrate 90 may include other elementary semiconductor materials such as germanium. In some embodiments, the substrate 90 is made of a compound semiconductor such as silicon carbide (SiC), gallium arsenic (GaAs), indium arsenide (InAs), or indium phosphide (InP). In some embodiments, the substrate 90 is made of an alloy semiconductor such as silicon germanium (SiGe), silicon germanium carbide (SiGeC), gallium arsenic phosphide (GaAsP), or gallium indium phosphide (GaInP). In some embodiments, the substrate 90 includes an epitaxial layer. For example, the substrate 90 has an epitaxial layer overlying a bulk semiconductor.

Fin structures FN1, FN2, FN3, and FN4 are formed over the substrate 90. In some embodiment, the fin structure FN1 includes semiconductor layers 110 and 111 alternately stacked over the substrate 90. The fin structure FN2 includes semiconductor layers 112 and 113 alternately stacked over the substrate 90. The fin structure FN3 includes semiconductor layers 114 and 115 alternately stacked over the substrate 90. The fin structure FN4 includes semiconductor layers 116 and 117 alternately stacked over the substrate 90.

In some embodiments, the semiconductor layers 111, 113, 115, and 117 of the fin structures FN1, FN2, FN3, and FN4 may be made of a first semiconductor material, while the semiconductor layers 110, 112, 114, and 116 of the fin structures FN1, FN2, FN3, and FN4 may be made of a second semiconductor material that is different from the first semiconductor material. The first semiconductor material and the second semiconductor material may include different materials and/or components, such that the first semiconductor material and the second semiconductor material have different etching rates. In some embodiments, the first semiconductor material is made from SiGe. The germanium percentage (atomic percentage concentration) of the first semiconductor material is in the range between about 10 percent and about 20 percent, while higher or lower germanium percentages may be used. It is appreciated, however, that the values recited throughout the description are examples, and may be changed to different values. For example, the first semiconductor material may be $Si_{0.8}Ge_{0.2}$ or $Si_{0.9}Ge_{0.1}$, in which the proportion between Si and Ge may vary from embodiments, and the disclosure is not limited thereto. The second semiconductor material may be pure silicon layers that are free of germanium. The second semiconductor material may also be substantially pure silicon layers, for example, with a germanium percentage lower than about 1 percent. In some embodiments, the first semiconductor material has a higher germanium atomic percentage concentration than the second semiconductor material. The first semiconductor material and the second semiconductor material may be formed by chemical vapor deposition (CVD), molecular beam epitaxy (MBE), or other suitable process(es). In some embodiments, the first semiconductor material and the second semiconductor material are formed by an epitaxy growth process, and thus the first semiconductor material and the second semiconductor material can also be referred to as epitaxial layers in this content.

The fin structures FN1, FN2, FN3, and FN4 may be formed by, for example, alternately depositing the first semiconductor material and the second semiconductor material over the substrate 90, and then patterning the stack of the first semiconductor material and the second semiconductor material according to a predetermined pattern.

Isolation structures 205 are formed over the substrate 90 and laterally surrounding the bottom portion of each of the fin structures FN1, FN2, FN3, and FN4. The isolation structures 205 may be formed by, for example, depositing a dielectric material over the substrate 90 and covering the fin structures FN1, FN2, FN3, and FN4, performing a planarization process (e.g., a CMP process) to remove excess dielectric material until top surfaces of the fin structures FN1, FN2, FN3, and FN4 are exposed, and then etching back the dielectric material to lower the top surface of the dielectric material to a desired position.

Dummy gate structures 310 are formed over the substrate 90 and crossing the fin structures FN1, FN2, FN3, and FN4. In some embodiments, each of the dummy gate structures 310 includes a gate dielectric 312 and a gate electrode 314 over the gate dielectric 312. The gate dielectric 312 may include one or more dielectric layers, such as an oxide, a metal oxide, the like, or combinations thereof. For example, in some embodiments, the gate dielectrics may include a silicon oxide layer and a metal oxide layer over the silicon oxide layer. The gate electrode 314 may be formed, for example, using polysilicon, although other materials such as metal silicides, metal nitrides, or the like, may also be used.

Gate spacers 210 are formed on opposite sidewalls of the dummy gate structures 310. That gate spacers 210 may be formed by, for example, depositing a dielectric layer blanket over the substrate 90, and then performing an anisotropic etching process to remove horizontal portions of the dielectric layer, while leaving vertical portions of the dielectric layer on opposite sidewalls of the dummy gate structures 310.

Reference is made to FIGS. 4A to 4F, in which FIGS. 4A to 4F follow the cross-sectional views of FIGS. 3B to 3G, respectively. Portions of the fin structures FN1, FN2, FN3, and FN4 exposed by the dummy gate structures 310 and the gate spacers 210 are removed through a suitable process, such as etching.

Portions of the exposed semiconductor layers 111, 113, 114, 115 (see FIGS. 4D and 4E) are laterally etched to form sidewall recesses, and then inner spacers 215 are formed in the sidewall recesses. In some embodiments, the sidewalls of the semiconductor layers 111, 113, 114, 115 may be etched using isotropic etching processes, such as wet etching or the like. In some embodiments in which the semiconductor layers 111, 113, 114, 115 include, e.g., SiGe, and the semiconductor layers 110, 112, 114, 116 include, e.g., Si, a dry etch process with tetramethylammonium hydroxide (TMAH), ammonium hydroxide ($NH_4OH$), or the like may be used to etch sidewalls of the semiconductor layers 111, 113, 114, 115.

The inner spacers 215 may be deposited by a conformal deposition process, such as CVD, ALD, or the like. The inner spacers 215 may be formed by, for example, depositing an inner spacer layer blanket over the substrate 90 and filling the sidewall recesses of the semiconductor layers 111, 113, 114, 115, and then performing an anisotropic etching to remove unwanted portions of the inner spacer layer.

Reference is made to FIGS. 5A to 5F, in which FIGS. 5A to 5F follow the cross-sectional views of FIGS. 4A to 4F, respectively. Source/drain epitaxy structures 200 and 202 are formed over the substrate 90 and on opposite sides of each of the dummy gate structures 310, respectively. In some embodiments, the source/drain epitaxy structures 200 and 202 may be formed by, for example, performing a deposition process, such as an epitaxial growth, to grow an epitaxial material over the substrate 90.

After the source/drain epitaxy structures 200 and 202 are formed, interlayer dielectric (ILD) layer 220 are formed covering the source/drain epitaxy structures 200 and 202, and laterally surrounding the dummy gate structures 310. In some embodiments, the ILD layer 220 may be formed by, for example depositing a dielectric material over the substrate 90, and then performing a planarization process (e.g., a CMP process) until top surfaces of the dummy gate structures 310 are exposed.

Figure 6A:
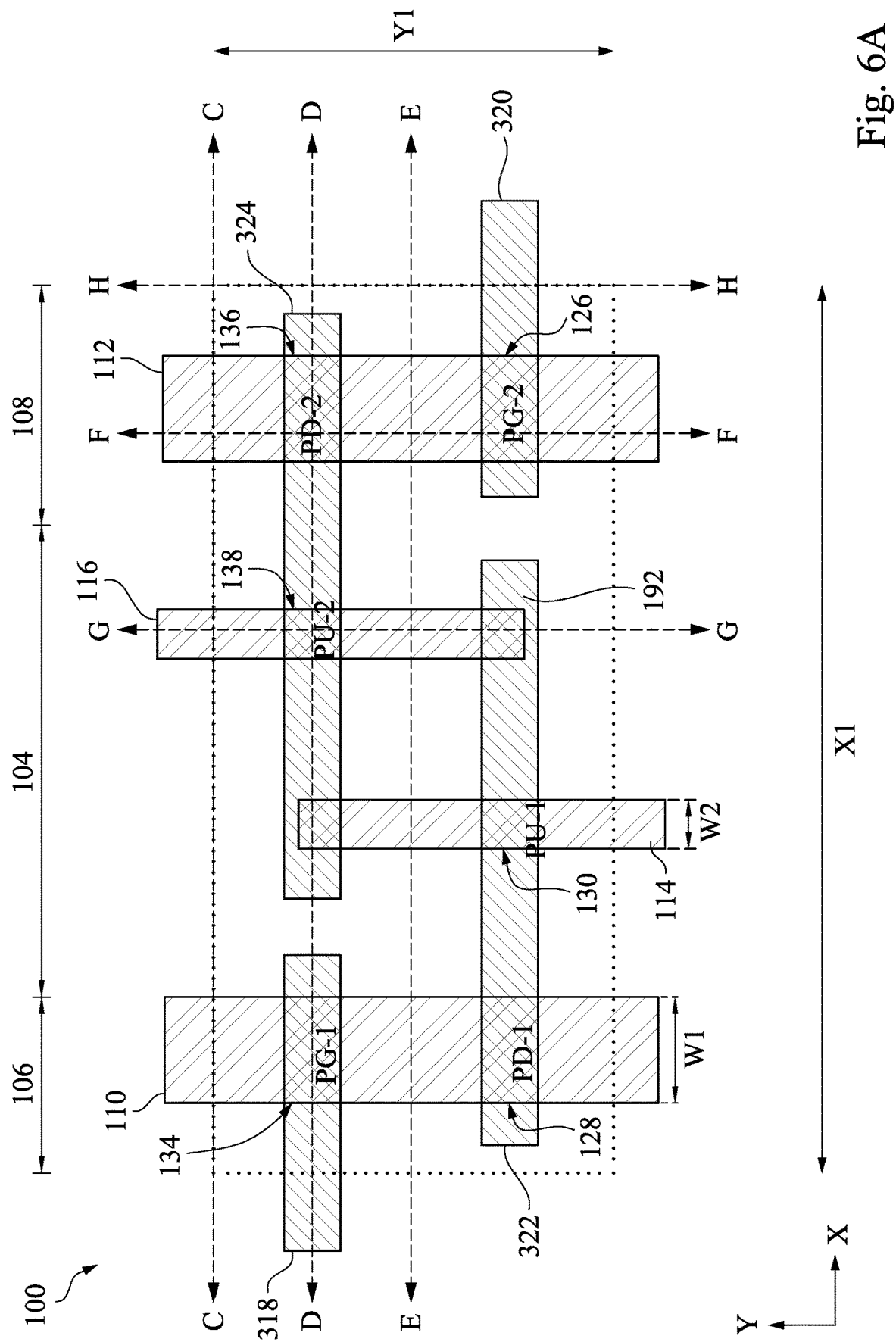
Figure 6B:
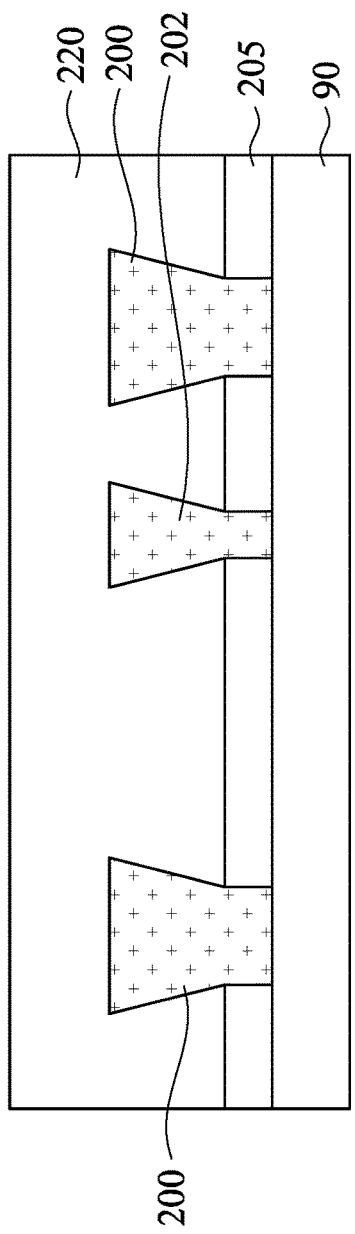
Figure 6C:
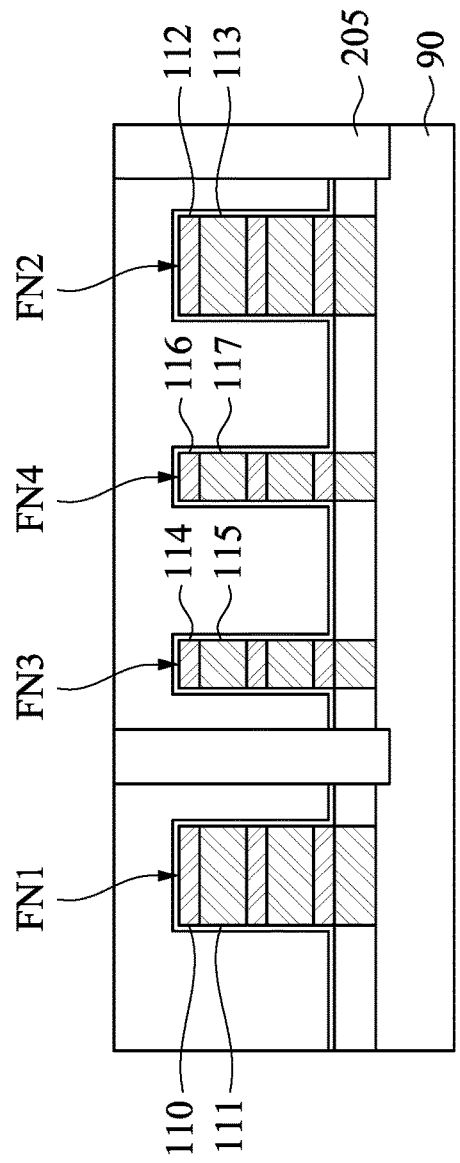
Figure 6D:
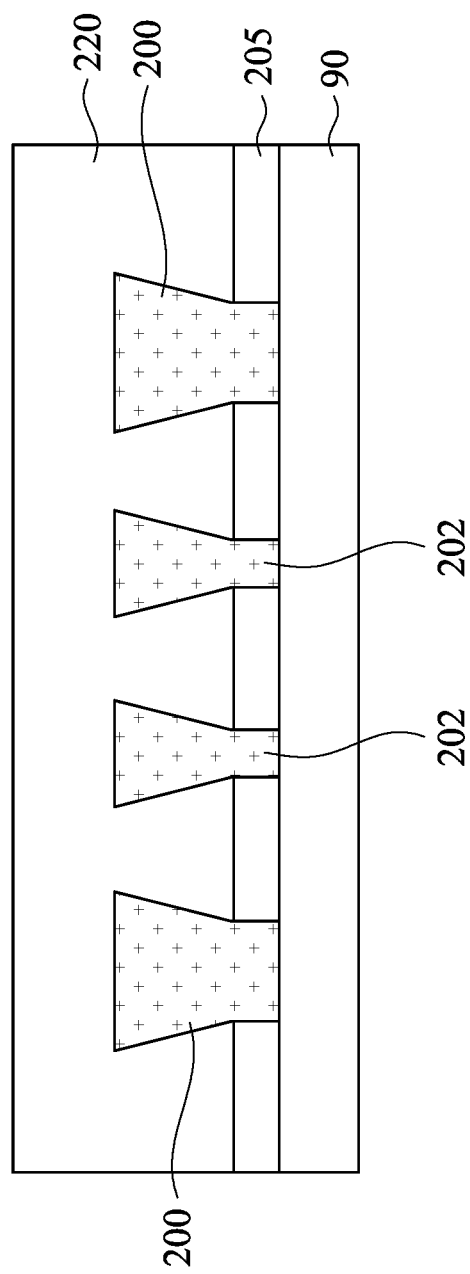
Figure 6F:
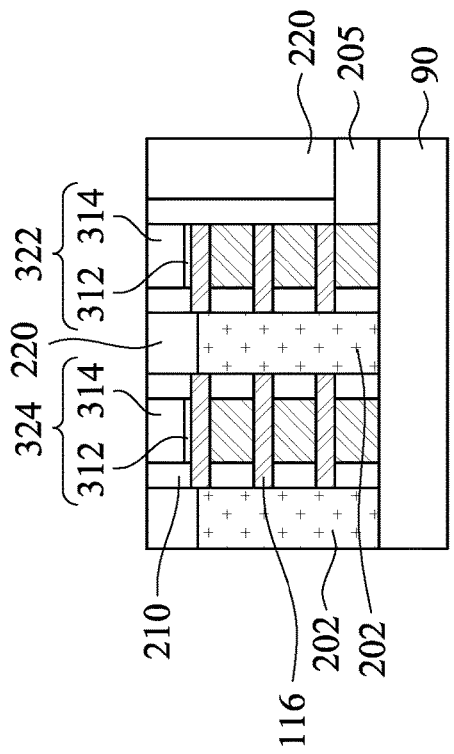
Figure 6E:
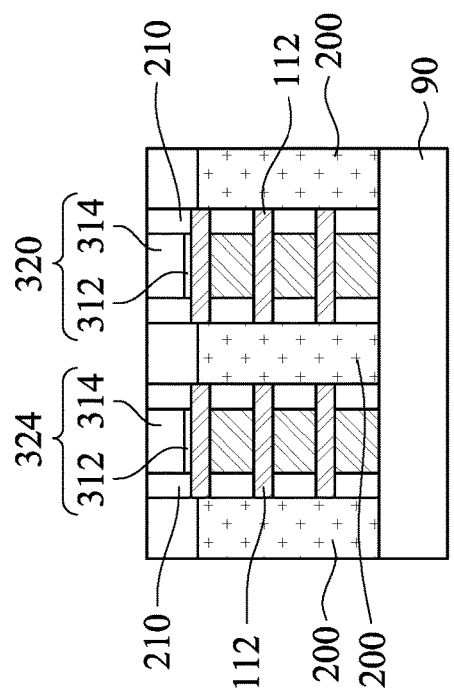
Figure 6G:
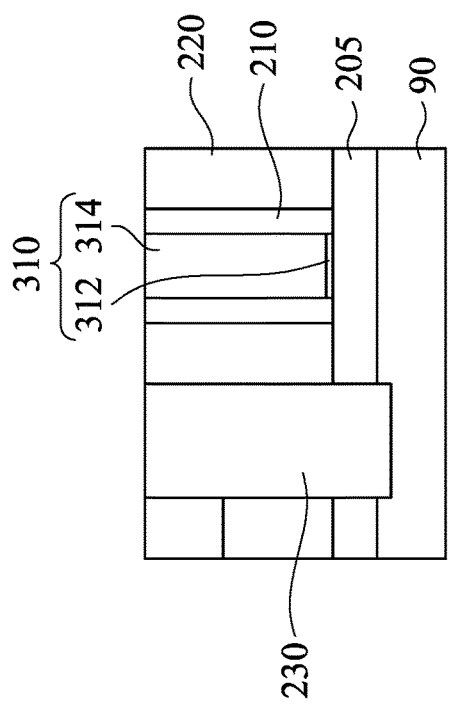
Figure 7A:
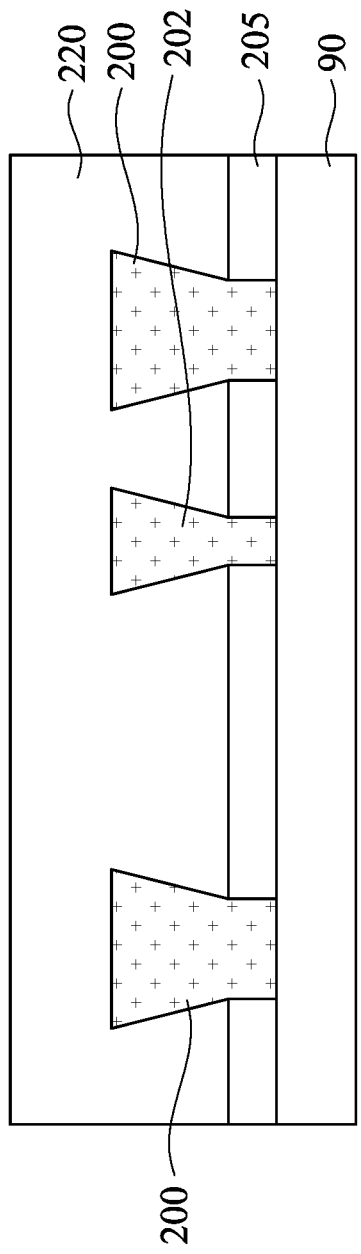
Figure 7B:
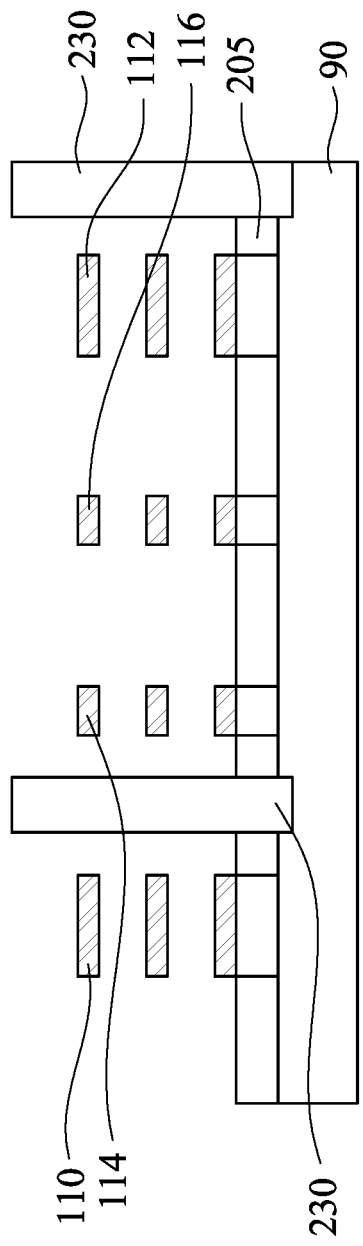
Figure 7C:
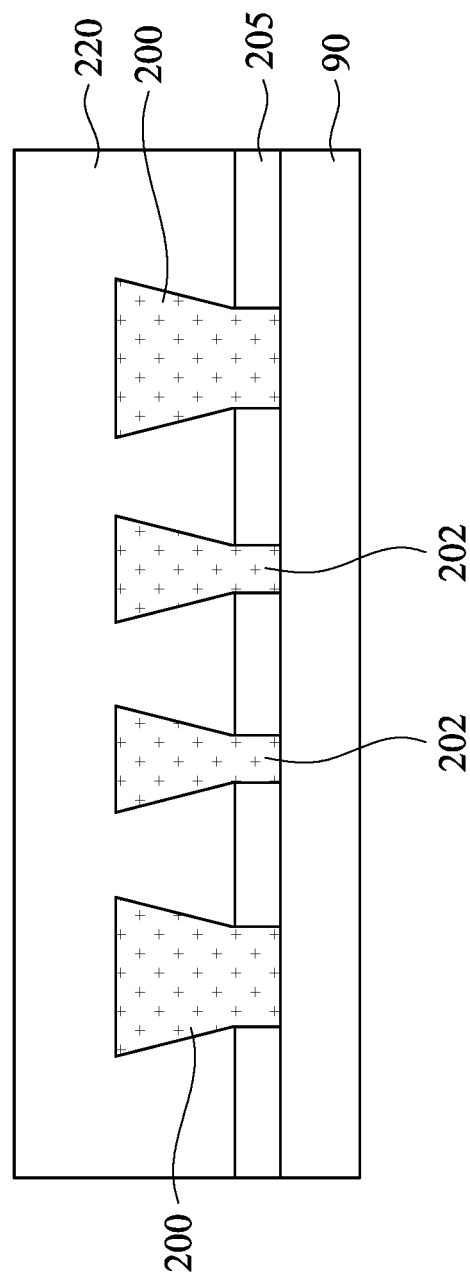
Figure 7E:
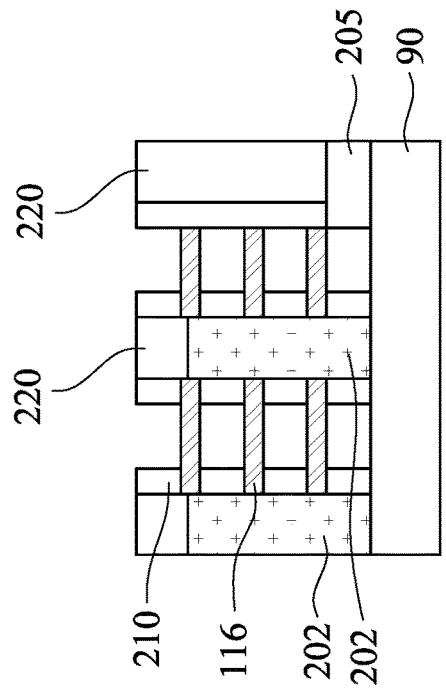
Figure 7D:
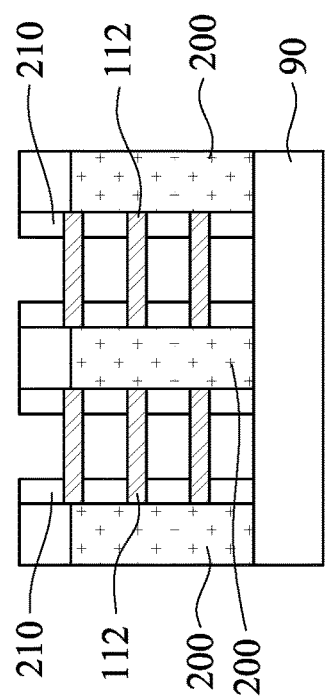
Figure 7F:
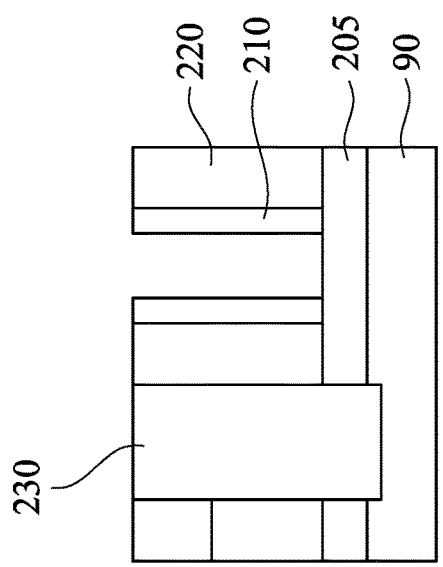
Figure 8A:
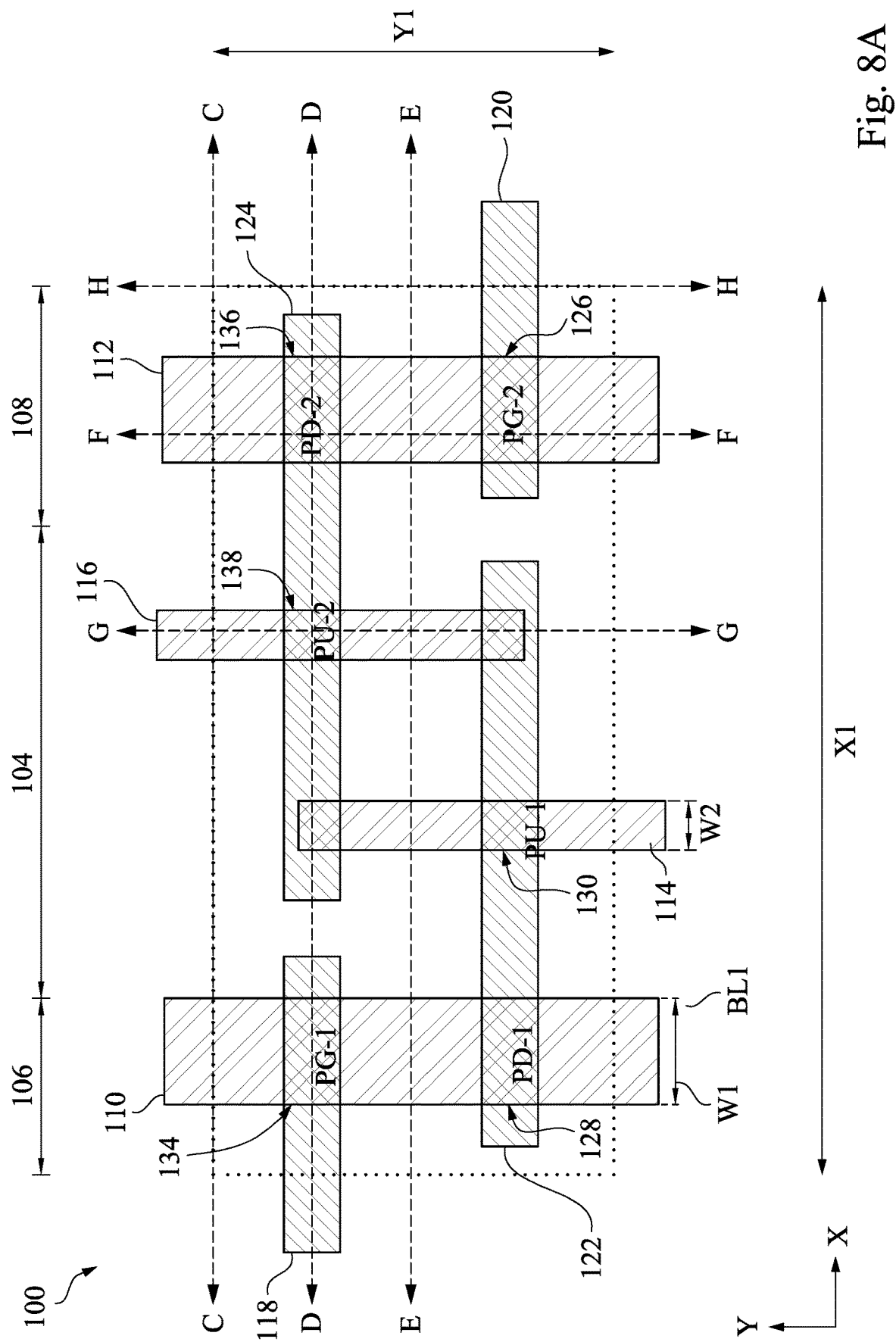
Figure 8B:
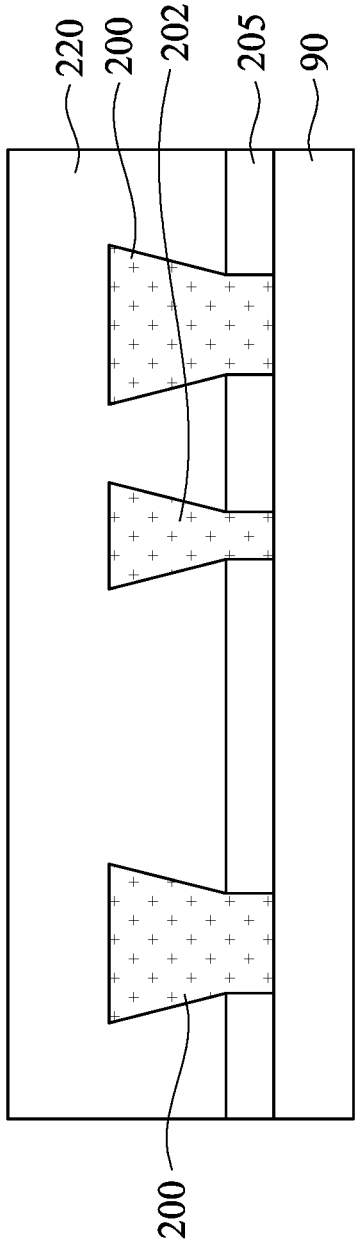
Figure 8C:
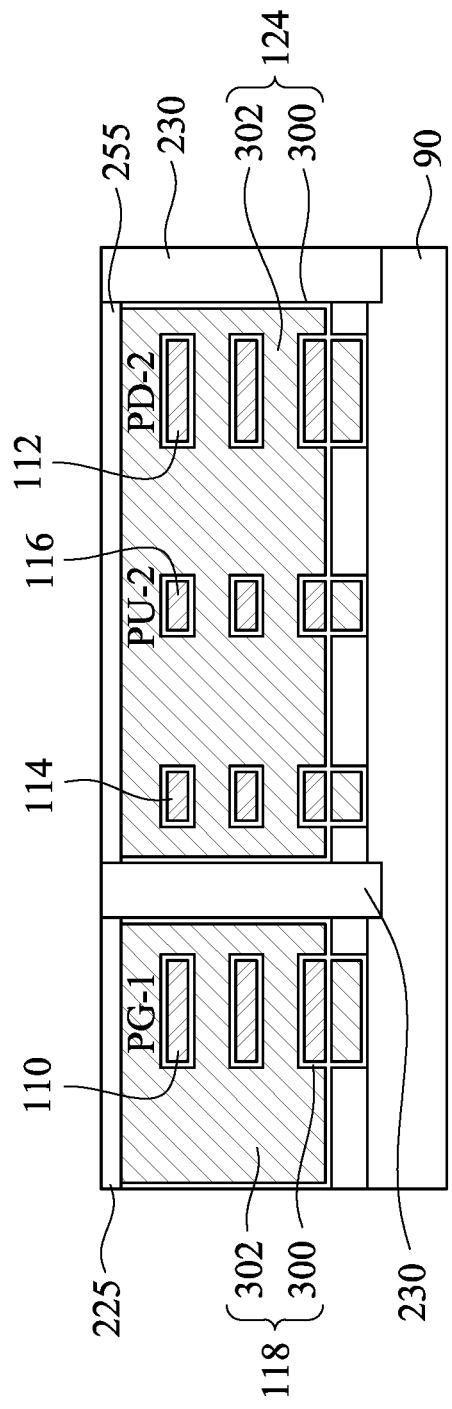
Figure 8D:
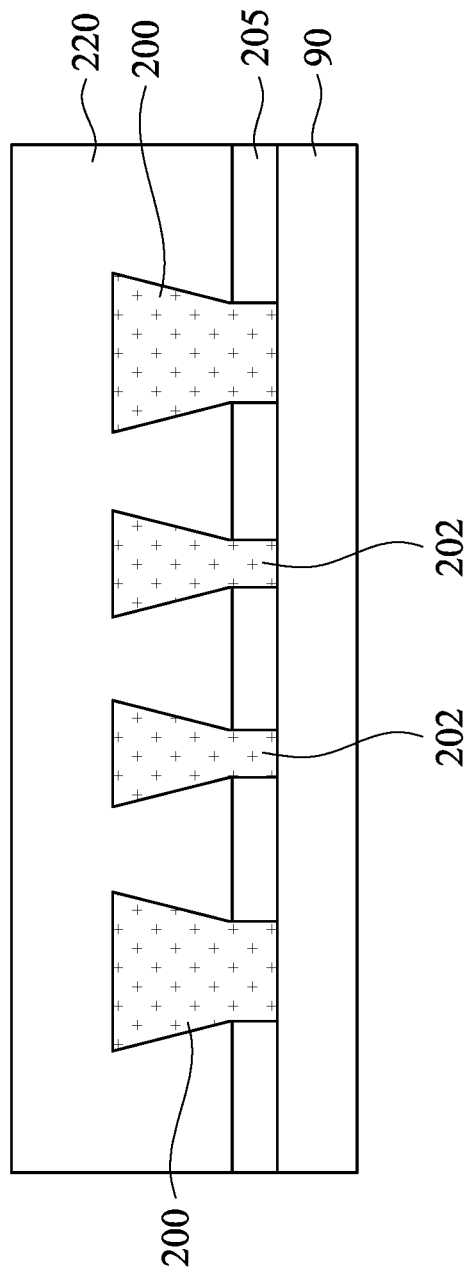

Reference is made to FIGS. 6A to 6G, in which FIG. 6A is a cell array layout diagram of an SRAM device on a front side of a semiconductor structure, FIGS. 6B, 6C, 6D, 6E, 6F, and 6G are cross-sectional views along lines C-C, D-D, E-E, F-F, G-G, and H-H of FIG. 6A. Gate-end dielectric layers 230 are formed, such that the dummy gate structures 310 are divided into separated dummy gate structures 318, 320, 322, and 324, respectively. In some embodiments where a replacement gate process is performed, the dummy gate structures 318, 320, 322, and 324 will be replaced by respective metal gate structures (e.g., the gate structures 118, 120, 122, and 124 in FIGS. 8A to 8G). In some embodiments, the gate-end dielectric layers 230 may be formed by, for example, patterning the dummy gate structures 310 and the ILD layer 220 to form openings, depositing a dielectric material in the openings, and then performing a planarization process (e.g., a CMP process) to remove excess dielectric material until top surfaces of the dummy gate structures 310 and the ILD layer 220 are exposed.

Reference is made to FIGS. 7A to 7F, in which FIGS. 7A to 7F follow the cross-sectional views of FIGS. 6B to 6G, respectively. The dummy gate structures 318, 320, 322, and 324 are removed to form gate trenches. In some embodiments, the dummy gate structures 318, 320, 322, and 324 may be removed by suitable etching process, such as dry etch, wet etch, or combinations thereof.

Next, the semiconductor layers 111, 113, 115, and 117 are removed through the gate trenches, such that portions of the semiconductor layers 110, 112, 114, and 116 are suspended over the substrate 90. The semiconductor layers 111, 113, 115, and 117 may be removed by performing an isotropic etching process such as wet etching or the like using etchants which are selective to the materials of the semiconductor layers 111, 113, 115, and 117, while the semiconductor layers 110, 112, 114, and 116 remain relatively un-etched as compared to the semiconductor layers 111, 113, 115, and 117. In embodiments where the semiconductor layers 111, 113, 115, and 117 include, e.g., SiGe, and the semiconductor layers 110, 112, 114, and 116 include, e.g., Si, tetramethylammonium hydroxide (TMAH), ammonium hydroxide ($NH_4OH$), or the like may be used to remove the semiconductor layers 111, 113, 115, and 117.

Reference is made to FIGS. 8A to 8G, in which FIGS. 8A to 8G follow the cross-sectional views of FIGS. 7A to 7F, respectively. Gate structures 118, 120, 122, and 124 are formed in the gate trenches and wrapping around each of the semiconductor layers 110, 112, 114, and 116. In some embodiments, a gate dielectric 300 is conformally deposited over the substrate 90 and wrapping around each of the semiconductor layers 110, 112, 114, and 116, and then a gate electrode 302 is deposited over the gate dielectric 300 and overfilling the gate trenches. After the filling of the gate trenches, a planarization process, such as a CMP, may be performed to remove the excess portions of the gate dielectric 300 and the material of the gate electrode 302, which excess portions are over the top surface of the ILD layer 220. The remaining portions of material of the gate dielectric 300 and the gate electrode 302 thus form replacement gate structures 118, 120, 122, and 124.

Figure 9A:
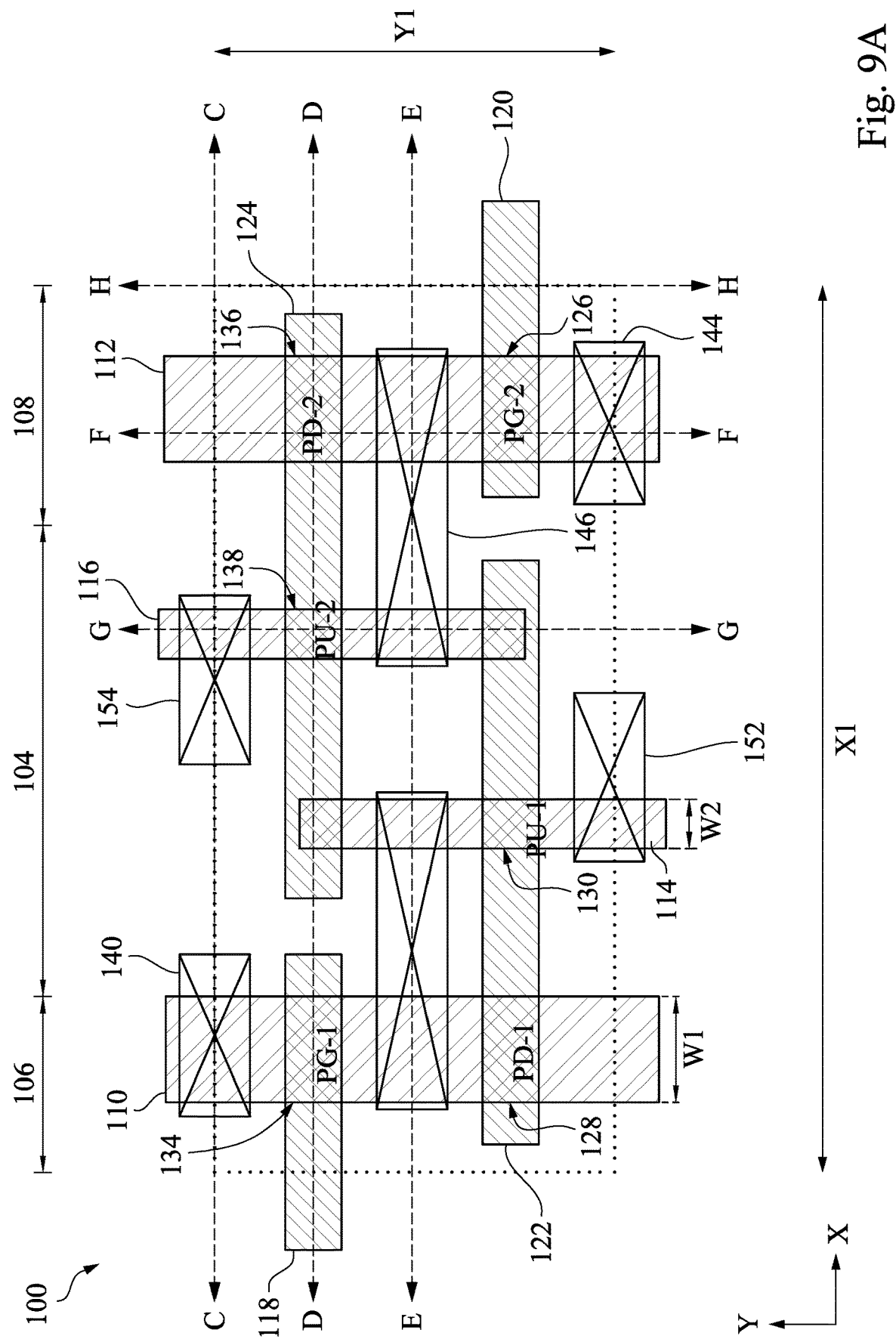
Figure 9B:
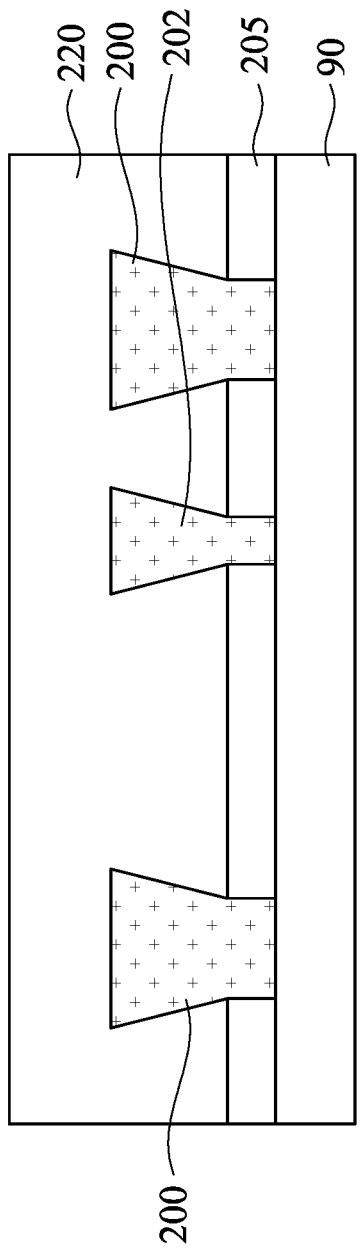
Figure 9C:
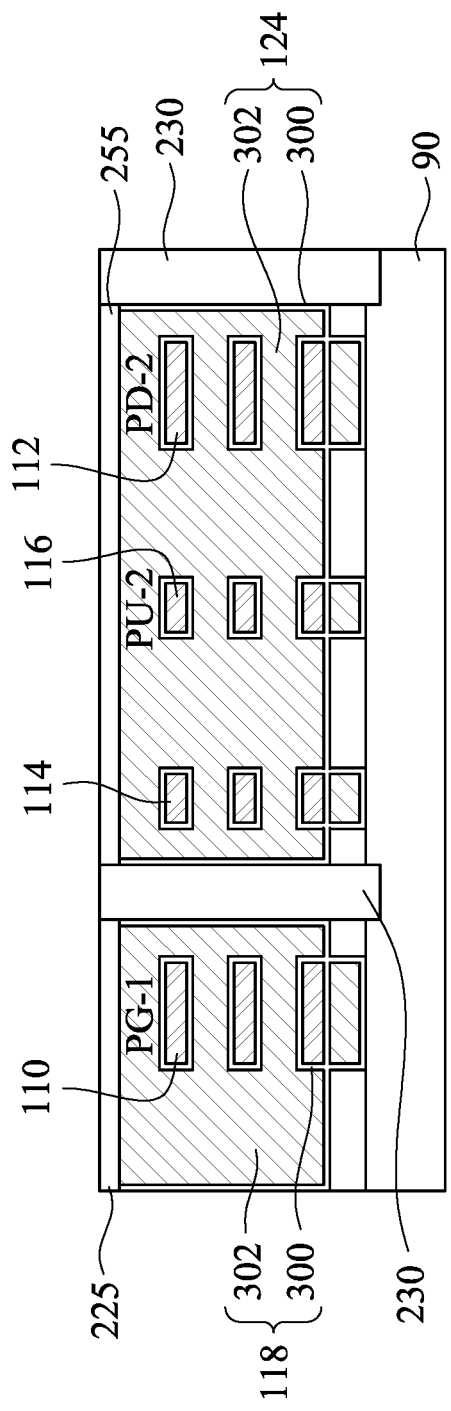
Figure 9D:
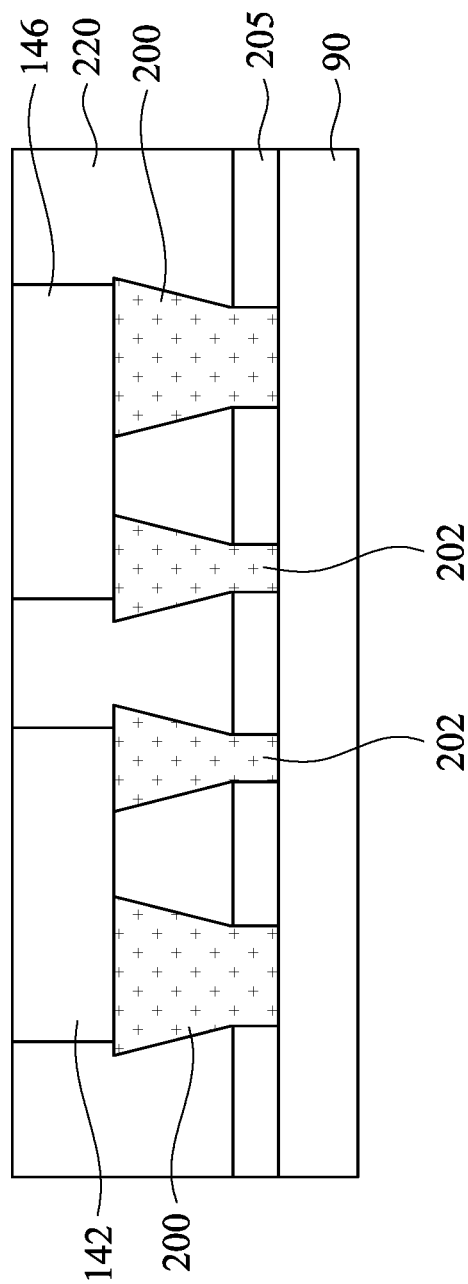
Figure 9F:
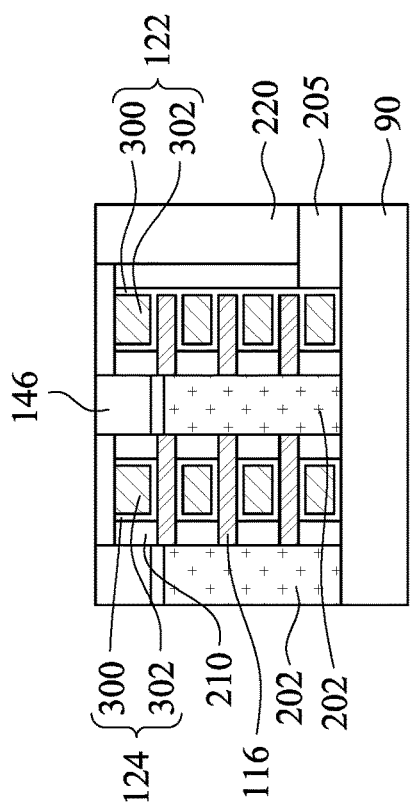
Figure 9E:
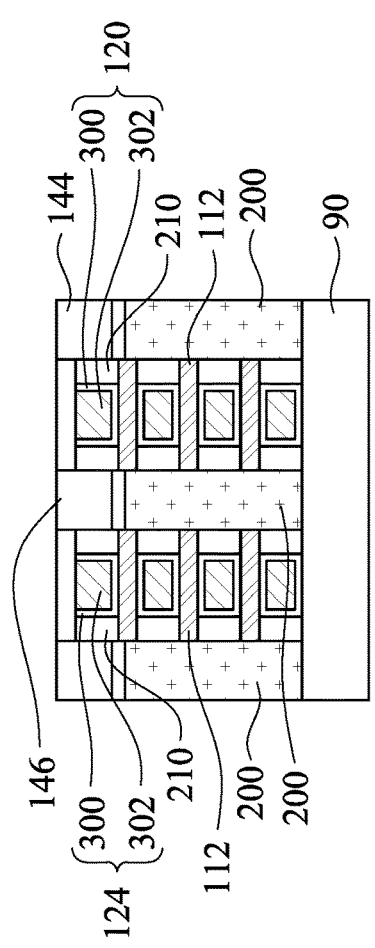
Figure 9G:
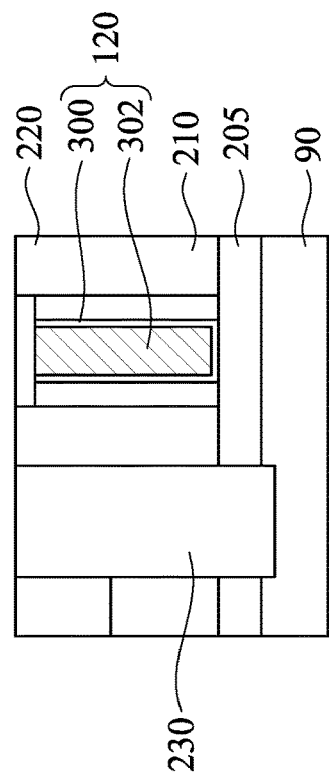

Reference is made to FIGS. 9A to 9G, in which FIG. 9A is a cell array layout diagram of an SRAM device on a front side of a semiconductor structure, FIGS. 9B, 9C, 9D, 9E, 9F, and 9G are cross-sectional views along lines C-C, D-D, E-E, F-F, G-G, and H-H of FIG. 9A. Gate-top dielectric layers 225 are formed over the gate structures 118, 120, 122, and 124. In some embodiments, the gate-top dielectric layers 225 may be formed by, for example, etching back the gate structures 118, 120, 122, and 124 and the gate spacers 210 such that top surfaces of the gate structures 118, 120, 122, and 124 and the gate spacers 210 are lower than top surface of the ILD layer 220 and the gate-end dielectric layers 230, depositing a dielectric material over the gate structures 118, 120, 122, and 124, and then performing a planarization process (e.g., a CMP process) to remove excess dielectric material until top surfaces of the ILD layer 220 and the gate-end dielectric layers 230 are exposed.

Then, source/drain contacts 140, 142, 144, 146, 152, and 154 are formed. In some embodiments, the source/drain contacts 140, 142, 144, 146, 152, and 154 may be formed by, for example, patterning the ILD layer 220 to form openings exposing the source/drain epitaxy structures 200 and 202, depositing a contact material in the openings, and then performing a planarization process (e.g., a CMP process) to remove excess contact material until top surfaces of the ILD layer 220 and the gate-end dielectric layers 230 are exposed.

Figure 10A:
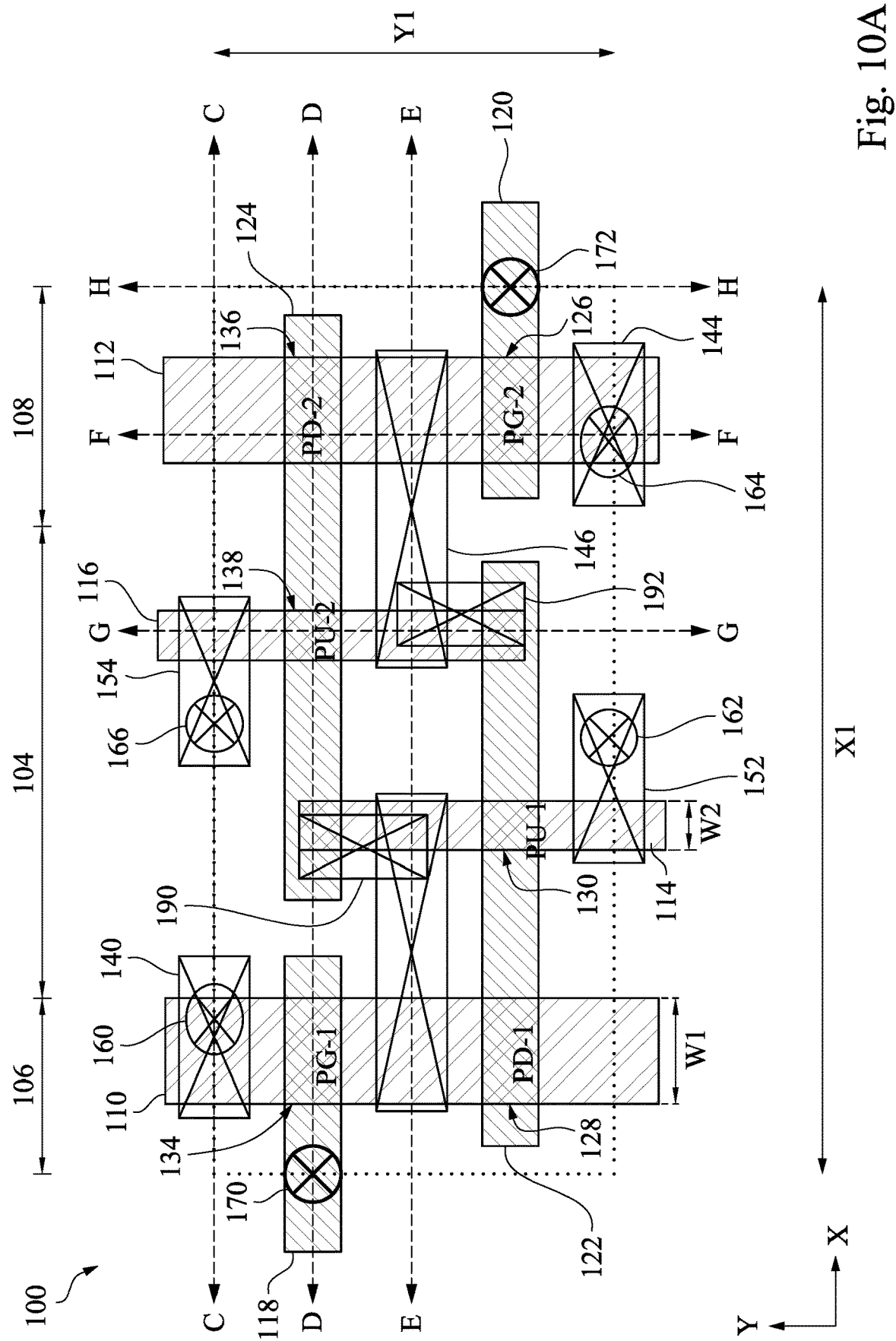
Figure 10B:
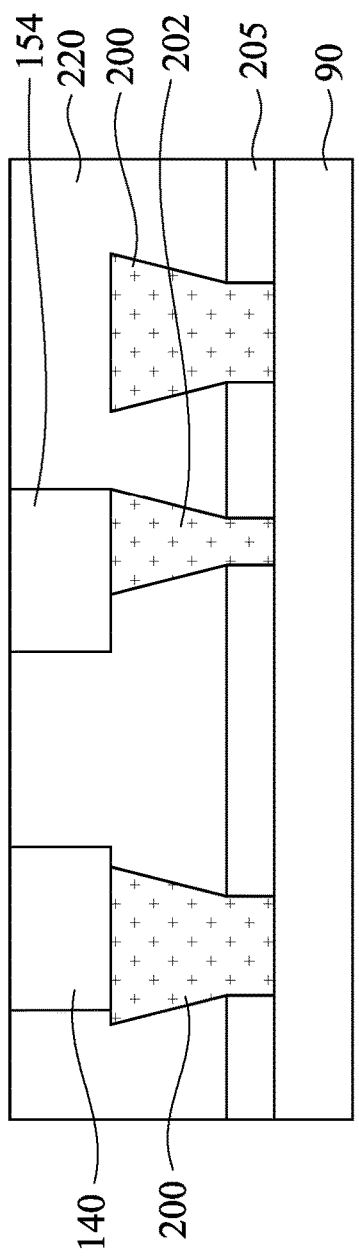
Figure 10C:
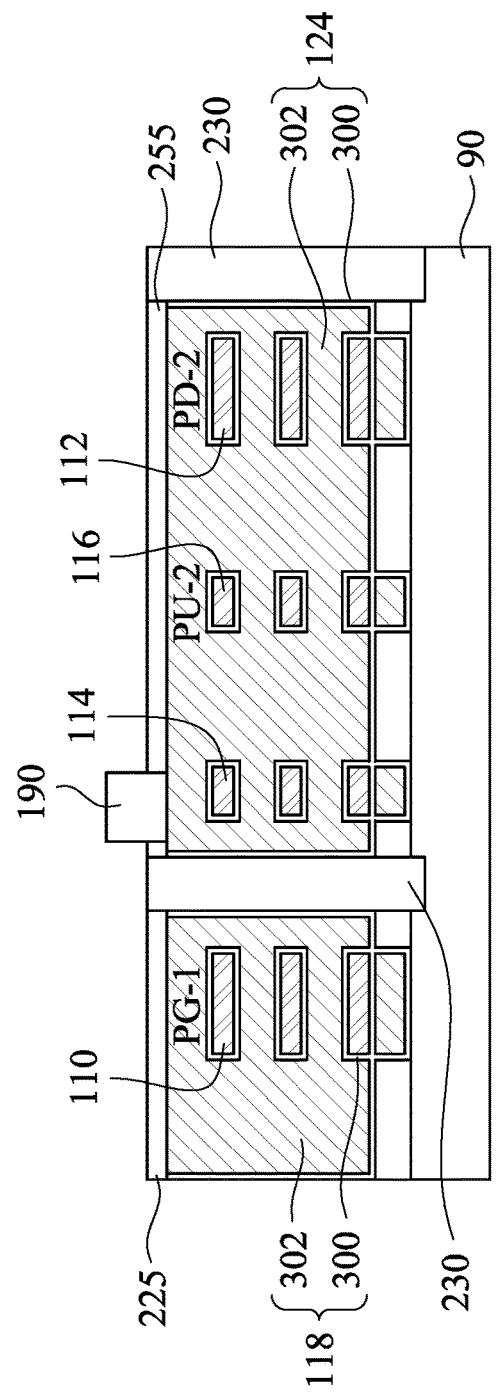
Figure 10D:
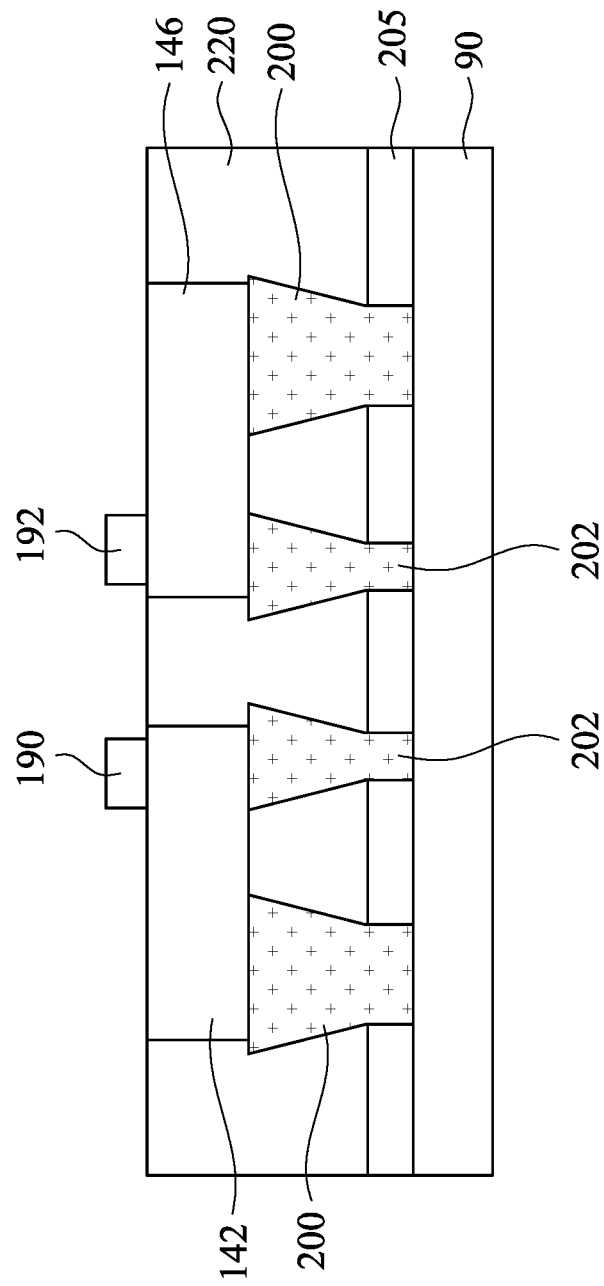
Figure 10F:
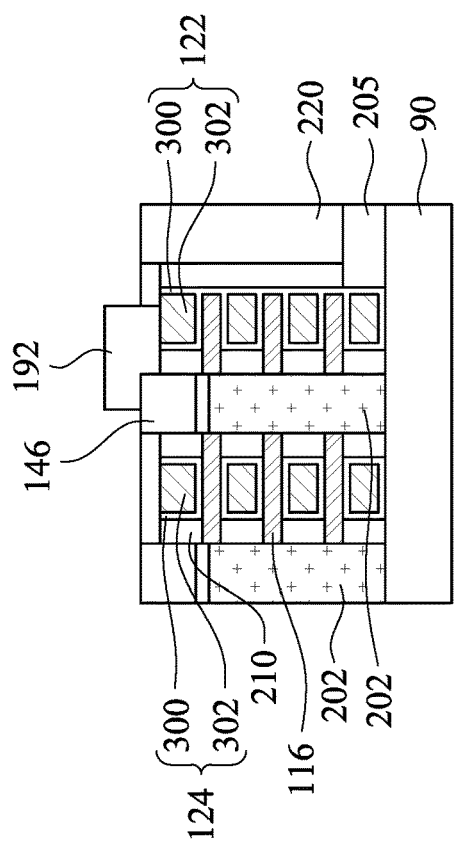
Figure 10E:
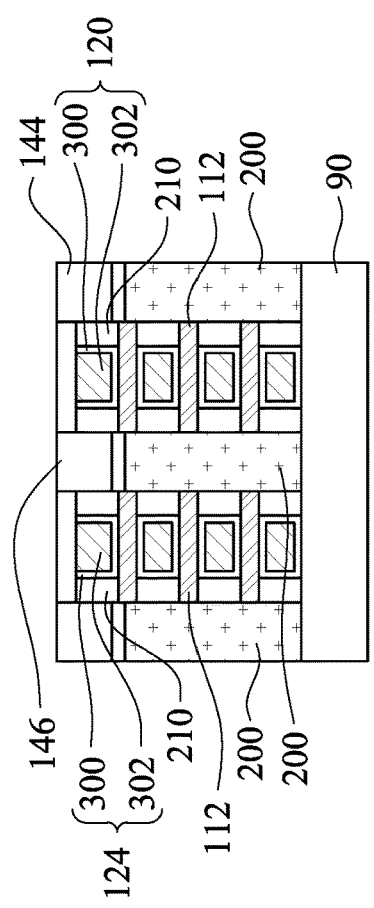
Figure 10G:
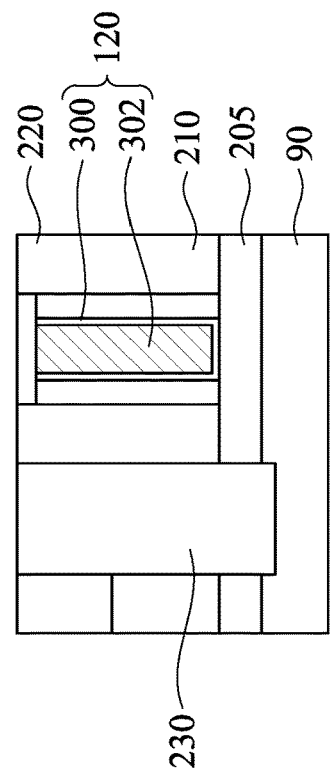

Reference is made to FIGS. 10A to 10G, in which FIG. 10A is a cell array layout diagram of an SRAM device on a front side of a semiconductor structure, FIGS. 10B, 10C, 10D, 10E, 10F, and 10G are cross-sectional views along lines C-C, D-D, E-E, F-F, G-G, and H-H of FIG. 10A. Contacts 190 and 192 are formed. In some embodiments, the contacts 190 and 192 may be formed by, for example, patterning the gate-top dielectric layers 225 to expose portions of the gate structures 122 and 124, depositing a contact material over the exposed portions of the gate structures 122 and 124 and in contact with the source/drain epitaxy structures 200 and 202, and then patterning the contact material according to a predetermined pattern.

Figure 11A:
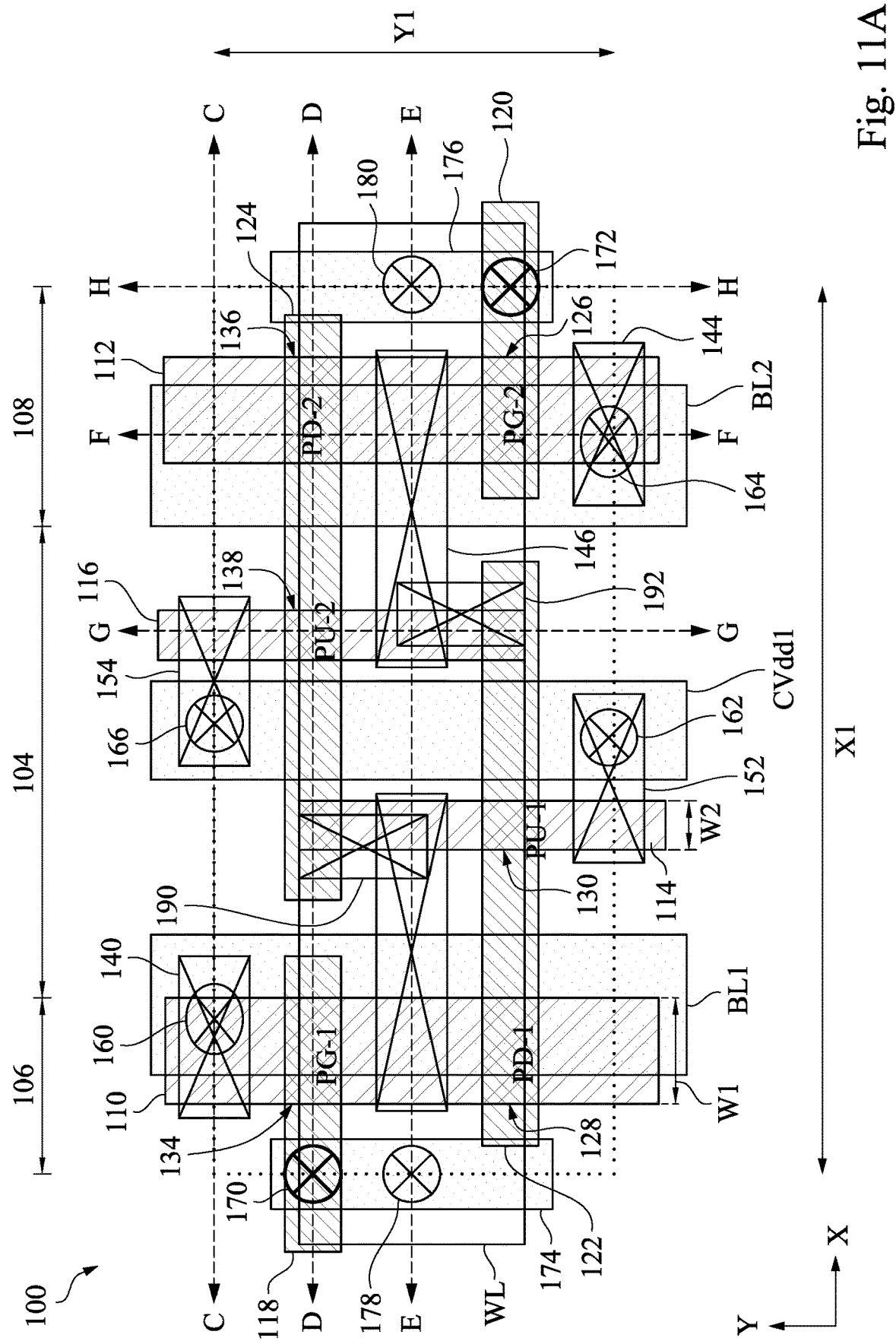
Figure 11B:
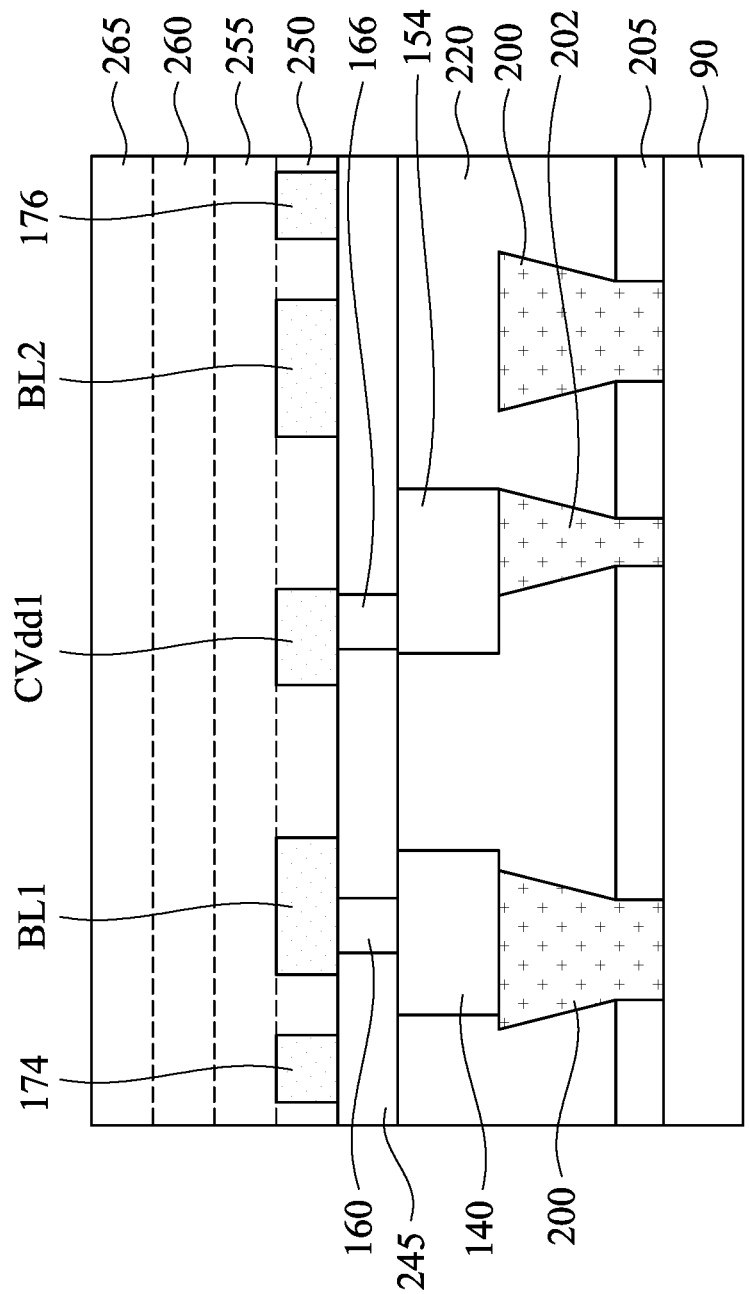
Figure 11C:
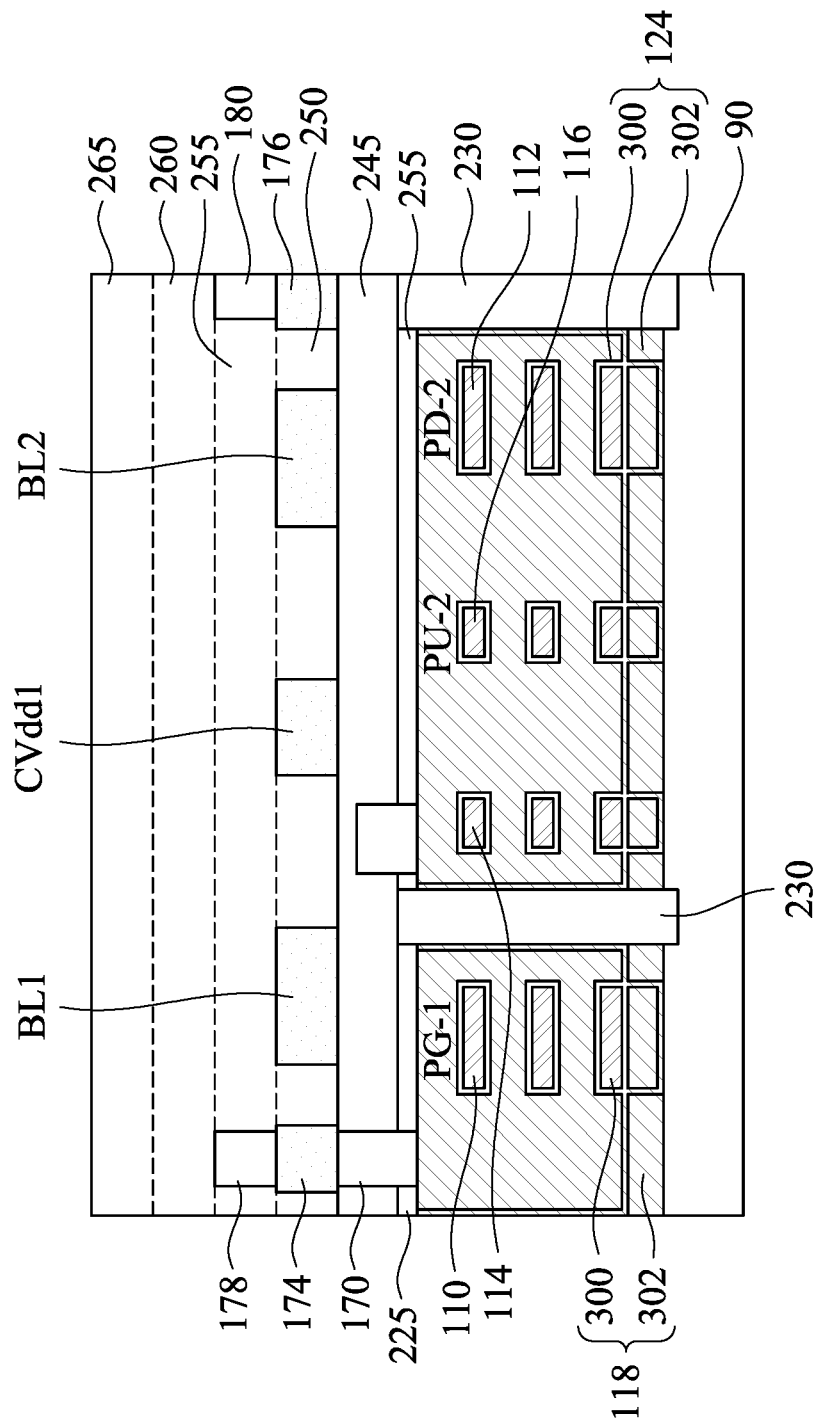
Figure 11D:
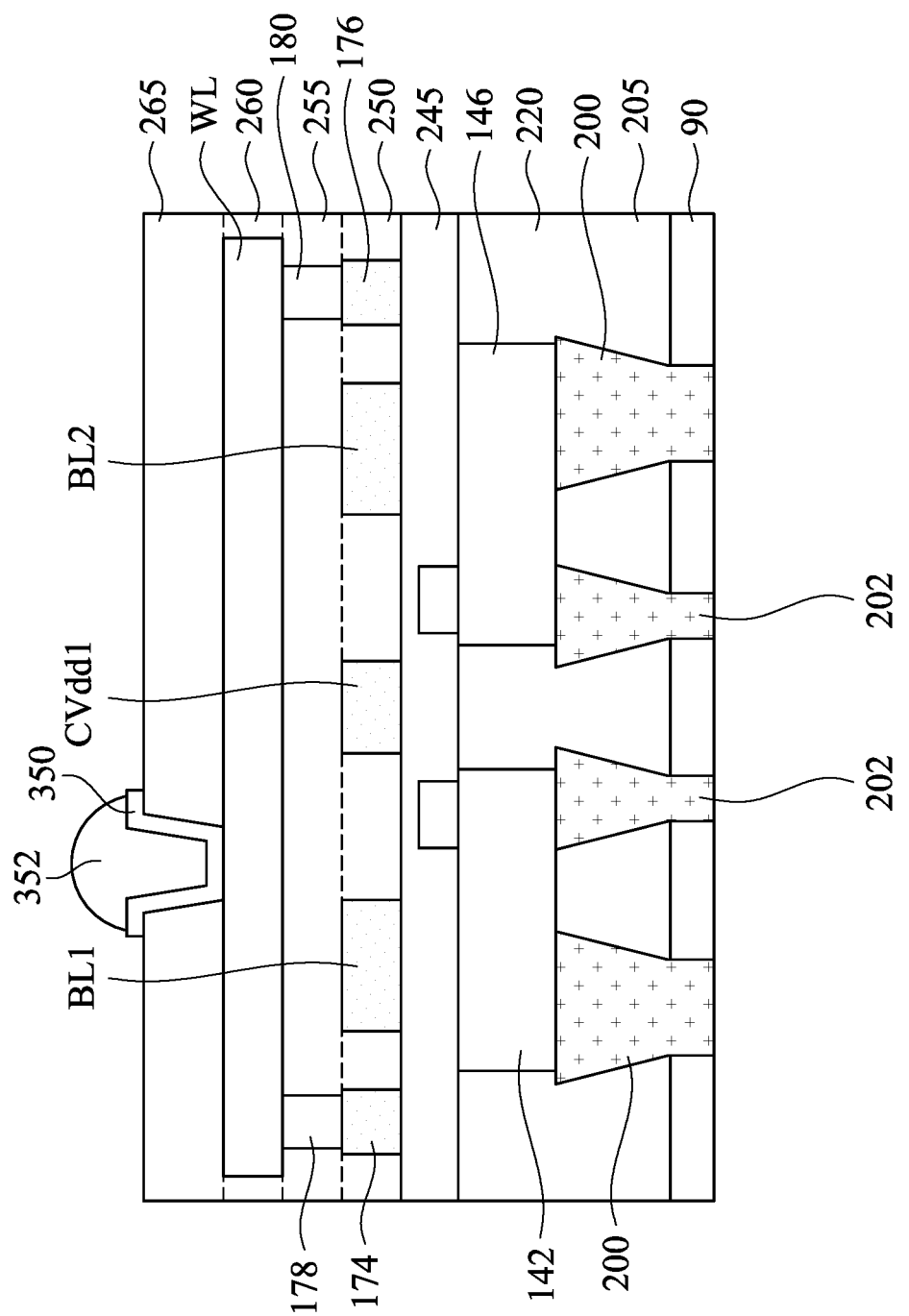
Figures 11E, 11F:
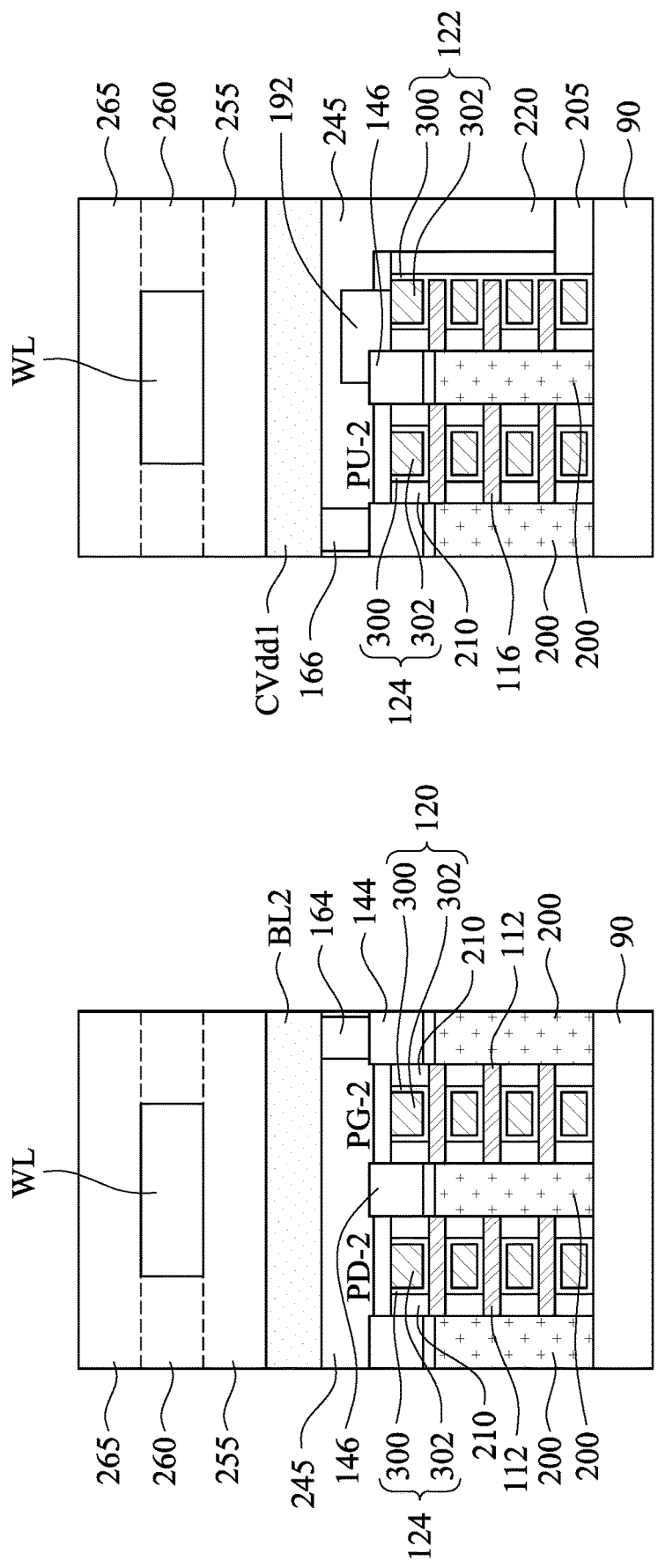
Figure 11G:
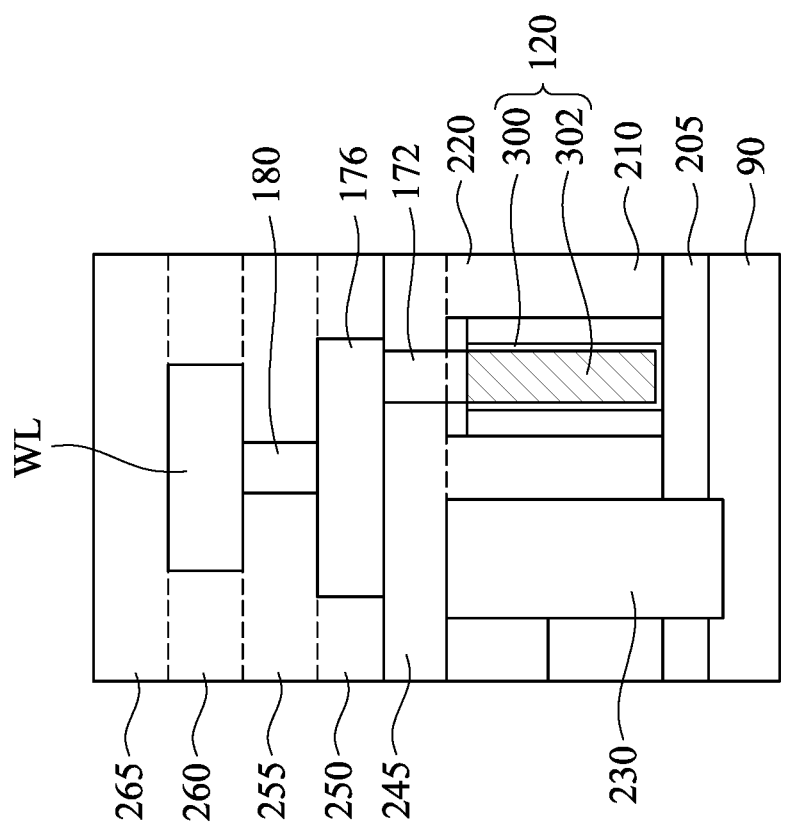
Figure 12A:
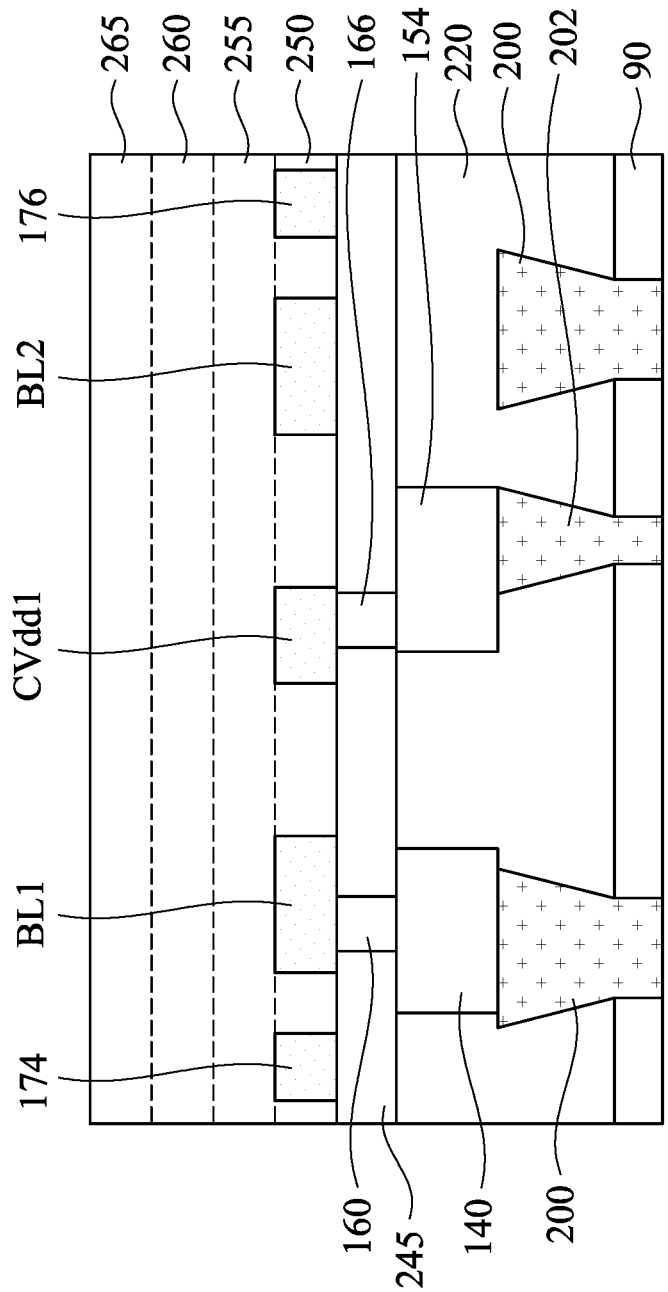
Figure 12B:
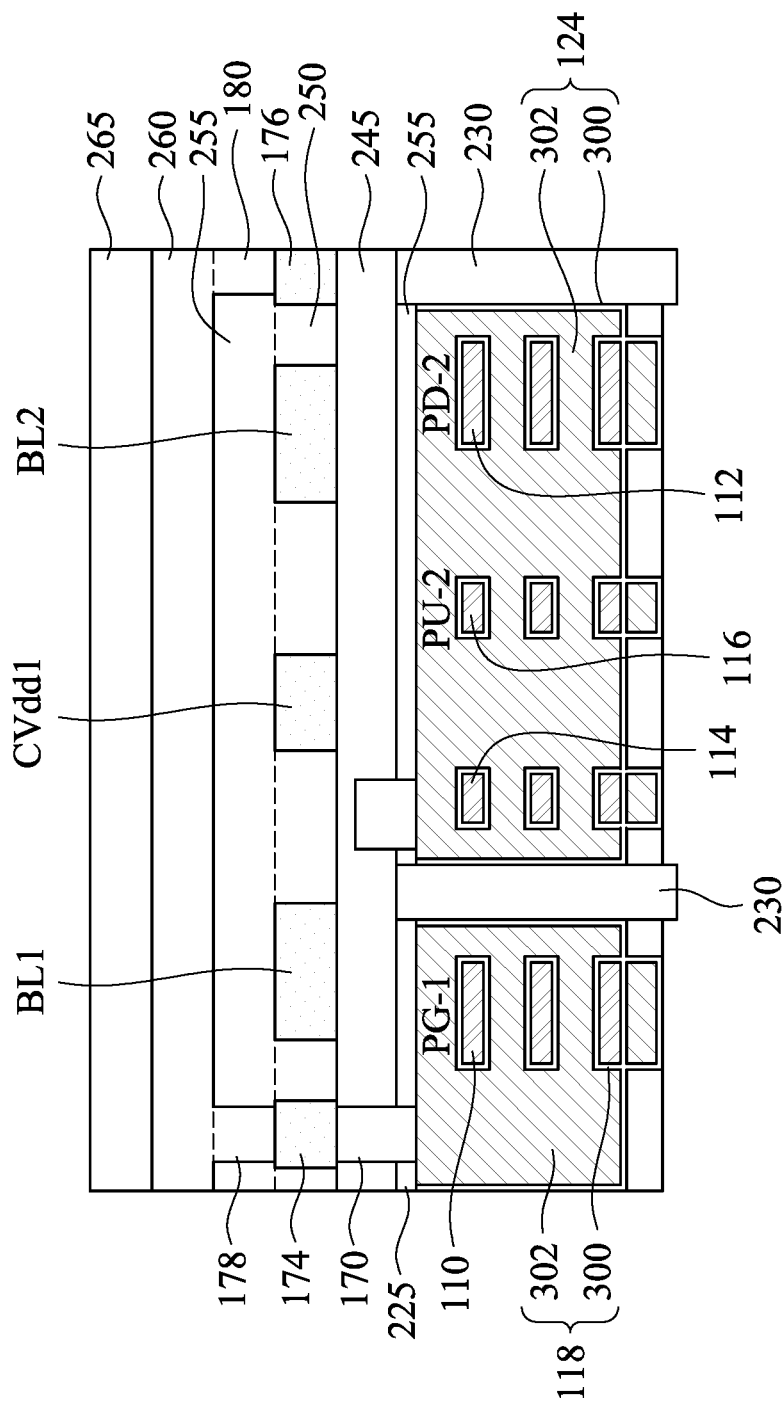
Figure 12C:
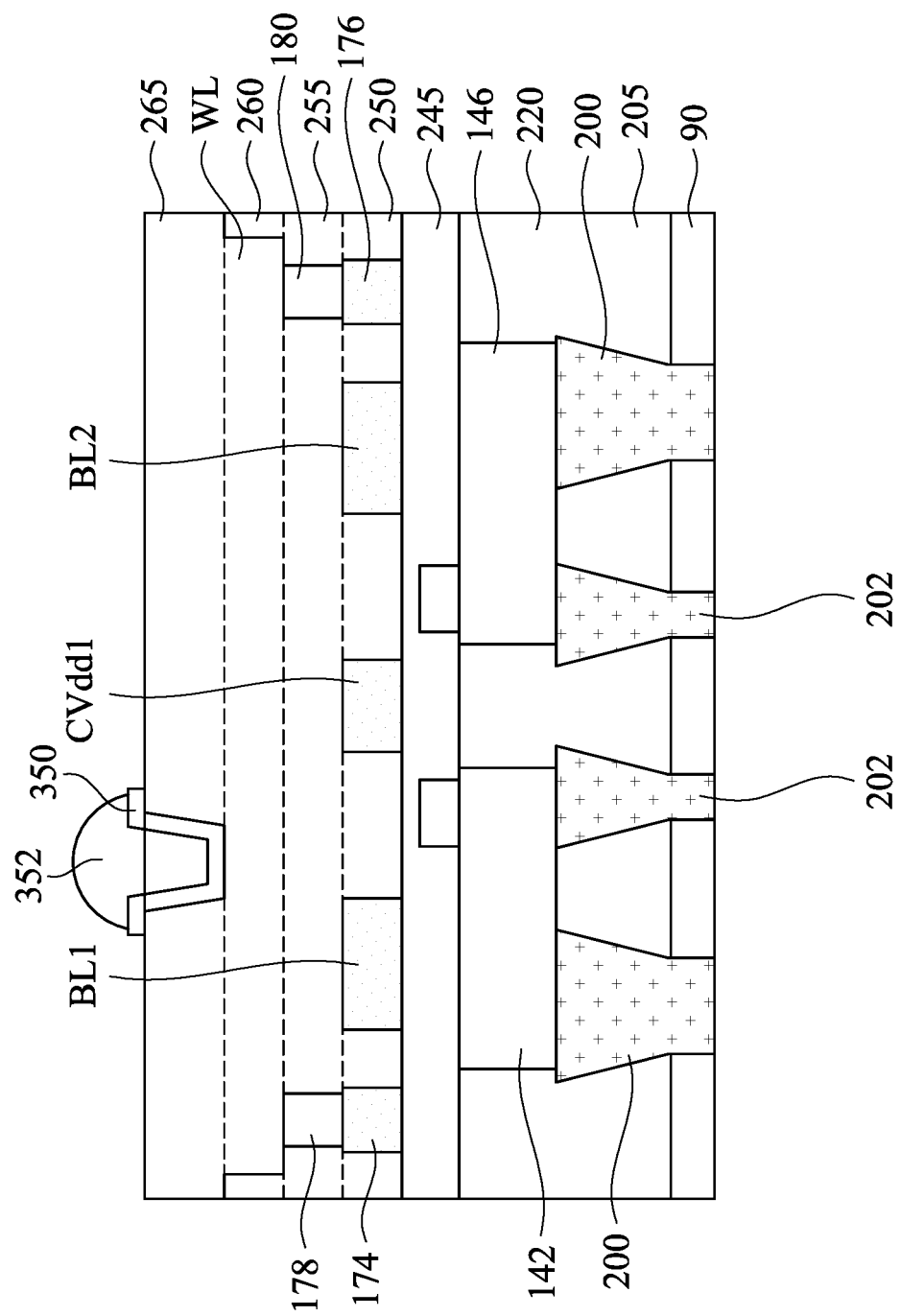
Figure 12D:
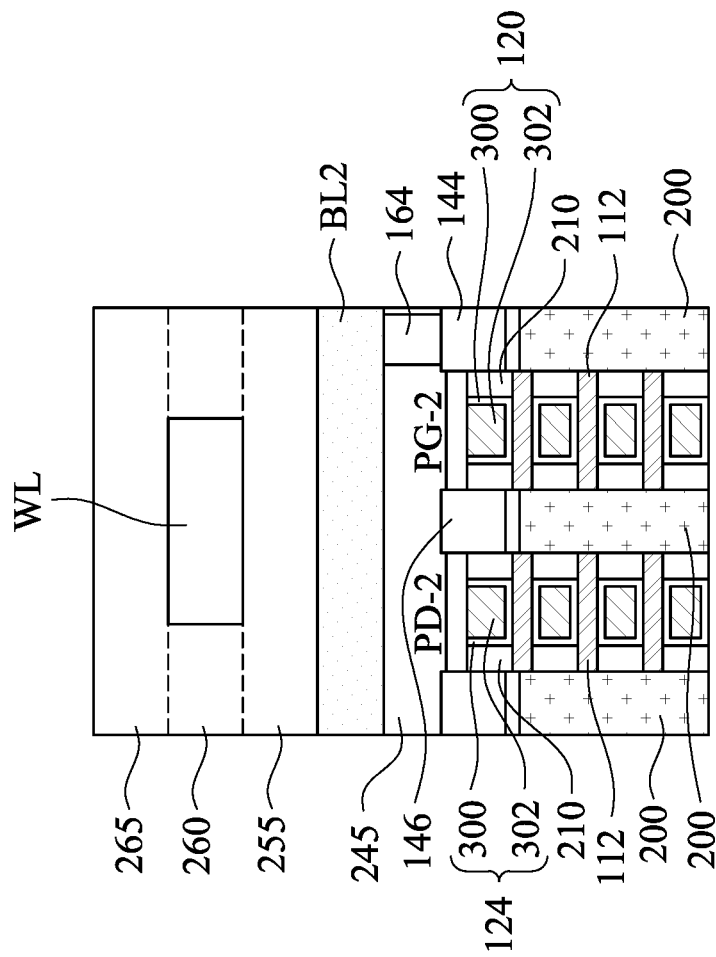
Figure 12F:
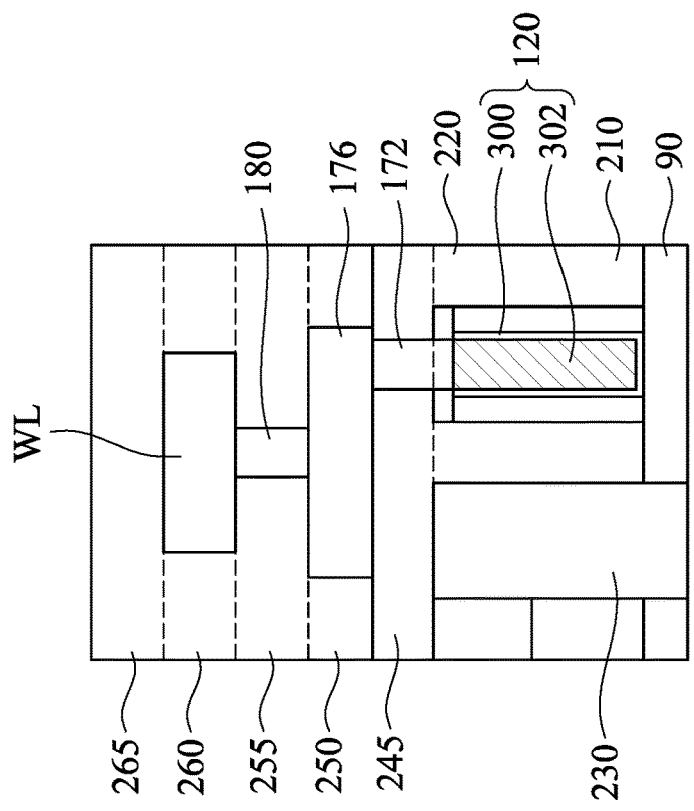
Figure 12E:
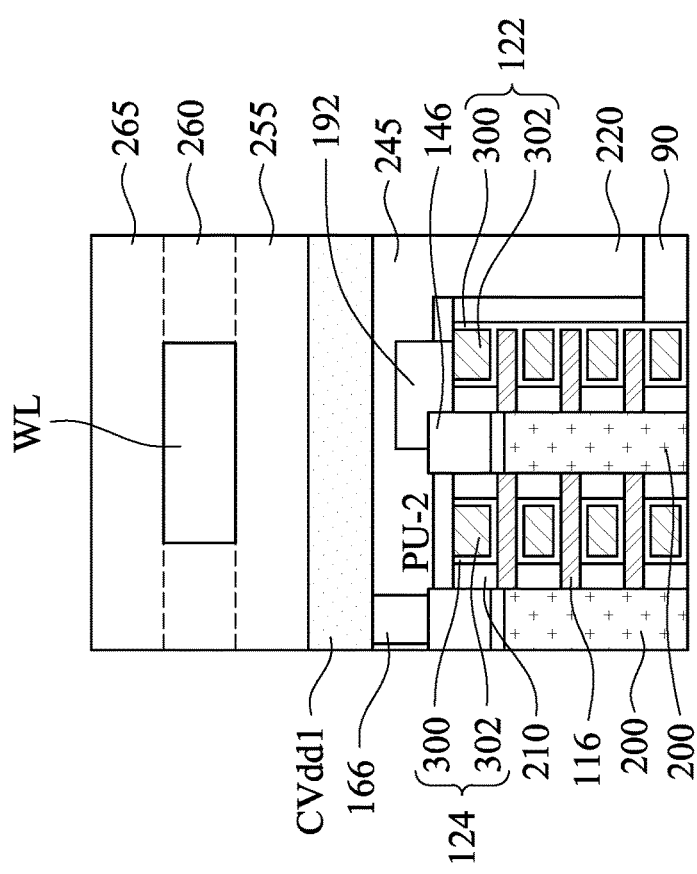

Reference is made to FIGS. 11A to 11G, in which FIG. 11A is a cell array layout diagram of an SRAM device on a front side of a semiconductor structure, FIGS. 11B, 11C, 11D, 11E, 11F, and 11G are cross-sectional views along lines C-C, D-D, E-E, F-F, G-G, and H-H of FIG. 11A. An interlayer dielectric (ILD) layer 245 is deposited over the ILD layer 220 and covering the underlying structure. Then, source/drain vias 160, 162, 164, and 166, and gate vias 170 and 172 are formed in the ILD layer 245. In some embodiments, the source/drain vias 160, 162, 164, and 166, and gate vias 170 and 172 may be formed by, for example, patterning the ILD layer 245 to form openings, depositing via material in the openings, and then performing a planarization process (e.g., a CMP process) to remove excess via material until top surface of the ILD layer 245 is exposed.

An inter-metal dielectric (IMD) layer 250 is deposited over the ILD layer 245. Then, a bit line BL1, a bit line BL2, a power line Cvdd1, and metal lines 174 and 176 are formed in the IMD layer 250. In some embodiments, the bit line BL1, the bit line BL2, the power line Cvdd1, and the metal lines 174 and 176 may be formed by, for example, patterning the IMD layer 250 to form openings, depositing conductive material in the openings, and then performing a planarization process (e.g., a CMP process) to remove excess conductive material until top surface of the IMD layer 250 is exposed.

An inter-metal dielectric (IMD) layer 255 is deposited over the IMD layer 250. Then, metal vias 178 and 180 are formed in the IMD layer 255. In some embodiments, the metal vias 178 and 180 may be formed by, for example, patterning the IMD layer 255 to form openings, depositing conductive material in the openings, and then performing a planarization process (e.g., a CMP process) to remove excess conductive material until top surface of the IMD layer 255 is exposed.

An inter-metal dielectric (IMD) layer 260 is deposited over the IMD layer 255. Then, a word line WL is formed in the IMD layer 260. In some embodiments, the word line WL may be formed by, for example, patterning the IMD layer 260 to form an opening, depositing conductive material in the opening, and then performing a planarization process (e.g., a CMP process) to remove excess conductive material until top surface of the IMD layer 255 is exposed. After the word line WL is formed, an inter-metal dielectric (IMD) layer 265 is deposited over the IMD layer 260 and covering the word line. An UBM pad 352 and an external connector 352 are then formed in the IMD layer 265.

Reference is made to FIGS. 12A to 12F, in which FIGS. 12A to 12F follow the cross-sectional views of FIGS. 11B to 11G, respectively. The substrate 90 (see FIGS. 11B to 11G) is removed to expose the isolation structures 205, the source/drain epitaxy structures 200 and 202, the gate structures 118, 120, 122, and 124, the gate-end dielectric layers 230. In some embodiments, although not shown, the structure shown in FIGS. 11B to 11G may be flipped over by 180 degrees, and then a grinding process may be performed on a backside of the substrate 90 until the substrate 90 is removed.

Figure 13A:
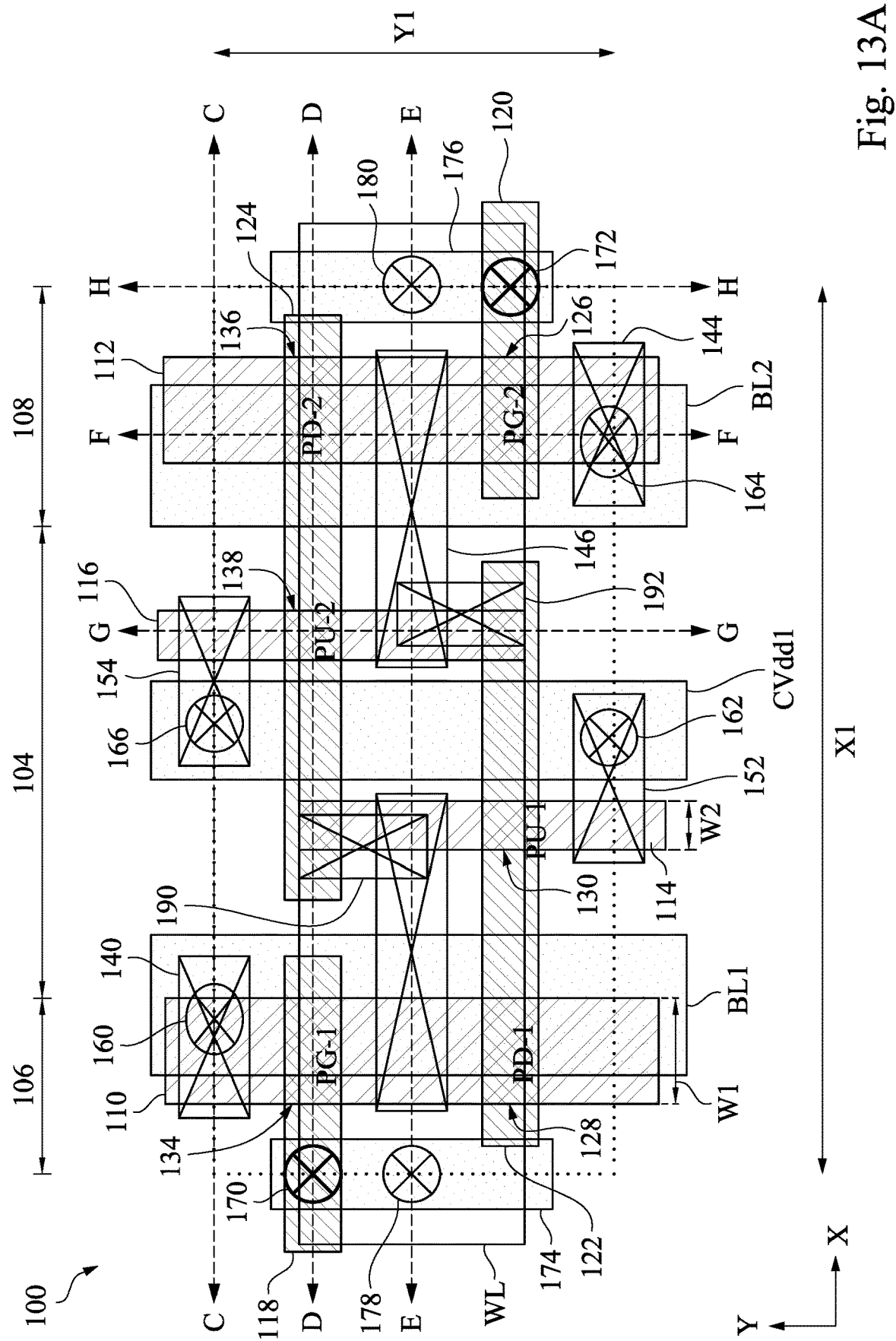
Figure 13B:
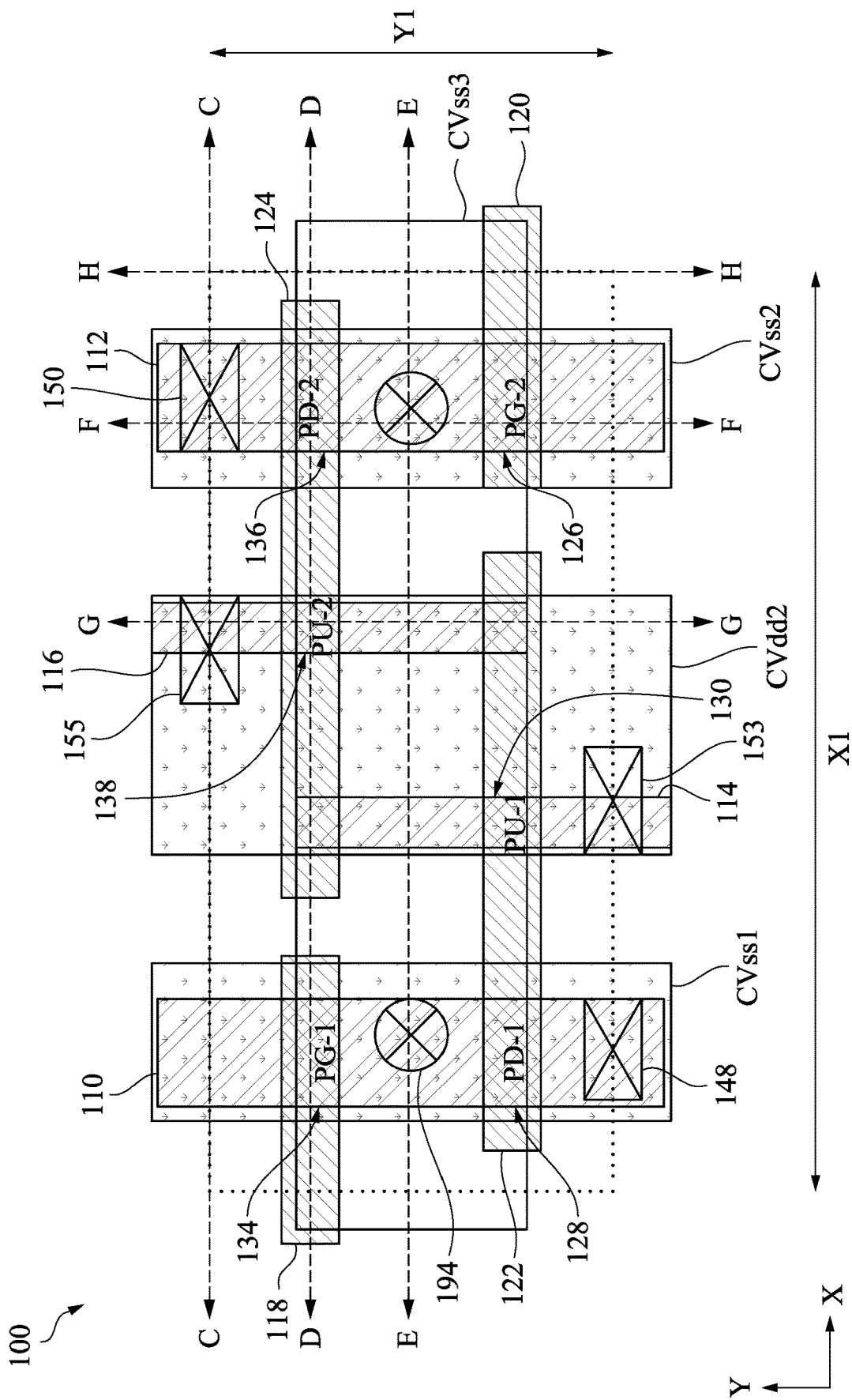
Figure 13C:
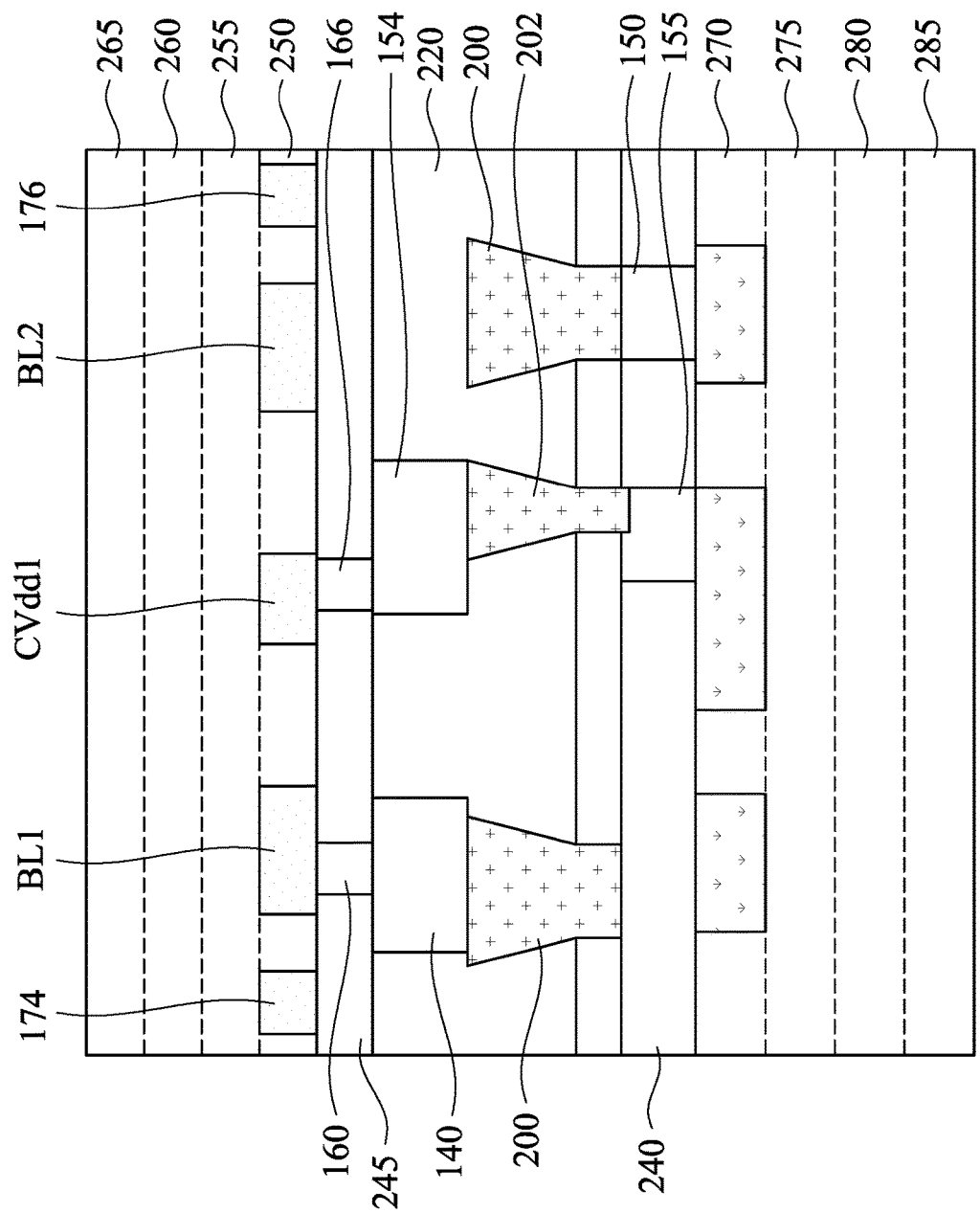
Figure 13D:
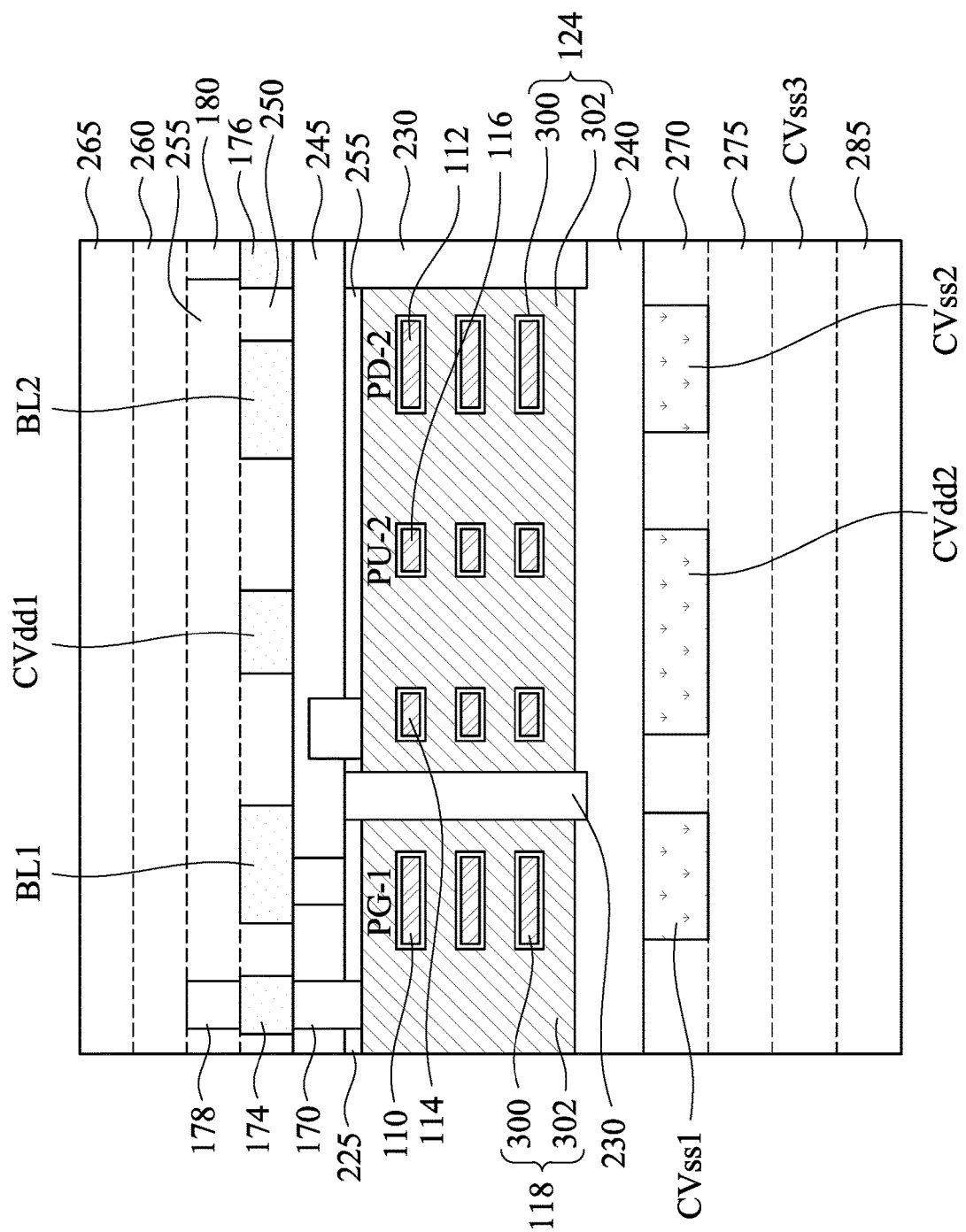
Figure 13E:
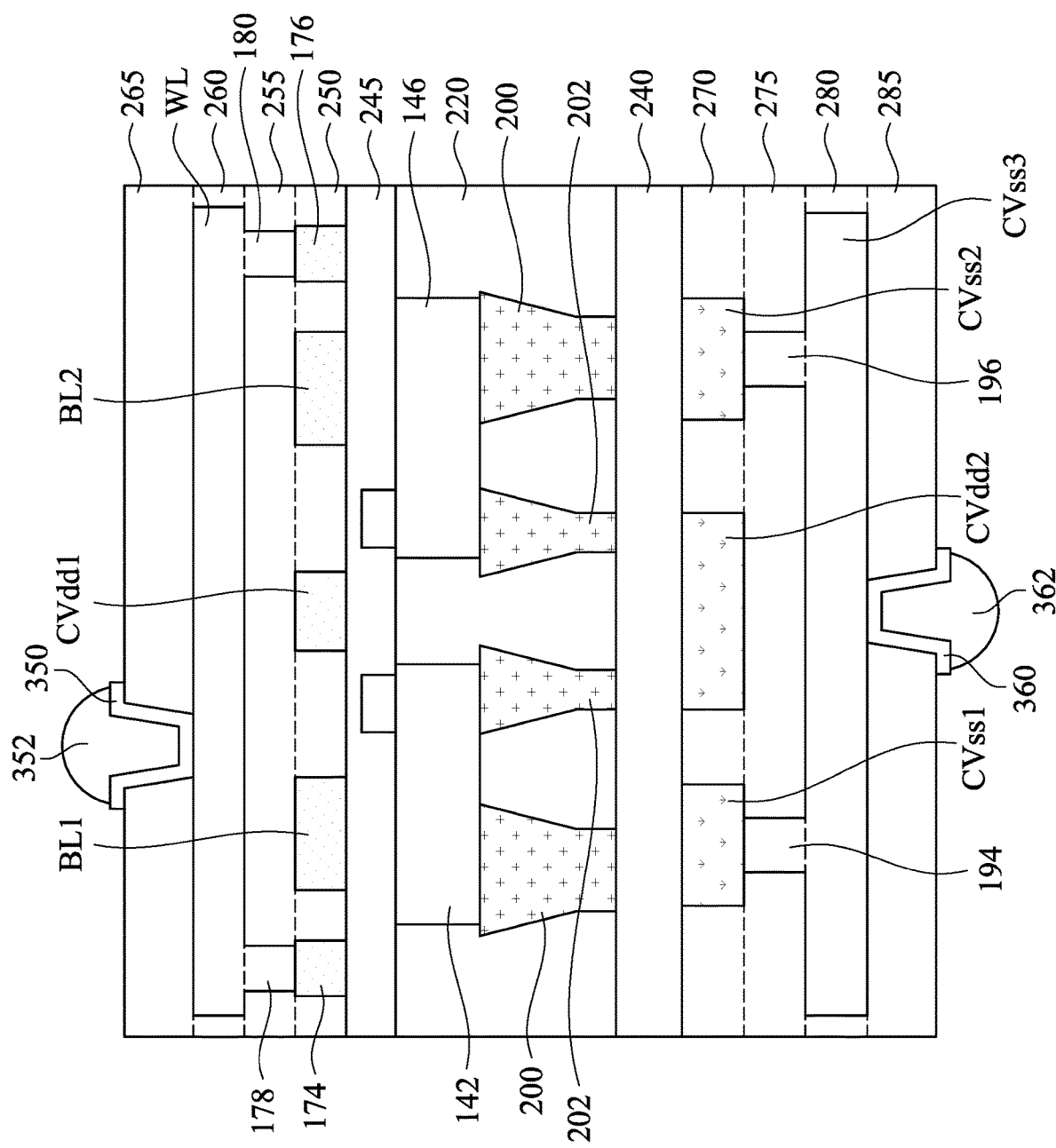
Figure 13F:
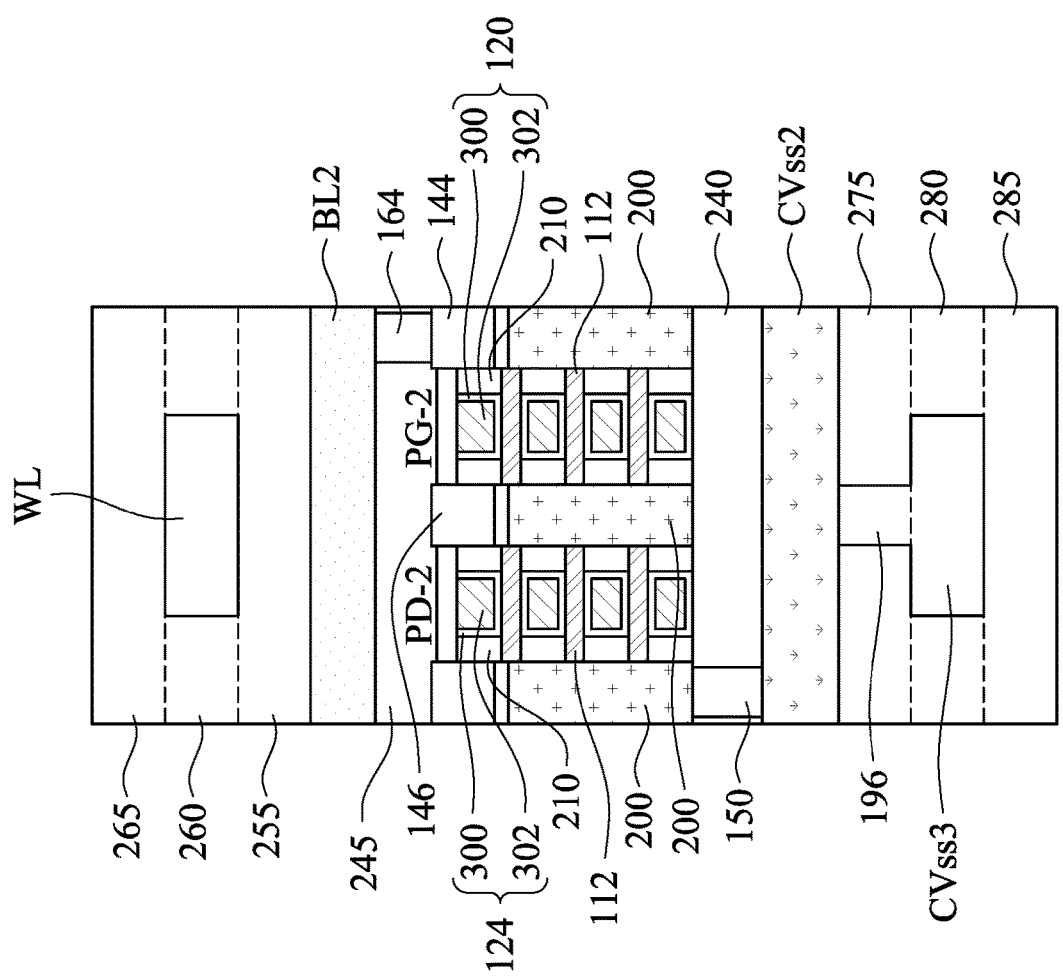
Figure 13G:
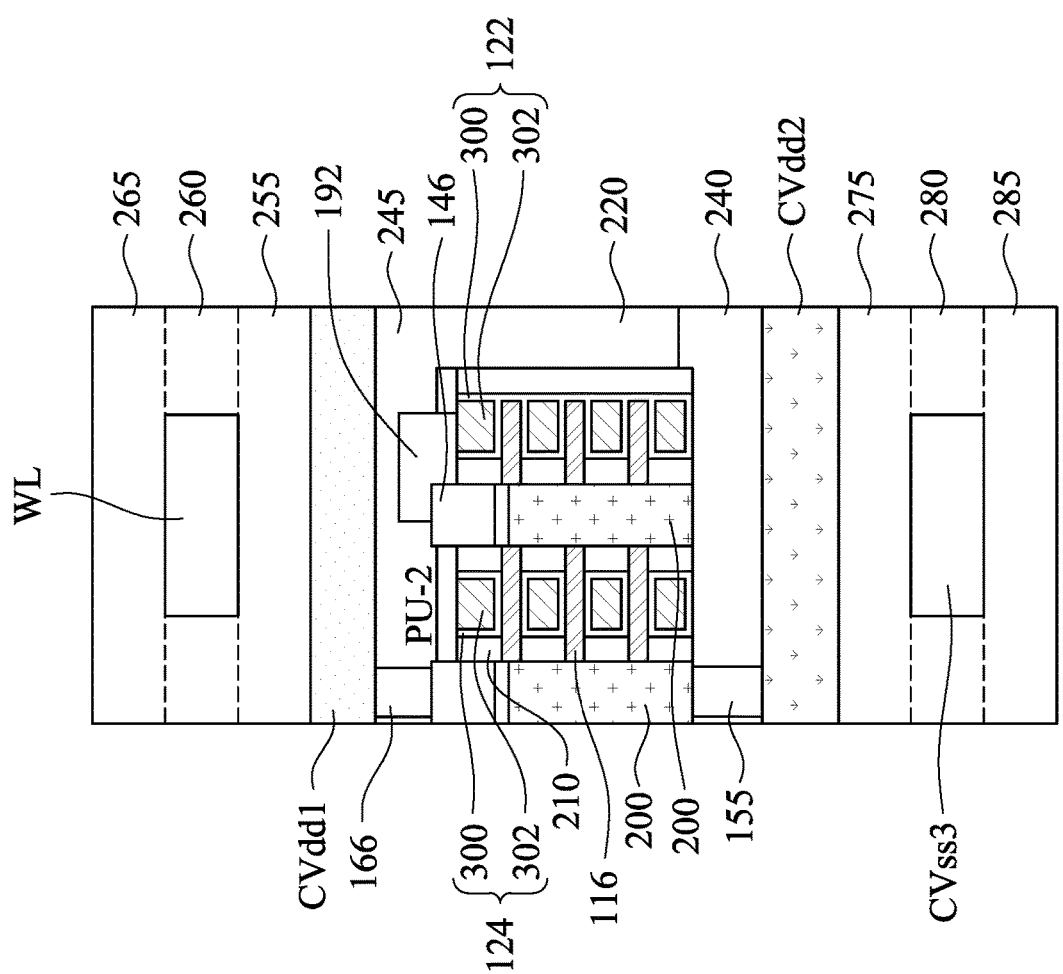
Figure 13H:
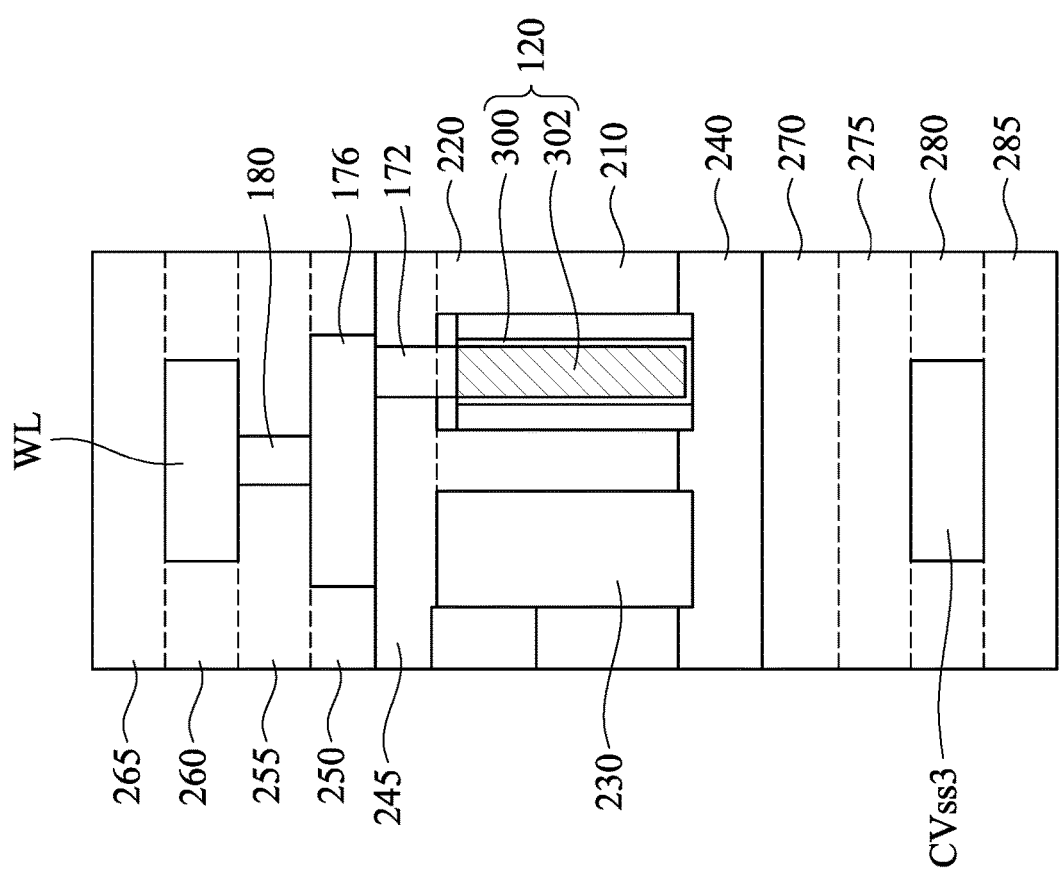

Reference is made to FIGS. 13A to 13H, in which FIG. 13A is a cell array layout diagram of an SRAM device on a front side of a semiconductor structure, FIG. 13B is a cell array layout diagram of an SRAM device on a backside of a semiconductor structure, FIGS. 13C, 13D, 13E, 13F, 13G, and 13H are cross-sectional views along lines C-C, D-D, E-E, F-F, G-G, and H-H of FIGS. 13A and 13B. A backside dielectric layer 240 is deposited over the structure shown in FIGS. 12A to 12F. Then, source/drain contacts 148, 150, 153, and 155 are formed in the backside dielectric layer 240. In some embodiments, the source/drain contacts 148, 150, 153, and 155 may be formed by, for example, patterning the backside dielectric layer 240 to form openings, depositing a contact material in the openings, and then performing a planarization process (e.g., a CMP process) to remove excess contact material until the backside dielectric layer 240 is exposed.

A backside inter-metal dielectric (IMD) layer 270 is deposited over the backside dielectric layer 240. Then, power lines CVss1, CVss2, and Cvdd2 are formed in the backside IMD layer 270. In some embodiments, the power lines CVss1, CVss2, and Cvdd2 may be formed by, for example, patterning the backside IMD layer 270 to form openings, depositing a conductive material in the openings, and then performing a planarization process (e.g., a CMP process) to remove excess conductive material until the backside IMD layer 270 is exposed.

A backside inter-metal dielectric (IMD) layer 275 is deposited over the backside IMD layer 270. Then, metal vias 194 and 196 are formed in the backside IMD layer 275. In some embodiments, the metal vias 194 and 196 may be formed by, for example, patterning the backside IMD layer 275 to form openings, depositing a conductive material in the openings, and then performing a planarization process (e.g., a CMP process) to remove excess conductive material until the backside IMD layer 275 is exposed.

A backside inter-metal dielectric (IMD) layer 280 is deposited over the backside IMD layer 275. Then, a power line CVss3 is formed in the backside IMD layer 280. In some embodiments, the power line CVss3 may be formed by, for example, patterning the backside IMD layer 280 to form an opening, depositing a conductive material in the opening, and then performing a planarization process (e.g., a CMP process) to remove excess conductive material until the backside IMD layer 280 is exposed. Afterwards, a backside inter-metal dielectric (IMD) layer 285 is deposited over the backside IMD layer 280. An UBM pad 362 and an external connector 362 are then formed in the IMD layer 285.

Figure 14A:
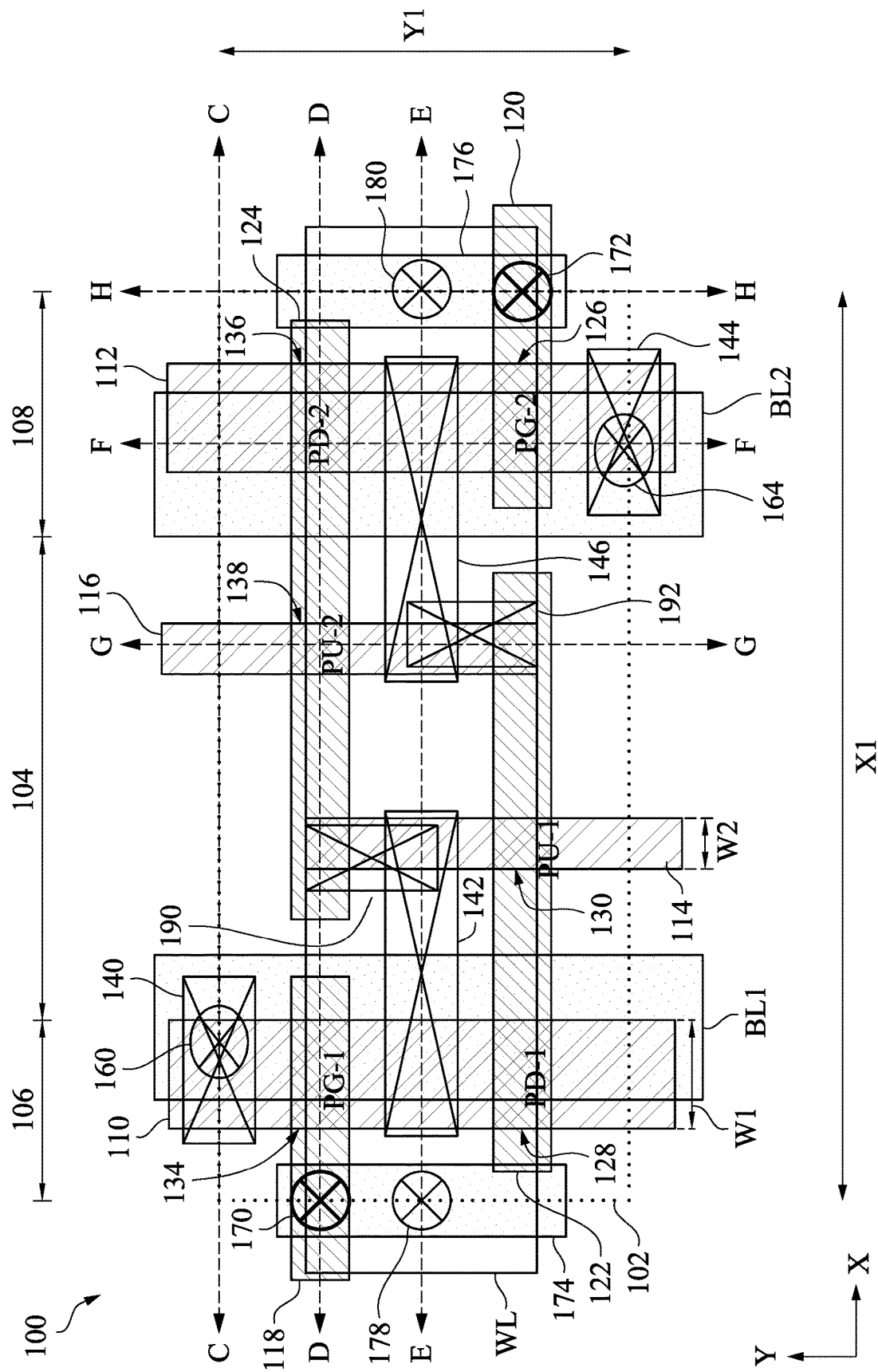
FIGS. 14A and 14B illustrate a cell array layout diagram of an SRAM device on a front side and a backside of a semiconductor structure, respectively, according to some embodiments of the present disclosure.
Figure 14B:
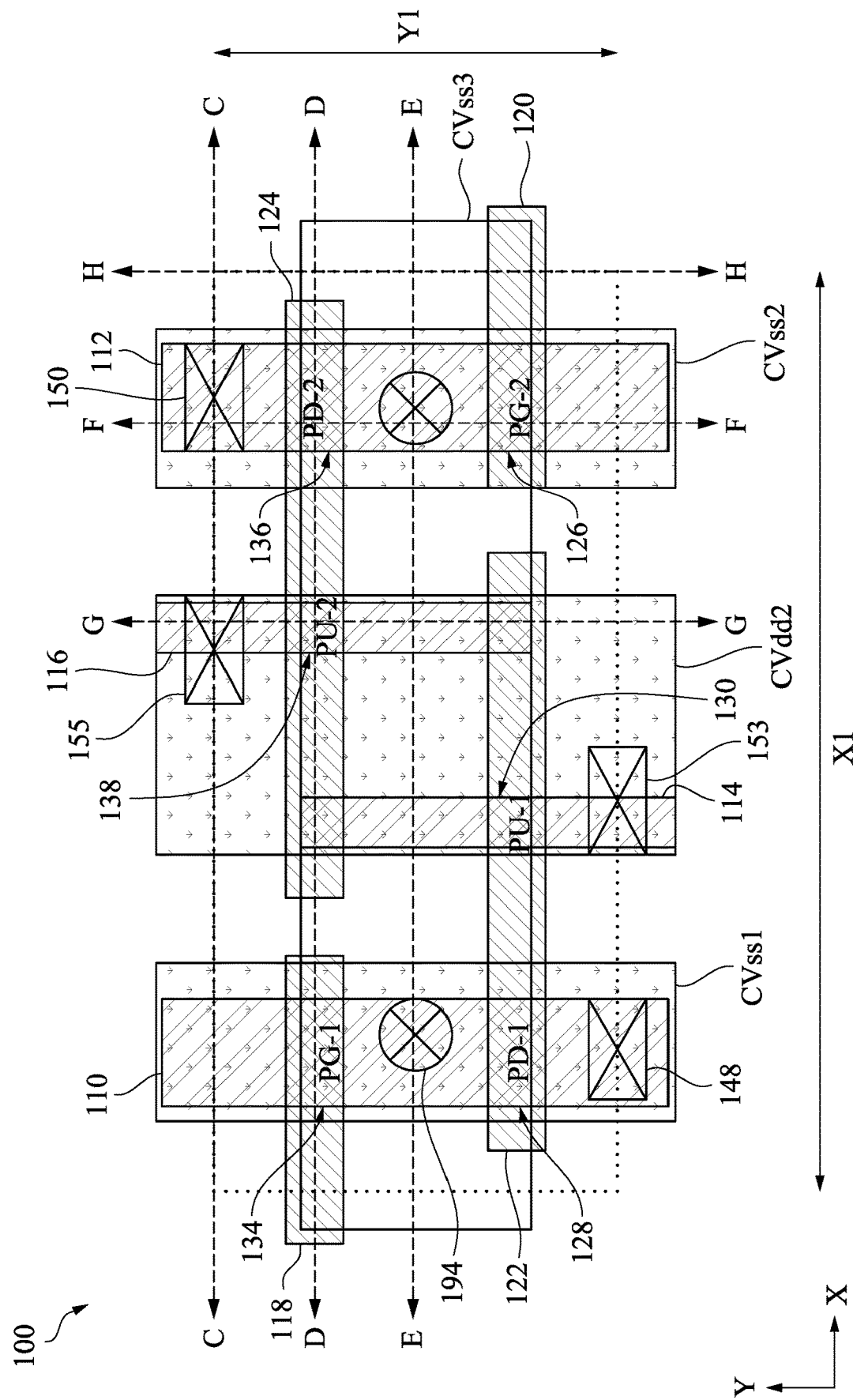

FIGS. 14A and 14B illustrate a cell array layout diagram of an SRAM device on a front side and a backside of a semiconductor structure, respectively, according to some embodiments of the present disclosure. It is noted that some elements described in FIGS. 14A and 14B are similar to or the same as those described in FIGS. 2A to 2H and FIGS. 3A to 13H, such elements are labeled the same, and relevant details will not be repeated for brevity. In FIGS. 14A and 14B, the power line CVdd1 described in FIGS. 2A to 2H is omitted. In some embodiments, the power line CVdd1 may not be formed during forming the bit line BL1 and the bit line BL2 as described in FIGS. 11A to 11G.

Figure 15A:
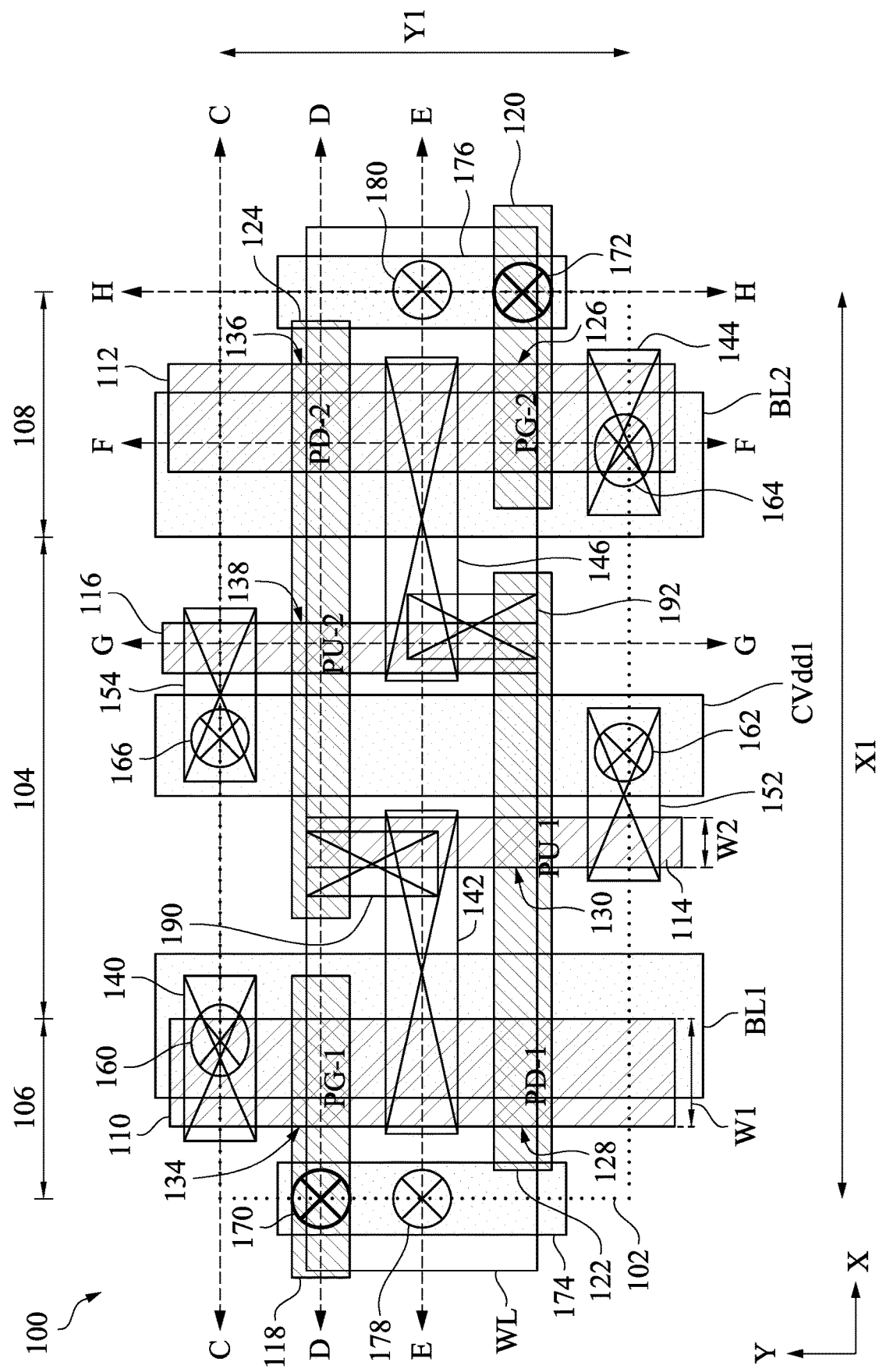
FIGS. 15A and 15B illustrate a cell array layout diagram of an SRAM device on a front side and a backside of a semiconductor structure, respectively, according to some embodiments of the present disclosure.
Figure 15B:
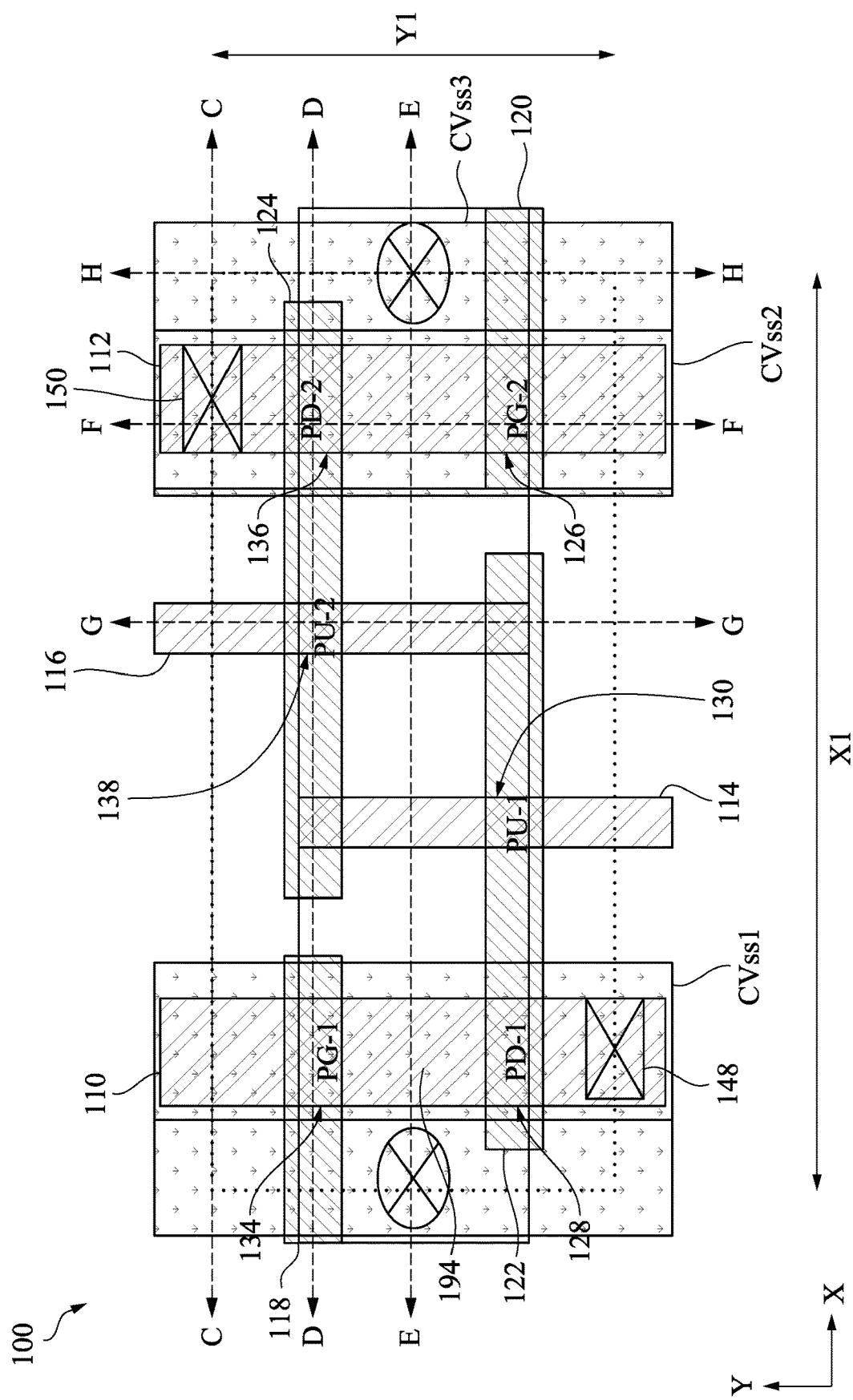

FIGS. 15A and 15B illustrate a cell array layout diagram of an SRAM device on a front side and a backside of a semiconductor structure, respectively, according to some embodiments of the present disclosure. It is noted that some elements described in FIGS. 15A and 15B are similar to or the same as those described in FIGS. 2A to 2H and FIGS. 3A to 13H, such elements are labeled the same, and relevant details will not be repeated for brevity. In FIGS. 14A and 14B, the power line CVdd2 described in FIGS. 2A to 2H is omitted. In some embodiments, the power line CVdd2 may not be formed during forming the power lines CVss1 and CVss2 as described in FIGS. 13A to 13G.

Figure 16A:
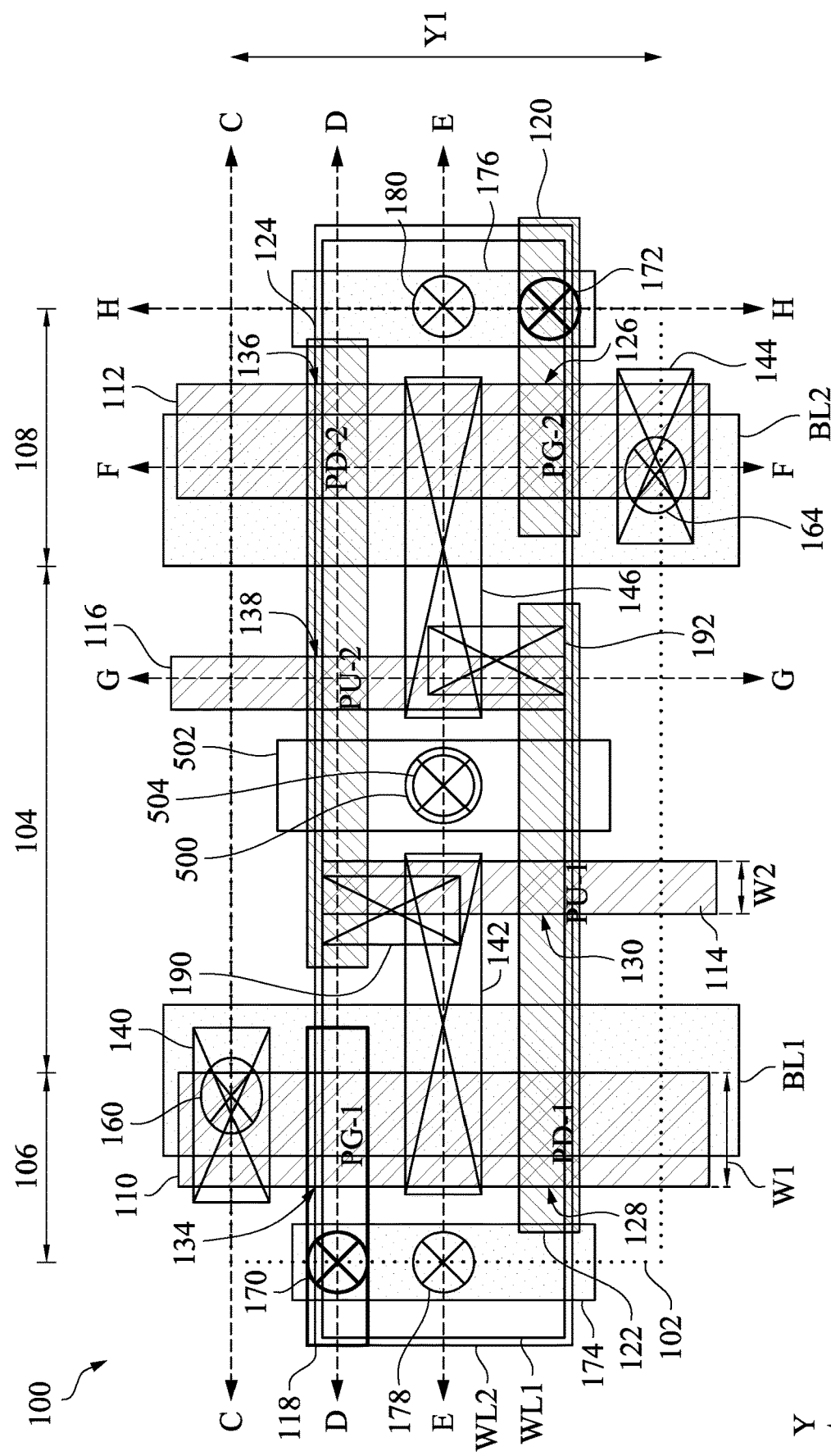
FIGS. 16A and 16B illustrate a cell array layout diagram of an SRAM device on a front side and a backside of a semiconductor structure, respectively, according to some embodiments of the present disclosure.
Figure 16B:
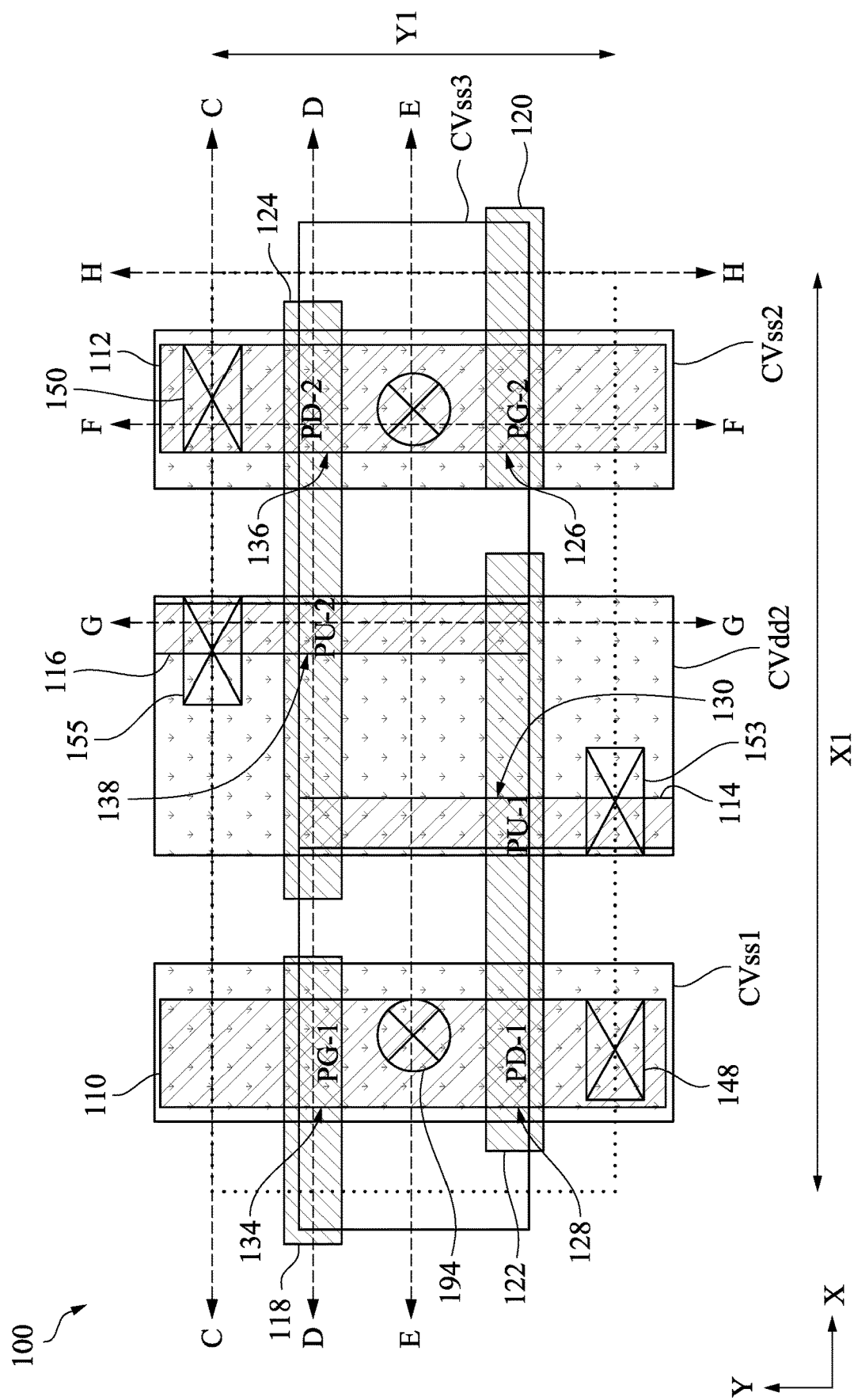

FIGS. 16A and 16B illustrate a cell array layout diagram of an SRAM device on a front side and a backside of a semiconductor structure, respectively, according to some embodiments of the present disclosure. It is noted that some elements described in FIGS. 16A and 16B are similar to or the same as those described in FIGS. 2A to 2H and FIGS. 3A to 13H, such elements are labeled the same, and relevant details will not be repeated for brevity. In FIG. 16A, the SRAM device 100 include a word line WL1, in which the configuration of the word line WL1 is the same as the word line WL as described in in FIGS. 2A to 2H and FIGS. 3A to 13H. The SRAM device 100 further includes a metal via 500 in contact with a top surface of the word line WL, a metal line 502 in contact with top surface of the metal via 500, a metal via 504 in contact with top surface of the metal line 502, and a word line WL2 in contact with top surface of the metal via 504. In some embodiments, the word line WL1, the metal via 500, the metal line 502, the metal via 504, and the word line WL2 may collectively function as the word line WL as described in FIG. 1. Stated another way, the word line WL1, the metal line 502, and the word line WL2 can be regarded as first, second, and third portions of a word line, in which the first, second, and third portions are at different levels and are connected through respective metal vias. In some embodiments, the word line WL1 and the word line WL2 each includes a lengthwise direction along the X-direction, while the metal line 502 has a lengthwise direction along the Y-direction. In some embodiments, the metal line 502 can be referred to as a metal-3 (M3) layer of the back-end-of-line (BEOL) structure, and the word line WL2 can be referred to as a metal-4 (M4) layer of the back-end-of-line (BEOL) structure.

Figure 17A:
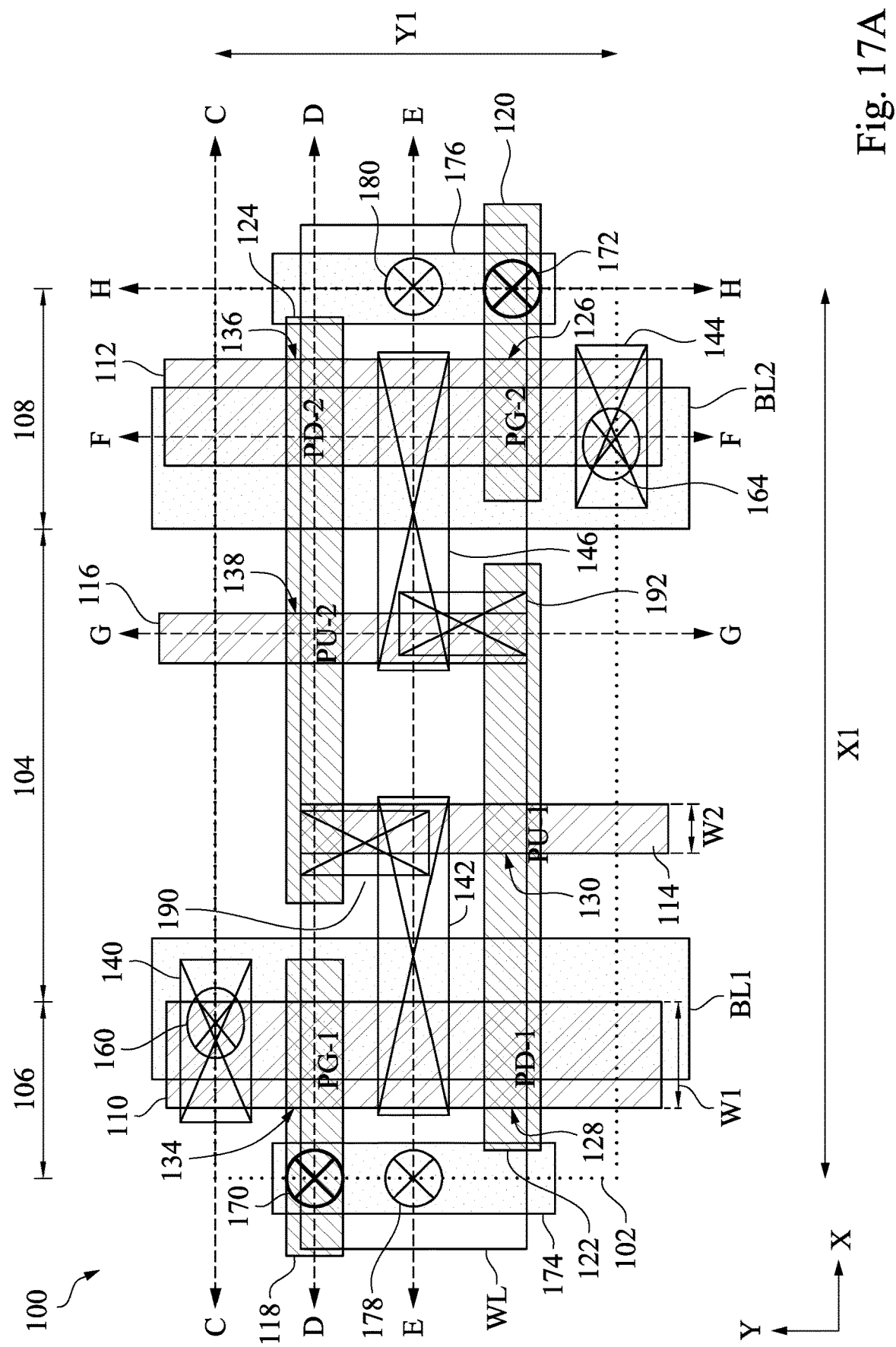
FIGS. 17A and 17B illustrate a cell array layout diagram of an SRAM device on a front side and a backside of a semiconductor structure, respectively, according to some embodiments of the present disclosure.
Figure 17B:
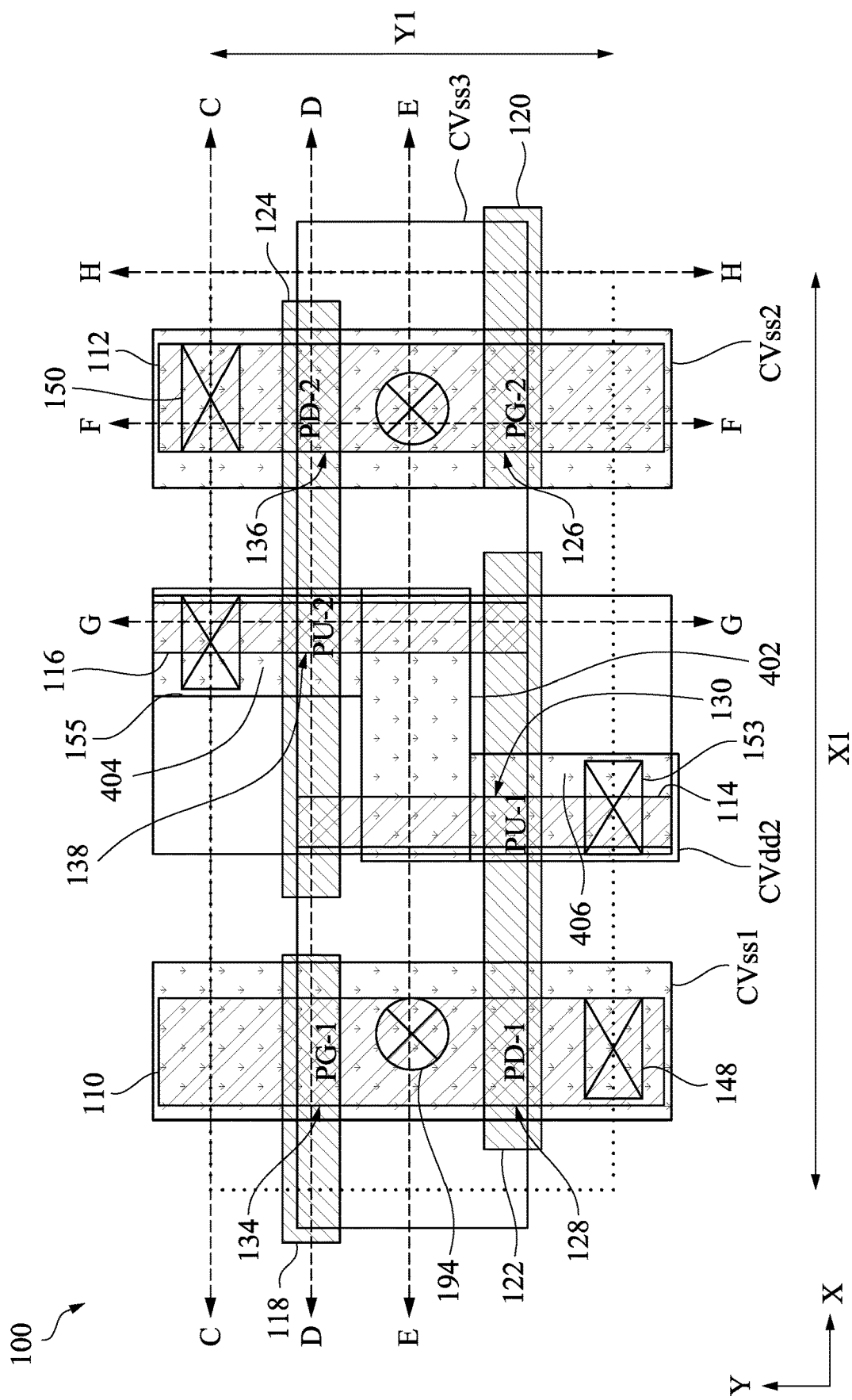

FIGS. 17A and 17B illustrate a cell array layout diagram of an SRAM device on a front side and a backside of a semiconductor structure, respectively, according to some embodiments of the present disclosure. It is noted that some elements described in FIGS. 17A and 17B are similar to or the same as those described in FIGS. 2A to 2H and FIGS. 3A to 13H, such elements are labeled the same, and relevant details will not be repeated for brevity. In FIGS. 17A and 17B, the power line CVdd1 described in FIGS. 2A to 2H is omitted. In some embodiments, the power line CVdd1 may not be formed during forming the bit line BL1 and the bit line BL2 as described in FIGS. 11A to 11G.

Moreover, in the top view of FIG. 17B, the power line CVdd2 has non-linear top profile. For example, the power line CVdd2 has a first portion 402 having a lengthwise direction along the X-direction, a second portion 404 having a lengthwise direction along the Y-direction, and a third portion 406 having a lengthwise direction along the Y-direction. The second portion 404 and the third portion 406 are connected to opposite sides of the first portion 402.

Based on the above discussion, it can be seen that the present disclosure offers advantages. It is understood, however, that other embodiments may offer additional advantages, and not all advantages are necessarily disclosed herein, and that no particular advantages is required for all embodiments. Embodiments of the present disclosure provide a metal line routing method to improve the functional density and operation performance on the IC structure. That is, a part of metal layers is transferred to the wafer back-side. For example, some of the power lines of an SRAM device may be moved to the backside of the device, so as to reduce the routing loading and improve the circuit density in a same chip area. In addition, the less metal tracks in the same chip area benefits the metal conductor RC performance.

In some embodiments of the present disclosure, a method for forming a memory device includes forming a first pull-up transistor, a first pull-down transistor, a first pass-gate transistor, a second pull-up transistor, a second pull-down transistor, a second pass-gate transistor over a substrate; forming a first bit line electrically connected to a source/drain epitaxy structure of the first pass-gate transistor; forming a second bit line electrically connected to a source/drain epitaxy structure of the second pass-gate transistor; forming a word line electrically connected to gate structures of the first pass-gate transistor and the second pass-gate transistor; removing the substrate to expose a bottom surface of a source/drain epitaxy structure of the first pull-down transistor and a bottom surface of a source/drain epitaxy structure of the second pull-down transistor; and forming a first power line electrically connected to the bottom surface of the source/drain epitaxy structure of the first pull-down transistor and electrically connected to the bottom surface of the source/drain epitaxy structure of the second pull-down transistor.

In some embodiments, the first bit line is electrically connected to a top surface of the source/drain epitaxy structure of the first pass-gate transistor, the second bit line is electrically connected to a top surface of the source/drain epitaxy structure of the second pass-gate transistor, and the word line is electrically connected to top surfaces of the gate structures of the first pass-gate transistor and the second pass-gate transistor.

In some embodiments, the method further includes forming a second power line electrically connected to a source/drain epitaxy structure of the first pull-up transistor and a source/drain epitaxy structure of the second pull-up transistor, wherein the second power line is vertically above the source/drain epitaxy structure of the first pull-up transistor and the source/drain epitaxy structure of the second pull-up transistor.

In some embodiments, the second power line is at a same level as the first bit line and the second bit line, and the word line is at a level above the first bit line, the second bit line, and the second power line.

In some embodiments, forming the first power line further includes forming a second power line electrically connected to a source/drain epitaxy structure of the first pull-up transistor and a source/drain epitaxy structure of the second pull-up transistor, in which the second power line is vertically below the source/drain epitaxy structure of the first pull-up transistor and the source/drain epitaxy structure of the second pull-up transistor.

In some embodiments, the method further includes forming a second power line electrically connected to a source/drain epitaxy structure of the first pull-up transistor and a source/drain epitaxy structure of the second pull-up transistor, in which the second power line has a first portion vertically above the source/drain epitaxy structure of the first pull-up transistor and the source/drain epitaxy structure of the second pull-up transistor and a second portion vertically below the source/drain epitaxy structure of the first pull-up transistor and the source/drain epitaxy structure of the second pull-up transistor.

In some embodiments, the method further includes forming a backside dielectric layer in contact with the bottom surface of the source/drain epitaxy structure of the first pull-down transistor and the bottom surface of the source/drain epitaxy structure of the second pull-down transistor after removing the substrate; and forming first and second backside vias in the backside dielectric layer and in contact with the bottom surface of the source/drain epitaxy structure of the first pull-down transistor and the bottom surface of the source/drain epitaxy structure of the second pull-down transistor, respectively, in which the first power line is electrically connected to the first and second backside vias.

In some embodiments, each of the first pull-up, first pull-down, first pass-gate, second pull-up, second pull-down, and second pass-gate transistors has a gate-all-around configuration.

In some embodiments of the present disclosure, a method for forming a memory device includes forming a first inverter and a second inverter over a substrate, such that the first inverter and the second inverter are cross-coupled with each other; forming a first transistor electrically connected to an output of the first inverter and a second transistor electrically connected to an output of the second inverter; forming a first bit line and a second bit line electrically connected to the first and second transistors, respectively; forming a word line electrically connected to the first and second transistors, in which the first bit line, the second bit line, and the word line are formed on front sides of the first and second transistors; and forming a first power line electrically connected to the first inverter and the second inverter, in which the first power line is formed on backsides of the first inverter and the second inverter.

In some embodiments, the first bit line vertically overlaps a first portion of the first power line, and the second bit line vertically overlaps a second portion of the first power line.

In some embodiments, the method further includes forming a second power line electrically connected to the first inverter and the second inverter, in which the second power line is formed on front sides of the first inverter and the second inverter.

In some embodiments, the second power line is at a same level as the first and second bit lines, and the second power line is laterally between the first and second bit lines.

In some embodiments, the method further includes removing the substrate after forming the first bit line, the second bit line, and the word line; forming a backside dielectric layer at backsides of the first and second inverters; and forming backside vias in the backside dielectric layer and electrically connected to the first and second inverters, in which the first power line is electrically connected to the first and second inverters through the backside vias.

In some embodiments, the method further includes forming a second power line electrically connected to the first and second inverters, in which the second power line has a first portion at front sides of the first and second inverters and a second portion at backsides of the first and second inverters, in which the first portion of the second power line vertically overlaps the second portion of the second power line.

In some embodiments, in a top view, the second portion of the second power line is wider than the first portion of the second power line along a direction that is parallel to a lengthwise direction of a gate structure of the first transistor.

In some embodiments of the present disclosure, a memory device includes a first pull-up transistor, a first pull-down transistor, a first pass-gate transistor, a second pull-up transistor, a second pull-down transistor, a second pass-gate transistor, in which each of the first pull-up, first pull-down, first pass-gate, second pull-up, second pull-down, and second pass-gate transistors has a gate-all-around configuration. A first bit line is vertically above and electrically connected to the first pass-gate transistor. A second bit line is vertically above and electrically connected to the second pass-gate transistor. A word line is vertically above and electrically connected to the first pass-gate and second pass-gate transistors. A first power line is vertically below and electrically connected to the first pull-down and second pull-down transistors. A second power line is electrically connected to the first pull-up and second pull-up transistors.

In some embodiments, the first power line has a first portion and a second portion at a first level, and a third portion at a second level lower than the first level, the third portion being electrically connected to the first and second portion, in which the first portion of the first power line vertically overlaps the first pass-gate and first pull-down transistors, the second portion of the first power line vertically overlaps the second pass-gate and second pull-down transistors, and the third portion of the first power line vertically overlaps the first pull-up, first pull-down, first pass-gate, second pull-up, second pull-down, and second pass-gate transistors.

In some embodiments, the first power line has a first portion and a second portion at a first level, and a third portion at a second level lower than the first level, the third portion being electrically connected to the first and second portion, in which the first portion of the first power line vertically overlaps the first pass-gate and first pull-down transistors, the second portion of the first power line vertically overlaps the second pass-gate and second pull-down transistors, and the third portion of the first power line vertically overlaps the first pull-up, first pull-down, first pass-gate, second pull-up, second pull-down, and second pass-gate transistors.

In some embodiments, the second power line is at the first level and laterally between the first and second portions of the first power line.

In some embodiments, the second power line is vertically above the first pull-up and second pull-up transistors and at a same level as the first and second bit lines.

In some embodiments, in a top view, the second power line has a non-linear profile.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a memory device, comprising:
forming a first pull-up transistor, a first pull-down transistor, a first pass-gate transistor, a second pull-up transistor, a second pull-down transistor, a second pass-gate transistor over a substrate;
forming a first bit line electrically connected to a source/drain epitaxy structure of the first pass-gate transistor;
forming a second bit line electrically connected to a source/drain epitaxy structure of the second pass-gate transistor;
forming a word line electrically connected to gate structures of the first pass-gate transistor and the second pass-gate transistor;
removing the substrate to expose a bottom surface of a source/drain epitaxy structure of the first pull-down transistor and a bottom surface of a source/drain epitaxy structure of the second pull-down transistor; and
forming a first power line electrically connected to the bottom surface of the source/drain epitaxy structure of the first pull-down transistor and electrically connected to the bottom surface of the source/drain epitaxy structure of the second pull-down transistor.

2. The method of claim 1, wherein,
the first bit line is electrically connected to a top surface of the source/drain epitaxy structure of the first pass-gate transistor,
the second bit line is electrically connected to a top surface of the source/drain epitaxy structure of the second pass-gate transistor, and
the word line is electrically connected to top surfaces of the gate structures of the first pass-gate transistor and the second pass-gate transistor.

3. The method of claim 1, further comprising forming a second power line electrically connected to a source/drain epitaxy structure of the first pull-up transistor and a source/drain epitaxy structure of the second pull-up transistor, wherein the second power line is vertically above the source/drain epitaxy structure of the first pull-up transistor and the source/drain epitaxy structure of the second pull-up transistor.

4. The method of claim 3, wherein the second power line is at a same level as the first bit line and the second bit line, and the word line is at a level above the first bit line, the second bit line, and the second power line.

5. The method of claim 1, wherein forming the first power line further comprising forming a second power line electrically connected to a source/drain epitaxy structure of the first pull-up transistor and a source/drain epitaxy structure of the second pull-up transistor, wherein the second power line is vertically below the source/drain epitaxy structure of the first pull-up transistor and the source/drain epitaxy structure of the second pull-up transistor.

6. The method of claim 1, further comprising forming a second power line electrically connected to a source/drain epitaxy structure of the first pull-up transistor and a source/drain epitaxy structure of the second pull-up transistor, wherein the second power line has a first portion vertically above the source/drain epitaxy structure of the first pull-up transistor and the source/drain epitaxy structure of the second pull-up transistor and a second portion vertically below the source/drain epitaxy structure of the first pull-up transistor and the source/drain epitaxy structure of the second pull-up transistor.

7. The method of claim 1, further comprising:
forming a backside dielectric layer in contact with the bottom surface of the source/drain epitaxy structure of the first pull-down transistor and the bottom surface of the source/drain epitaxy structure of the second pull-down transistor after removing the substrate; and
forming first and second backside vias in the backside dielectric layer and in contact with the bottom surface of the source/drain epitaxy structure of the first pull-down transistor and the bottom surface of the source/drain epitaxy structure of the second pull-down transistor, respectively, wherein the first power line is electrically connected to the first and second backside vias.

8. The method of claim 1, wherein each of the first pull-up, first pull-down, first pass-gate, second pull-up, second pull-down, and second pass-gate transistors has a gate-all-around configuration.

9. A method for forming a memory device, comprising:
forming a first inverter and a second inverter over a substrate, such that the first inverter and the second inverter are cross-coupled with each other;
forming a first transistor electrically connected to an output of the first inverter and a second transistor electrically connected to an output of the second inverter;
forming a first bit line and a second bit line electrically connected to the first and second transistors, respectively;
forming a word line electrically connected to the first and second transistors, wherein the first bit line, the second bit line, and the word line are formed on front sides of the first and second transistors; and
forming a first power line electrically connected to the first inverter and the second inverter, wherein the first power line is formed on backsides of the first inverter and the second inverter.

10. The method of claim 9, wherein the first bit line vertically overlaps a first portion of the first power line, and the second bit line vertically overlaps a second portion of the first power line.

11. The method of claim 9, further comprising forming a second power line electrically connected to the first inverter and the second inverter, wherein the second power line is formed on front sides of the first inverter and the second inverter.

12. The method of claim 11, wherein the second power line is at a same level as the first and second bit lines, and the second power line is laterally between the first and second bit lines.

13. The method of claim 9, further comprising:
removing the substrate after forming the first bit line, the second bit line, and the word line;
forming a backside dielectric layer at backsides of the first and second inverters; and
forming backside vias in the backside dielectric layer and electrically connected to the first and second inverters, wherein the first power line is electrically connected to the first and second inverters through the backside vias.

14. The method of claim 9, further comprising forming a second power line electrically connected to the first and second inverters, wherein the second power line has a first portion at front sides of the first and second inverters and a second portion at backsides of the first and second inverters, wherein the first portion of the second power line vertically overlaps the second portion of the second power line.

15. The method of claim 14, wherein, in a top view, the second portion of the second power line is wider than the first portion of the second power line along a direction that is parallel to a lengthwise direction of a gate structure of the first transistor.

16. A memory device, comprising:
- a first pull-up transistor, a first pull-down transistor, a first pass-gate transistor, a second pull-up transistor, a second pull-down transistor, a second pass-gate transistor, wherein each of the first pull-up, first pull-down, first pass-gate, second pull-up, second pull-down, and second pass-gate transistors has a gate-all-around configuration;
- a first bit line vertically above and electrically connected to the first pass-gate transistor;
- a second bit line vertically above and electrically connected to the second pass-gate transistor;
- a word line vertically above and electrically connected to the first pass-gate and second pass-gate transistors;
- a first power line vertically below and electrically connected to the first pull-down and second pull-down transistors; and
- a second power line electrically connected to the first pull-up and second pull-up transistors.

17. The memory device of claim 16, wherein the first power line has a first portion and a second portion at a first level, and a third portion at a second level lower than the first level, the third portion being electrically connected to the first and second portion, wherein the first portion of the first power line vertically overlaps the first pass-gate and first pull-down transistors, the second portion of the first power line vertically overlaps the second pass-gate and second pull-down transistors, and the third portion of the first power line vertically overlaps the first pull-up, first pull-down, first pass-gate, second pull-up, second pull-down, and second pass-gate transistors.

18. The memory device of claim 17, wherein the second power line is at the first level and laterally between the first and second portions of the first power line.

19. The memory device of claim 16, wherein the second power line is vertically above the first pull-up and second pull-up transistors and at a same level as the first and second bit lines.

20. The memory device of claim 16, wherein, in a top view, the second power line has a non-linear profile.

* * * * *